(12) United States Patent
Kim et al.

(10) Patent No.: US 10,199,446 B2
(45) Date of Patent: Feb. 5, 2019

(54) TRANSPARENT DISPLAY DEVICE AND METHOD FOR MANUFACTURING THE SAME

(71) Applicant: LG Display Co., Ltd., Seoul (KR)

(72) Inventors: EuiTae Kim, Paju-si (KR); DooHyun Yoon, Paju-si (KR); Hyoung-Su Kim, Paju-si (KR); KiSeob Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/659,375

(22) Filed: Jul. 25, 2017

(65) Prior Publication Data

US 2018/0033847 A1 Feb. 1, 2018

(30) Foreign Application Priority Data

Jul. 29, 2016 (KR) ........................ 10-2016-0097490

(51) Int. Cl.
*H01L 27/32* (2006.01)
*H01L 29/786* (2006.01)
*H01L 51/52* (2006.01)

(52) U.S. Cl.
CPC ........ *H01L 27/3265* (2013.01); *H01L 27/326* (2013.01); *H01L 27/3246* (2013.01); *H01L 27/3248* (2013.01); *H01L 27/3262* (2013.01); *H01L 29/78648* (2013.01); *H01L 51/5284* (2013.01); *H01L 2227/323* (2013.01)

(58) Field of Classification Search
CPC ........................ H01L 27/1214–27/1296; H01L 27/3244–27/3279; H01L 29/78648
See application file for complete search history.

(56) References Cited

U.S. PATENT DOCUMENTS

| | | | |
|---|---|---|---|
| 2007/0152217 A1* | 7/2007 | Lai ...................... | H01L 27/1225 257/59 |
| 2009/0102759 A1* | 4/2009 | Kawabe ............... | G09G 3/3258 345/76 |
| 2009/0243482 A1* | 10/2009 | Tohyama ............ | H01L 27/3272 313/505 |
| 2015/0144910 A1* | 5/2015 | Beak ..................... | H01L 27/124 257/40 |
| 2016/0005802 A1* | 1/2016 | Park .................... | H01L 27/3265 257/40 |
| 2016/0315133 A1* | 10/2016 | Sato .................... | H01L 27/3265 |

* cited by examiner

*Primary Examiner* — Daniel P Shook
(74) *Attorney, Agent, or Firm* — Polsinelli PC

(57) ABSTRACT

Disclosed are a display device and a method of manufacturing the same. The display device includes a light emitting device including an anode electrode, a light emitting layer, and a cathode electrode, a driving transistor configured to supply a driving current to the light emitting device, and a capacitor including one electrode and other electrode each formed of a transparent conductive material. The one electrode and the other electrode of the capacitor overlap each other with at least one insulation layer therebetween.

19 Claims, 37 Drawing Sheets

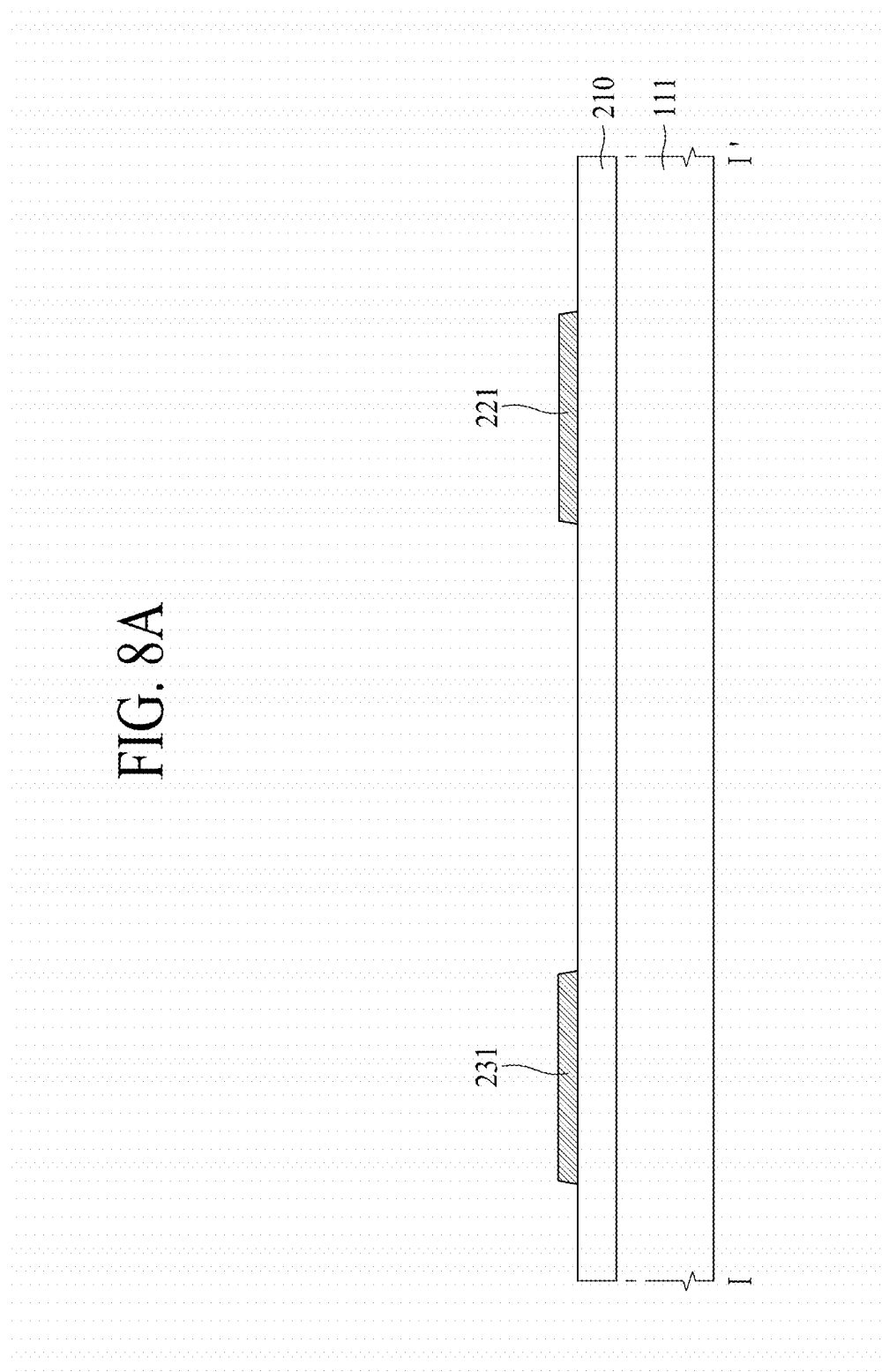

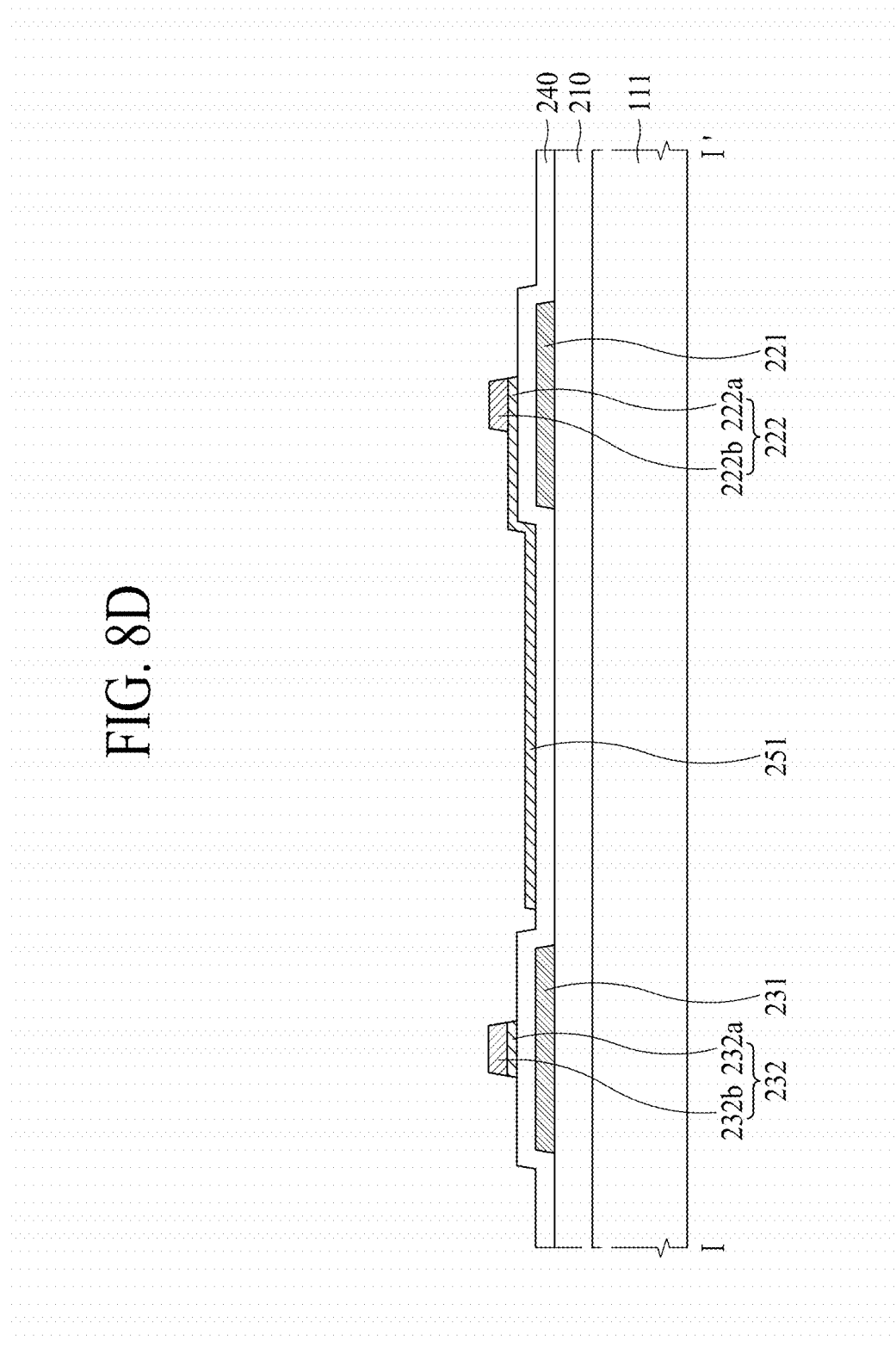

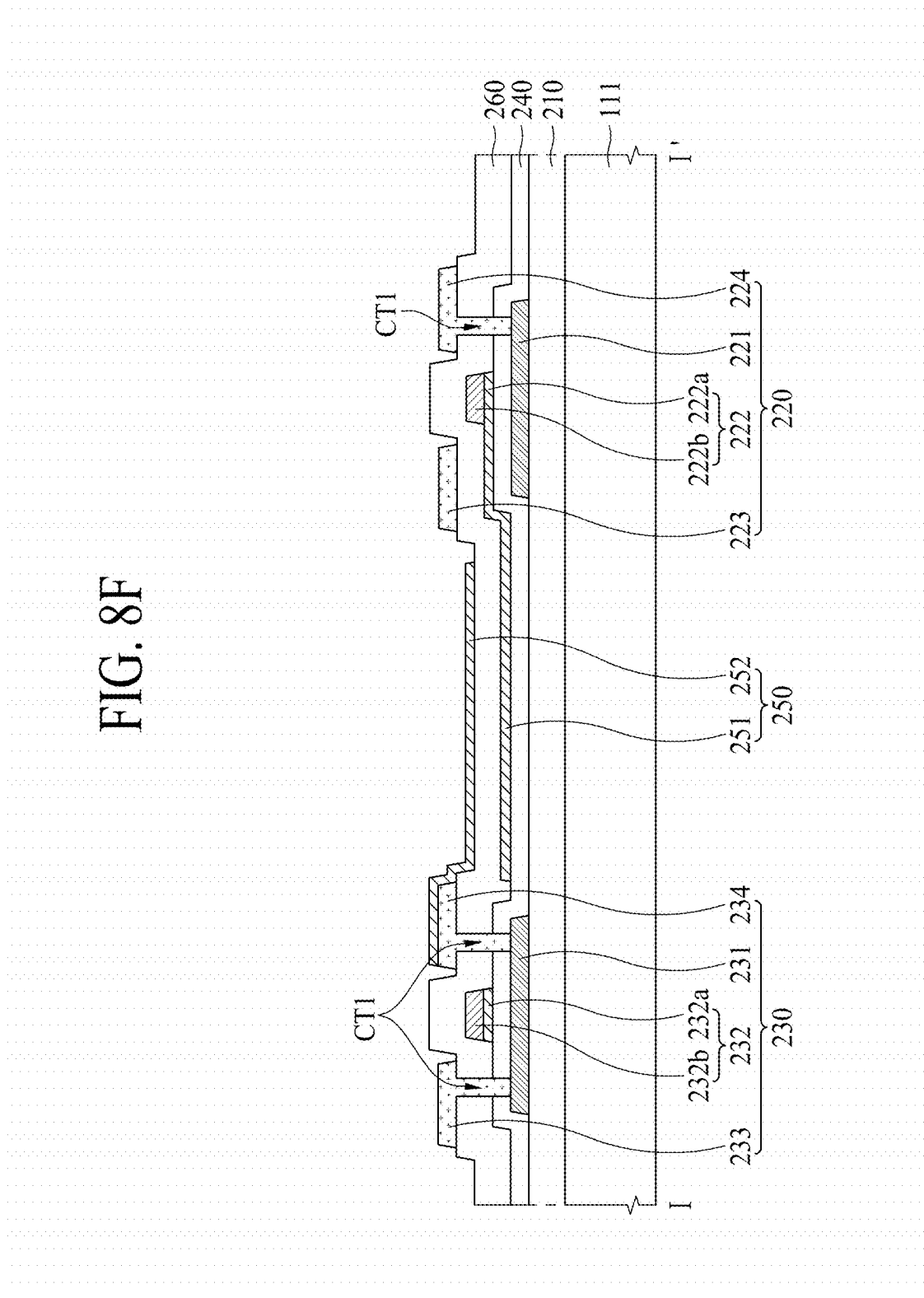

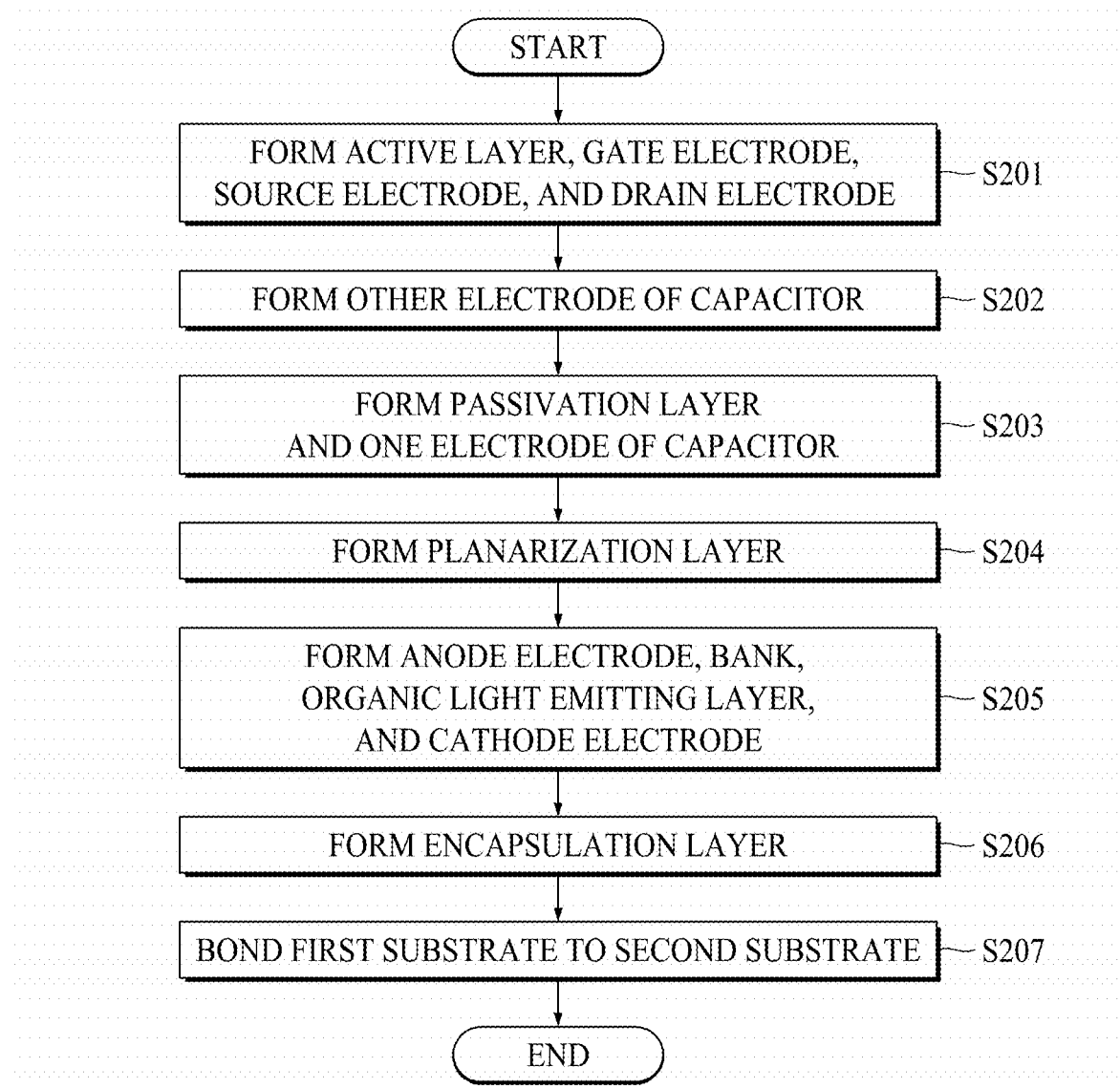

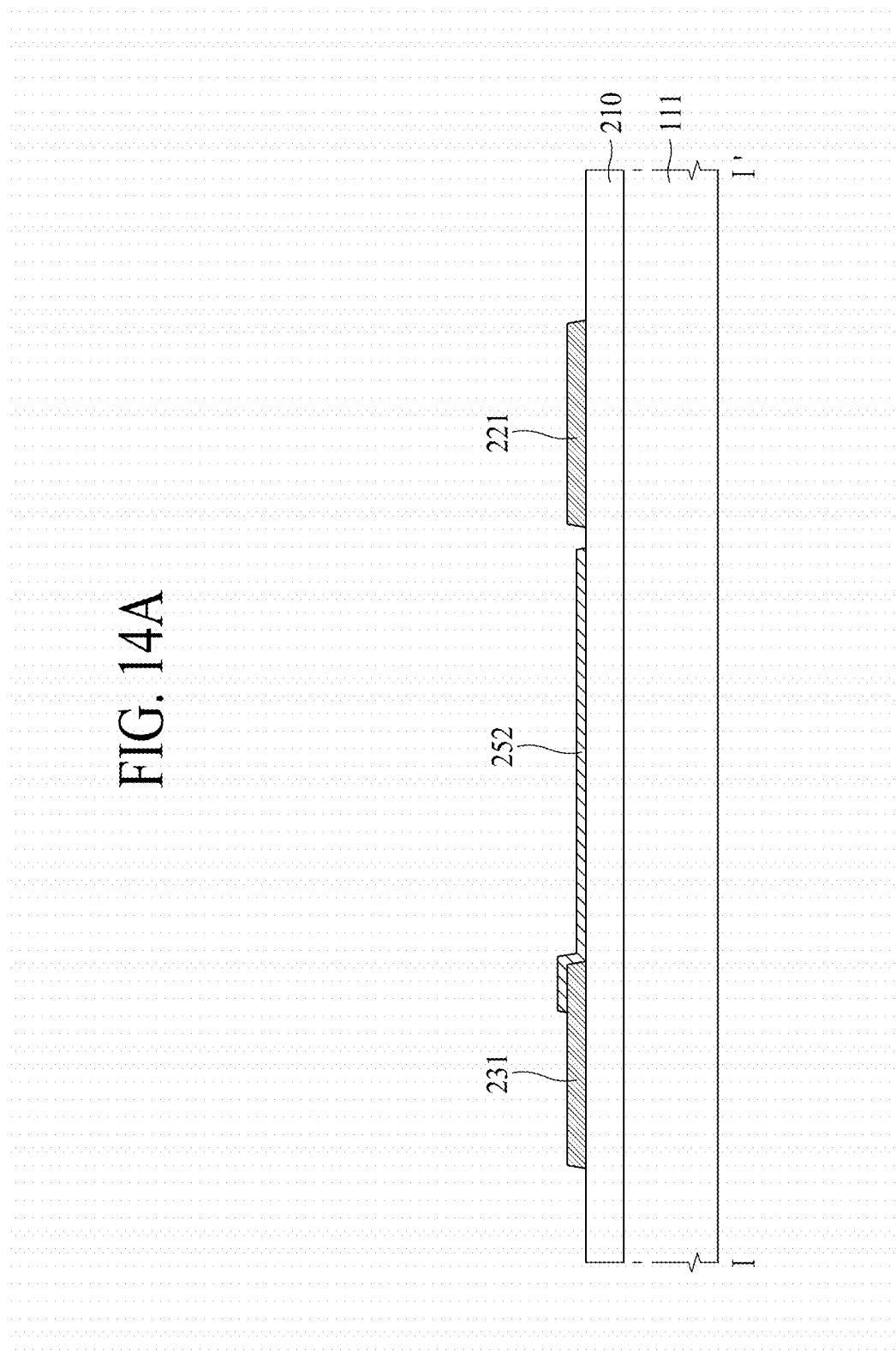

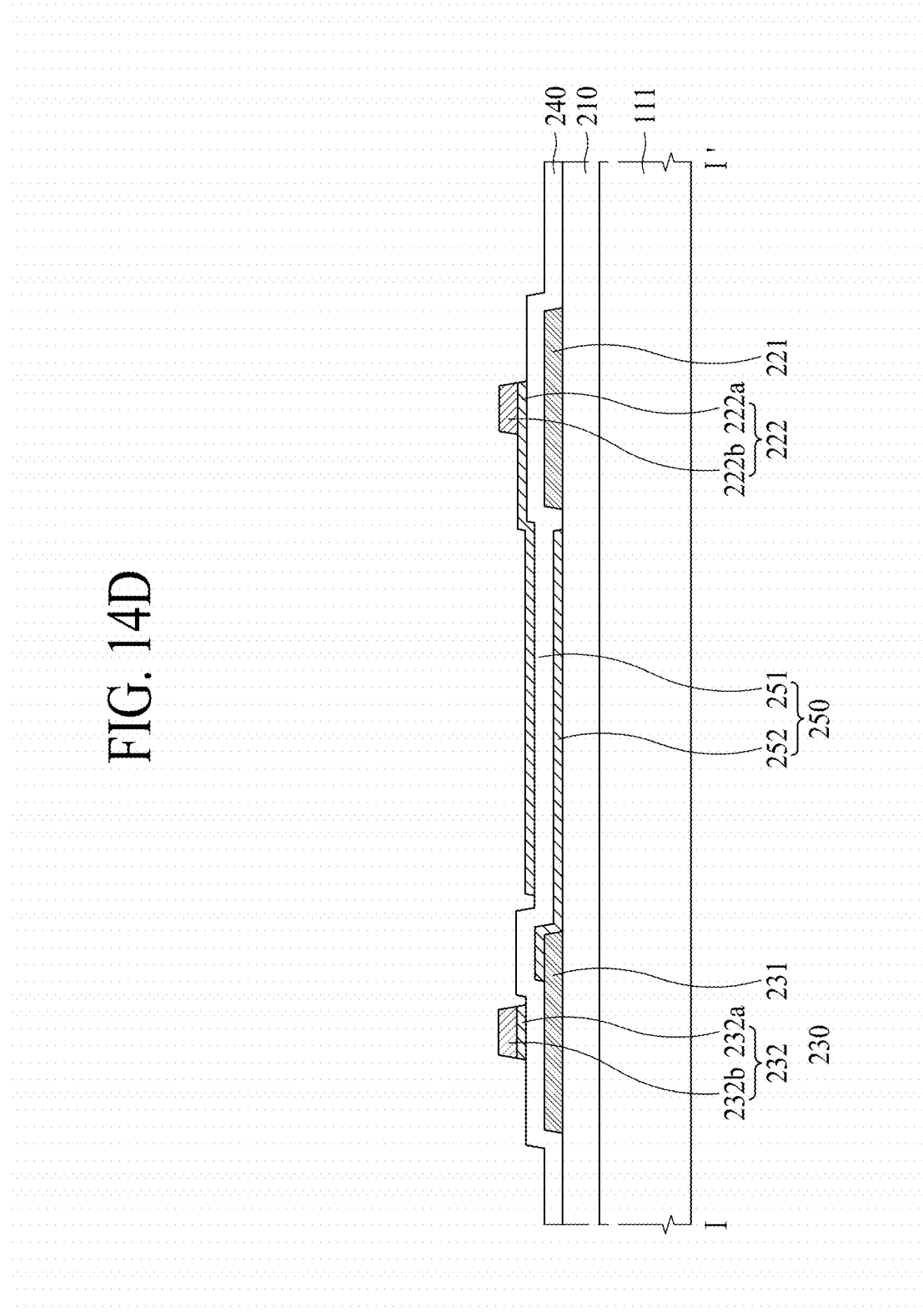

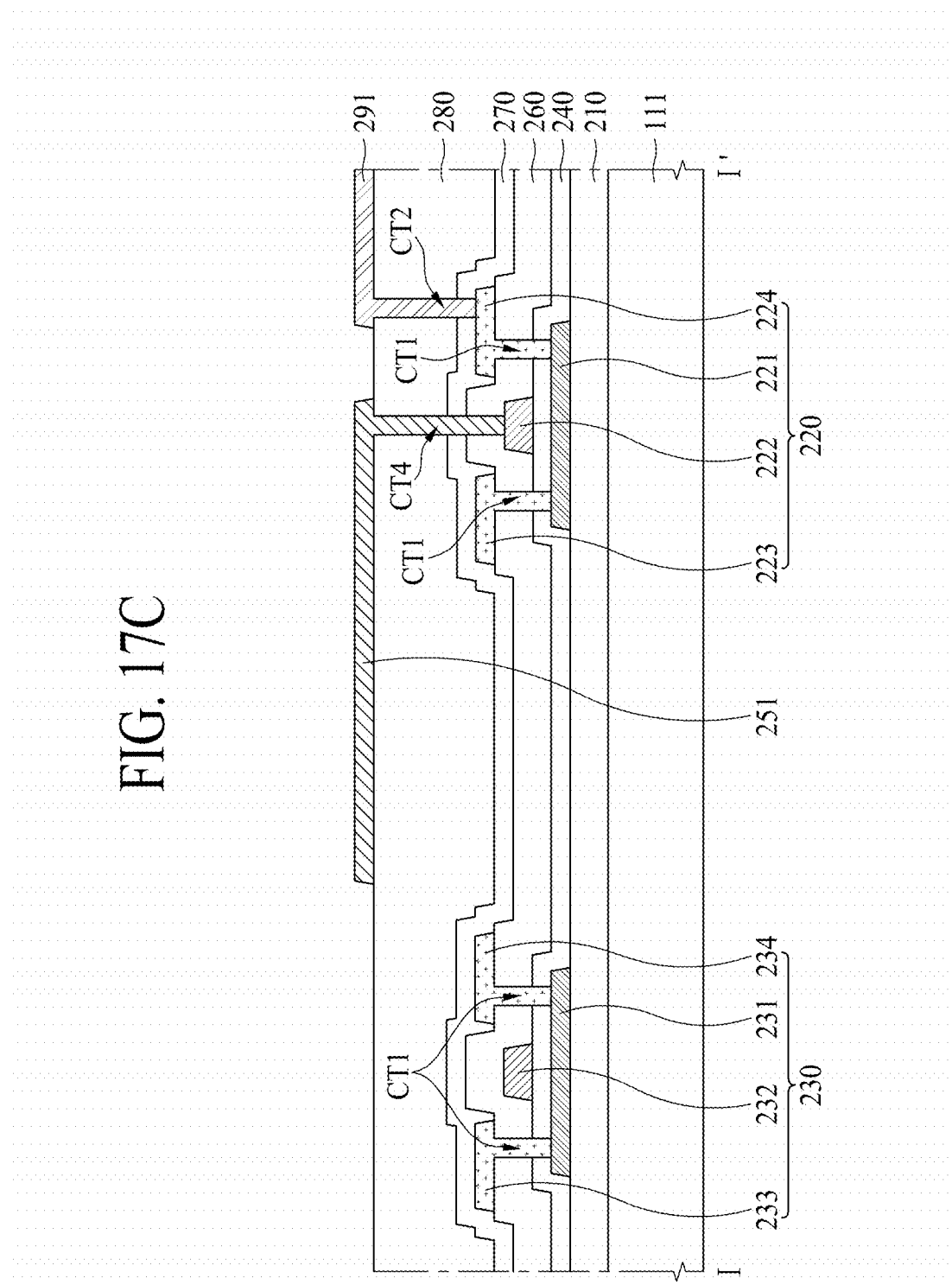

TRANSPARENT DISPLAY DEVICE AND METHOD FOR MANUFACTURING THE SAME

CROSS-REFERENCE TO RELATED APPLICATION

This application claims the benefit of the Korean Patent Application No. 10-2016-0097490 filed on Jul. 29, 2016, which is hereby incorporated by reference in its entirety as if fully set forth herein.

BACKGROUND

Field of the Disclosure

The present disclosure relates to a display device, and more particularly, to a transparent display device and a method of manufacturing the same.

Description of the Background

Recently, as society advances to the information-oriented society, the display field of processing and displaying a massive amount of information has rapidly advanced, and correspondingly, various display devices have been developed and are attracting much attention. Examples of the display devices include liquid crystal display (LCD) devices, plasma display panel (PDP) devices, field emission display (FED) devices, organic light emitting display devices, etc.

Moreover, transparent display devices which enable a user to look at a background or an object located behind the transparent display devices are being actively researched recently. The transparent display devices have advantages in space availability, interior, and design and can be applied to various fields. The transparent display devices realize an information recognition function, an information processing function, and an information display function by using a transparent electronic device, thereby solving the spatial limitation and visual limitation of electronic devices. For example, a transparent display device may be applied to windows of buildings or vehicles and thus may be implemented as a smart window which allows a background to be seen or displays an image.

In a case where a transparent display device is implemented with an organic light emitting device, the transparent display device includes an emissive part which includes the organic light emitting device and emits light and a driving part which supplies a certain voltage to the organic light emitting device. The emissive part includes only a material for transmitting incident light, and thus, when the emissive part does not emit light, a user can look at a background, located behind the transparent display device, through the emissive part. The driving part includes at least one thin film transistor (TFT) and at least one capacitor. The driving part includes an opaque conductive material, and thus, in order to increase a transmittance of the transparent display device, an area of the emissive part should be enlarged and an area of the driving part should be reduced.

Recently, since small organic light emitting display devices applied to mobile devices and the like have a high resolution, a size of each pixel has been progressively reduced. There is a limitation in reducing a size of a capacitor of each pixel, and thus, as the size of each pixel becomes smaller, a ratio of an area of a capacitor area to an area of a pixel becomes higher. That is, an area ratio of a driving part in each pixel becomes higher, and for this reason, a transmittance of a transparent display device is lowered.

SUMMARY

Accordingly, the present disclosure is directed to provide a display device and a method of manufacturing the same that substantially obviate one or more problems due to limitations and disadvantages of the related art.

An aspect of the present disclosure is directed to provide a display device and a method of manufacturing the same, in which a transmittance is enhanced.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a light emitting device including an anode electrode, a light emitting layer, and a cathode electrode, a driving transistor configured to supply a driving current to the light emitting device, and a capacitor including one electrode and other electrode each formed of a transparent conductive material. The one electrode and the other electrode overlap each other with at least one insulation layer therebetween.

In another aspect of the present disclosure, there is provided a method of manufacturing a display device including forming an active layer of each of a driving transistor and a switching transistor on a first substrate, forming a gate insulation layer on the active layer, forming one electrode of a capacitor and a bottom gate electrode of the driving transistor on the gate insulation layer by using a transparent conductive material, and forming a top gate electrode of the driving transistor on the bottom gate electrode to overlap the active layer, forming an interlayer dielectric on the one electrode of the capacitor and the top gate electrode of the driving transistor and forming a source electrode and a drain electrode of the driving transistor on the interlayer dielectric, forming the other electrode of the capacitor on the interlayer dielectric by using the transparent conductive material, forming a passivation layer on the driving transistor and the capacitor and forming a planarization layer on the passivation layer, and sequentially forming an anode electrode, a bank, a light emitting layer, and a cathode electrode on the planarization layer.

In another aspect of the present disclosure, there is provided a method of manufacturing a display device including forming an active layer of each of a driving transistor on a first substrate, forming a gate insulation layer on the active layer, forming a gate electrode on the gate insulation layer to overlap the active layer, forming an interlayer dielectric on the gate electrode, and forming a source electrode and a drain electrode of the driving transistor on the interlayer dielectric, forming one electrode of the capacitor on the interlayer dielectric and the first electrode or the second electrode of the switching transistor by using the transparent conductive material, forming a passivation layer on the source electrode and the drain electrode of the driving transistor and the one electrode of the capacitor, forming a contact hole which passes through the interlayer dielectric and exposes the gate electrode of the driving transistor, and forming other electrode of the capacitor, connected to the gate electrode of the driving transistor through the contact hole, on the passivation layer by using the transparent conductive material, forming a planarization layer on the passivation layer and the other electrode of the capacitor, and sequentially forming an anode electrode, a bank, a light emitting layer, and a cathode electrode on the planarization layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings:

FIGS. 8A to 8J are cross-sectional views illustrating a method of manufacturing a transparent display device according to an aspect of the present disclosure;

FIG. 10 is a flowchart illustrating a method of manufacturing a transparent display device according to another aspect of the present disclosure;

FIGS. 14A to 14F are cross-sectional views illustrating a method of manufacturing a transparent display device according to another aspect of the present disclosure;

FIGS. 17A to 17F are cross-sectional views illustrating a method of manufacturing a transparent display device according to another aspect of the present disclosure.

DETAILED DESCRIPTION

Figure 1:
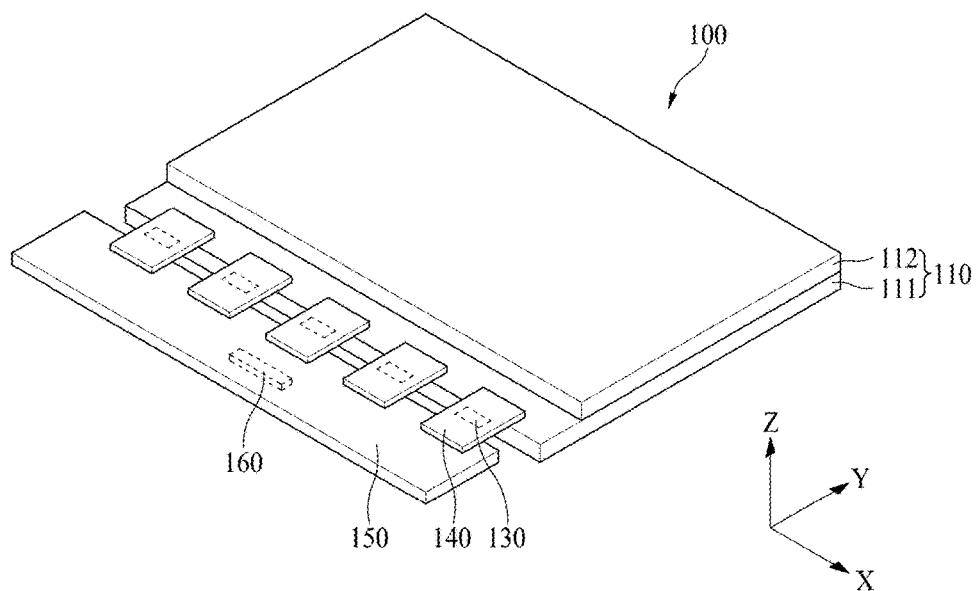
FIG. 1 is a perspective view illustrating a transparent display device according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

Figure 2:
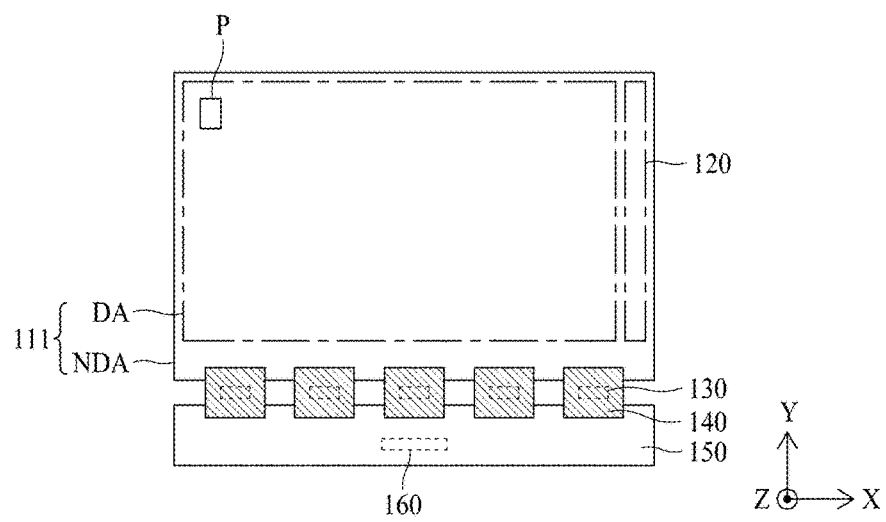
FIG. 2 is a plan view illustrating a first substrate, a gate driver, a source drive integrated circuit (IC), a flexible film, a circuit board, and a timing controller of FIG. 1.
Figure 3:
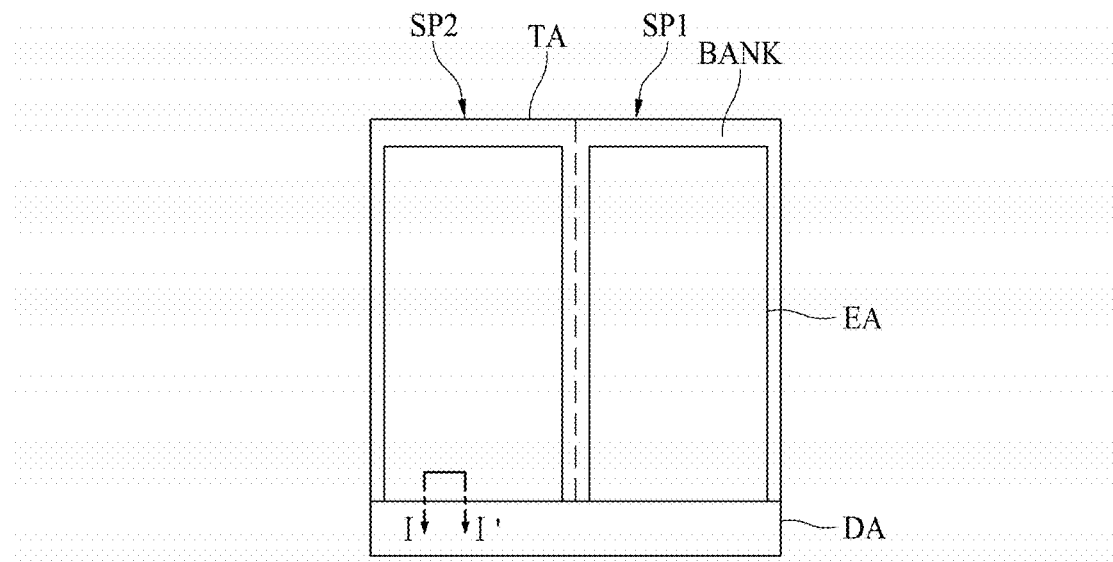
FIG. 3 is an exemplary diagram illustrating pixels adjacent to each other in a gate line direction in a display area of FIG. 2.

FIG. 1 is a perspective view illustrating a transparent display device 100 according to an aspect of the present disclosure. FIG. 2 is a plan view illustrating a first substrate, a gate driver, a source drive integrated circuit (IC), a flexible film, a circuit board, and a timing controller of FIG. 1. FIG. 3 is an exemplary diagram illustrating pixels adjacent to each other in a gate line direction in a display area of FIG. 2.

Referring to FIGS. 1 to 3, the transparent display device 100 according to an aspect of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. Each of the first substrate 111 and the second substrate 112 may be plastic or glass.

The first substrate 111, as illustrated in FIG. 2, may be divided into a display area DA, where a plurality of pixels are provided to display an image, and a non-display area NDA which does not display an image. A plurality of gate lines, a plurality of data lines, and the plurality of pixels may be provided in the display area DA. The plurality of pixels may be respectively provided in a plurality of areas defined by an intersection structure of the gate lines and the data lines. The gate driver 120 and a plurality of pads may be provided in the non-display area NDA.

In FIG. 3, a plurality of pixels SP1 and SP2 adjacent to each other in the gate line direction are illustrated. The pixels SP1 and SP2, as illustrated in FIG. 3, may each include a driving part DA, where a plurality of thin film transistors (TFTs) and a gate line are provided, and an emissive part EA that includes an organic light emitting device and emits light.

When a gate signal is input through the gate line, by using the TFTs, the driving part DA may supply a certain voltage to an anode electrode of the organic light emitting device of the emissive part EA according to a data voltage of a data line. The organic light emitting device of the emissive part EA may emit light having certain brightness according to the voltage supplied to the anode electrode and a voltage supplied to a cathode electrode of the organic light emitting device. The emissive part EA may be configured with one of a red emissive part, a green emissive part, and a blue emissive part.

The emissive part EA may be divided by a bank BANK. The bank may include a black bank and a transparent bank. The TFTs and the gate line of the driving part DA may each be formed of a metal material, and for this reason, when external light is incident on the driving part DA, the external light is reflected by the metal material, causing a reduction in visibility of an image. In order to prevent a visibility of an image from being reduced due to the external light, the black bank may be disposed on the driving part DA to cover the driving part DA. The transparent bank may be disposed between the emissive parts EA of adjacent pixels.

A transmissive part TA may be an area that transmits incident light, and may be an area except the driving part DA. That is, the transmissive part TA may include an area where the emissive part EA and the transparent bank are provided. A transmittance of the transparent display device may depend on an area of the transmissive part TA. However, an area of the transmissive part TA may have a trade-off relationship with an area of the driving part DA, and thus, in order to enlarge an area of the transmissive part TA, an area of the driving part DA should be reduced.

In an aspect of the present disclosure, the capacitor may be formed of a transparent material, and thus, may be disposed to overlap the emissive part EA. That is, in an aspect of the present disclosure, the capacitor may not be disposed in the driving part DA, and thus, an area of the driving part DA is reduced in comparison with a case where the capacitor is disposed in the driving part DA. A detailed description of the capacitor according to an aspect of the present disclosure will be described below with reference to FIGS. 6, 9, 12, and 15. Also, a detailed description of the pixel according to an aspect of the present disclosure will be described below with reference to FIGS. 4 and 5.

The gate driver 120 may sequentially supply gate signals to the gate lines according to a gate control signal input from the timing controller 160. The gate driver 120 may be provided outside one side or both sides of the display area DA of the display panel 110 in a gate driver-in panel (GIP) type. Alternatively, the gate driver 120 may be manufactured as a driving chip and may be mounted on a flexible circuit, or may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads by using an anisotropic conductive film, and thus, the pads may be connected to the lines of the flexible film 140.

The circuit board 150 may be attached on the flexible film 140 which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through cables of the circuit board 150. The timing controller 160 may generate a gate control signal for controlling an operation timing of the gate driver 120 and a source control signal for controlling the source drive IC 130 which is provided in plurality, based on the timing signal. The timing controller 60 may supply the gate control signal to the gate driver 120 and may supply the source control signal to the plurality of source drive ICs 130.

Figure 4:
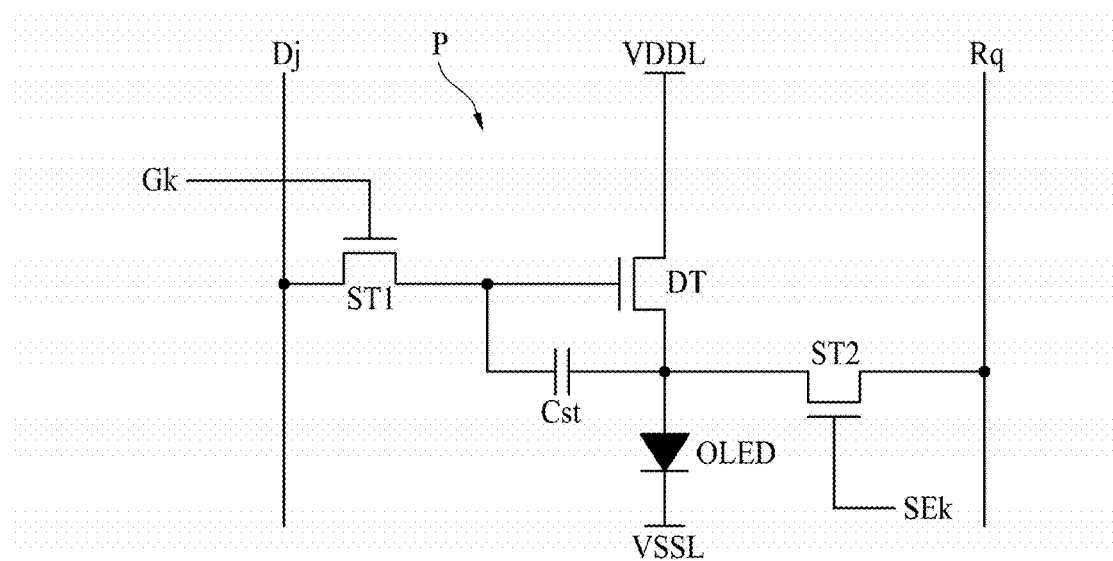
FIG. 4 is a circuit diagram illustrating an example of a pixel of FIG. 3.

FIG. 4 is a circuit diagram illustrating an example of a pixel of FIG. 3. In FIG. 4, for convenience of description, only a pixel P connected to a jth (where j is an integer equal to or more than two) data line Dj, a qth (where q is an integer equal to or more than two) reference voltage line Rq, a kth (where k is an integer equal to or more than two) gate line Gk, and a kth (where k is an integer equal to or more than two) initialization line SEk is illustrated.

Referring to FIG. 4, the pixel P may include an organic light emitting device OLED, a driving transistor DT, a plurality of switching transistors ST1 and ST2, and a capacitor Cst. The plurality of switching transistors ST1 and ST2 may include first and second switching transistors ST1 and ST2.

The organic light emitting device OLED may emit light with a current supplied through the driving transistor DT. An anode electrode of the organic light emitting device OLED may be connected to a source electrode of the driving transistor DT, and a cathode electrode may be connected to a first source voltage line VSSL through which a first source voltage is supplied. The first source voltage line VSSL may be a low-level voltage line through which a low-level source voltage is supplied.

The organic light emitting device OLED may include the anode electrode, a hole transporting layer, an organic light emitting layer, an electron transporting layer, and the cathode electrode. When a voltage is applied to the cathode electrode and the anode electrode, a hole and an electron may respectively move to the organic light emitting layer through the hole transporting layer and the electron transporting layer and may be combined with each other in the organic light emitting layer to emit light.

The driving transistor DT may be disposed between the organic light emitting device OLED and a second source voltage line VDDL through which a second source voltage is supplied. The driving transistor DT may control a current flowing from the second source voltage line VDDL to the organic light emitting device OLED, based on a voltage difference between a gate electrode and a source electrode of the driving transistor DT. The gate electrode of the driving transistor DT may be connected to a first electrode of the first switching transistor ST1, the source electrode may be connected to the anode electrode of the organic light emitting device OLED, and a drain electrode may be connected to the second source voltage line VDDL. The second source voltage line VDDL may be a high-level source voltage line through which a high-level source voltage is supplied.

The first switching transistor ST1 may be turned on by a kth gate signal of the kth gate line Gk and may supply a voltage of the jth data line Dj to the gate electrode of the driving transistor DT. The gate electrode of the first switching transistor ST1 may be connected to the kth gate line Gk, the first electrode may be connected to the gate electrode of the driving transistor DT, and a second electrode may be connected to the jth data line Dj.

The second switching transistor ST2 may be turned on by a kth initialization signal of the kth initialization line SEk and may connect the qth reference voltage line Rq to the source electrode of the driving transistor DT. The gate electrode of the second switching transistor ST2 may be connected to the kth initialization line SEk, a first electrode may be connected to the qth reference voltage line Rq, and a second electrode may be connected to the source electrode of the driving transistor DT.

The first electrode of each of the first and second switching transistors ST1 and ST2 may be a source electrode, and the second electrode may be a drain electrode. However, the present aspect is not limited thereto. In other aspects, the first electrode of each of the first and second switching transistors ST1 and ST2 may be a drain electrode, and the second electrode may be a source electrode.

The capacitor Cst may be provided between the gate electrode and the source electrode of the driving transistor DT. The capacitor Cst may store a difference voltage between a gate voltage and a source voltage of the driving transistor DT.

One electrode of the capacitor Cst may be connected to the gate electrode of the driving transistor DT and the first electrode of the first switching transistor ST1, and the other electrode may be connected to the source electrode of the driving transistor DT, the second electrode of the second switching transistor ST2, and the anode electrode of the organic light emitting device OLED. The one electrode and the other electrode of the capacitor Cst may each be formed of a transparent conductive material. A detailed description on this will be described below with reference to FIGS. 6, 9, 12, and 15.

In FIG. 4, an example where the driving transistor DT and the first and second switching transistors ST1 and ST2 are each formed of an N-type metal oxide semiconductor field effect transistor (MOSFET) has been described, but the present disclosure is not limited thereto. The driving transistor DT and the first and second switching transistors ST1 and ST2 may each be formed of a P-type MOSFET.

Figure 5:
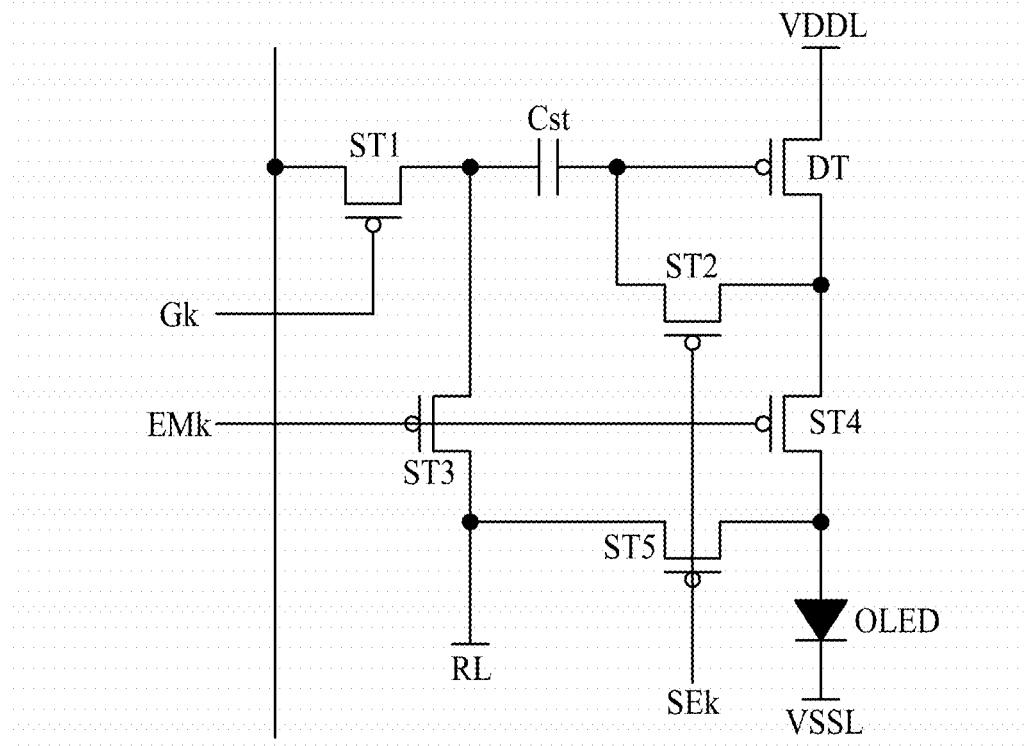
FIG. 5 is a circuit diagram illustrating another example of a pixel of FIG. 3.

FIG. 5 is a circuit diagram illustrating another example of a pixel of FIG. 3. In FIG. 5, for convenience of description, only a pixel P connected to a jth (where j is an integer equal to or more than two) data line Dj, a kth (where k is an integer equal to or more than two) gate line Gk, a kth (where k is an integer equal to or more than two) initialization line SEk, and a kth (where k is an integer equal to or more than two) emission line EMk is illustrated.

Referring to FIG. 5, the pixel P may include an organic light emitting device OLED, a driving transistor DT, a plurality of switching transistors ST1 to ST5, and a capacitor Cst. The plurality of switching transistors ST1 to ST5 may include first to fifth switching transistors ST1 to ST5.

The organic light emitting device OLED may emit light with a current supplied through the driving transistor DT. An anode electrode of the organic light emitting device OLED may be connected to a drain electrode of the driving transistor DT, and a cathode electrode may be connected to a first source voltage line VSSL through which a first source voltage is supplied. The first source voltage line VSSL may be a low-level voltage line through which a low-level source voltage is supplied.

The organic light emitting device OLED may include the anode electrode, a hole transporting layer, an organic light emitting layer, an electron transporting layer, and the cathode electrode. When a voltage is applied to the cathode electrode and the anode electrode, a hole and an electron may respectively move to the organic light emitting layer through the hole transporting layer and the electron transporting layer and may be combined with each other in the organic light emitting layer to emit light.

The driving transistor DT may be disposed between the organic light emitting device OLED and a second source voltage line VDDL through which a second source voltage is supplied. The driving transistor DT may control a current flowing from the second source voltage line VDDL to the organic light emitting device OLED, based on a voltage difference between a gate electrode and a source electrode of the driving transistor DT. The gate electrode of the driving transistor DT may be connected to one electrode of the capacitor Cst and a second electrode of the second switching transistor ST2, the source electrode may be connected to the anode electrode of the organic light emitting device OLED, and a drain electrode may be connected to the second source voltage line VDDL. The second source voltage line VDDL may be a high-level source voltage line through which a high-level source voltage is supplied.

The first switching transistor ST1 may be turned on by a kth gate signal of the kth gate line Gk and may supply a voltage of the jth data line Dj to the other electrode of the capacitor Cst. A gate electrode of the first switching transistor ST1 may be connected to the kth gate line Gk, the first electrode may be connected to the jth data line Dj, and a second electrode may be connected to the other electrode of the capacitor Cst.

The second switching transistor ST2 may be turned on by a kth initialization signal of the kth initialization line SEk and may connect the gate electrode and the drain electrode of the driving transistor DT. A gate electrode of the second switching transistor ST2 may be connected to the kth initialization line SEk, a first electrode may be connected to the drain electrode of the driving transistor DT, and a second electrode may be connected to the gate electrode of the driving transistor DT.

The third switching transistor ST3 may be turned on by a kth emission signal of the kth emission line EMk and may initialize the other electrode of the capacitor Cst to a reference voltage. A gate electrode of the third switching transistor ST3 may be connected to the kth emission line EMk, a first electrode may be connected to the other electrode of the capacitor Cst, and a second electrode may be connected to a reference line RL through which the reference voltage is supplied.

The fourth switching transistor ST4 may be turned on by the kth emission signal of the kth emission line EMk and may connect the drain electrode of the driving transistor DT to the anode electrode of the organic light emitting device OLED. A gate electrode of the fourth switching transistor ST4 may be connected to the kth emission line EMk, a first electrode may be connected to the drain electrode of the driving transistor DT, and a second electrode may be connected to the anode electrode of the organic light emitting device OLED.

The fifth switching transistor ST5 may be turned on by the kth initialization signal of the kth initialization line SEk and may initialize the anode electrode of the organic light emitting device OLED to the reference voltage. A gate electrode of the fifth switching transistor ST5 may be connected to the kth initialization line SEk, a first electrode may be connected to the anode electrode of the organic light emitting device OLED, and a second electrode may be connected to the reference voltage line RL.

The first electrode of each of the first to fifth switching transistors ST1 to ST5 may be a source electrode, and the second electrode may be a drain electrode. However, the present aspect is not limited thereto. In other aspects, the first electrode of each of the first to second switching transistors ST1 to ST5 may be a drain electrode, and the second electrode may be a source electrode.

The capacitor Cst may be provided between the gate electrode of the driving transistor DT and the second electrode of the first switching transistor ST1. The capacitor Cst may store a difference voltage between a voltage at the gate electrode of the driving transistor DT and a voltage at the second electrode of the first switching transistor ST1.

One electrode of the capacitor Cst may be connected to the gate electrode of the driving transistor DT and the second electrode of the second switching transistor ST2, and the other electrode may be connected to the second electrode of the first switching transistor ST1 and the first electrode of the third switching transistor ST3. The one electrode and the other electrode of the capacitor Cst may each be formed of a transparent conductive material. A detailed description on this will be described below with reference to FIGS. 6, 9, 12, and 15.

In FIG. 5, an example where the driving transistor DT and the first to second switching transistors ST1 to ST5 are each formed of a P-type MOSFET has been described, but the present disclosure is not limited thereto. The driving transistor DT and the first to second switching transistors ST1 to ST5 may each be formed of an N-type MOSFET.

Figure 6:
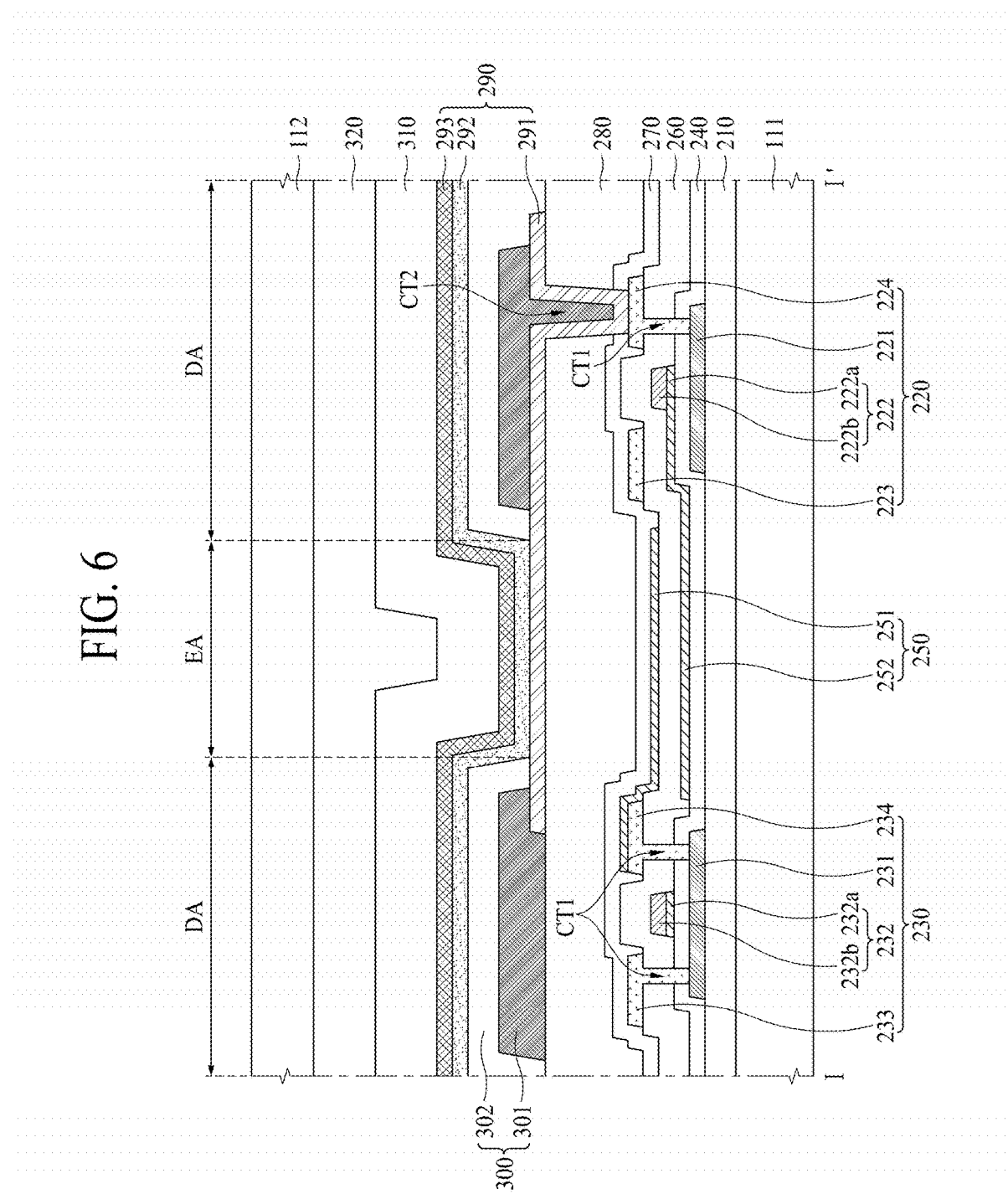
FIG. 6 is a cross-sectional view illustrating a driving transistor, a switching transistor, a capacitor, and an organic light emitting device according to an aspect of the present disclosure.

FIG. 6 is a cross-sectional view illustrating a driving transistor, a switching transistor, a capacitor, and an organic light emitting device according to an aspect of the present disclosure. FIG. 6 is a cross-sectional view illustrating an example taken along line I-I' of FIG. 3.

Referring to FIG. 6, a buffer layer 210 may be formed on one surface of a first substrate 111 facing a second substrate 112, for protecting a plurality of TFTs from water which penetrates through the first substrate 111 vulnerable to penetration of water. The buffer layer 210 may include a plurality of inorganic layers which are alternately stacked. For example, the buffer layer 210 may be formed of a multilayer where one or more of silicon oxide (SiOx), silicon nitride (SiNx), and silicon oxynitride (SiON) are alternately stacked.

A driving transistor 220, a switching transistor 230, and a capacitor 250 may be formed on the buffer layer 210. The switching transistor 230 illustrated in FIG. 6 may be the second switching transistor ST1 of FIG. 4, the first switching transistor ST1 of FIG. 5, or the third switching transistor ST1 of FIG. 5.

The driving transistor 220 may include an active layer 221, a gate electrode 222, a first electrode 223, and a second electrode 224. In FIG. 4, the driving transistor 220 is illustrated as being formed as a top gate type where the gate electrode 222 is disposed on the active layer 221, but is not limited thereto. In other aspects, the driving transistor 220 may be formed as a bottom gate type, where the gate electrode 222 is disposed under the active layer 221, or a double gate type where the gate electrode 222 is disposed both on and under the active layer 221 is disposed.

The active layer 221 may be formed on the buffer layer 210. The active layer 221 may be formed of a silicon-based semiconductor material or an oxide-based semiconductor material. A light blocking layer for blocking external light incident on the active layer 221 may be formed on the first substrate 110.

A gate insulation layer 230 may be formed on the active layer 221. The gate insulation layer 230 may be formed of an inorganic layer, for example, SiOx, SiNx, or a multilayer thereof.

The gate electrode 222 may be formed on the gate insulation layer 230. The gate electrode 222 may include a bottom gate electrode 222a formed of a transparent conductive material and a top gate electrode 222b formed of an opaque conductive material. The bottom gate electrode 222a may be formed of a transparent conductive material (for example, transparent conductive oxide (TCO)) such as indium tin oxide (ITO), indium zin oxide (IZO), or the like. The top gate electrode 222b may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

An interlayer dielectric 260 may be formed on the gate electrode 222. The interlayer dielectric 260 may be formed of an inorganic layer, for example, $SiO_x$, $SiN_x$, or a multilayer thereof.

A first electrode 223 and a second electrode 224 may be formed on the interlayer dielectric 260. Each of the first electrode 223 and the second electrode 224 may be connected to the active layer 221 through a contact hole CT1 which passes through the gate insulation layer 230 and the interlayer dielectric 260. In FIG. 6, the first electrode 223 being connected to the active layer 221 through the contact hole CT1 is omitted for illustrating an example where the one electrode 251 of the capacitor 250 extends from the bottom gate electrode 222a of the driving transistor 220. The first electrode 223 and the second electrode 224 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

The switching transistor 230 may include an active layer 231, a gate electrode 232, a first electrode 233, and a second electrode 234. The active layer 231, the gate electrode 232, the first electrode 233, and the second electrode 234 of the switching transistor 230 are substantially the same as the active layer 221, the gate electrode 222, the first electrode 223, and the second electrode 224 of the driving transistor 220. Thus, detailed descriptions of the active layer 231, the gate electrode 232, the first electrode 233, and the second electrode 234 of the switching transistor 230 are omitted.

The capacitor 250 may include one electrode 251 and the other electrode 252. The one electrode 251 and the other electrode 252 may overlap each other with at least one insulation layer therebetween. For example, as in FIG. 6, the one electrode 251 and the other electrode 252 may overlap each other with the interlayer dielectric 260 therebetween.

The one electrode 251 may be formed on the gate insulation layer 240 to extend from the bottom gate electrode 222a of the driving transistor 220. The one electrode 251 may be formed of a material which is the same as that of the bottom gate electrode 222a of the driving transistor 220. For example, the one electrode 251 may be formed of a transparent conductive material (for example, transparent conductive oxide (TCO)) such as indium tin oxide (ITO), indium zin oxide (IZO), or the like.

The other electrode 252 may be connected to a top of the second electrode 234 of the switching transistor 230, on the interlayer dielectric 260. In FIG. 6, for convenience of description, an example where the other electrode 252 is connected to the top of the second electrode 234 of the switching transistor 230 is illustrated, but the present aspect is not limited thereto. In other aspects, the other electrode 252 may be connected to a top of the first electrode 233 of the switching transistor 230. The other electrode 252 may be formed of a transparent conductive material (for example, transparent conductive oxide (TCO)) such as indium tin oxide (ITO), indium zin oxide (IZO), or the like.

Since the one electrode 251 and the other electrode 252 are each formed of a transparent conductive material, the one electrode 251 and the other electrode 252 may be disposed to overlap an emissive part EA. The emissive part EA, as in FIG. 6, may be an area where an anode electrode 291, an organic light emitting layer 292, and a cathode electrode 293 are sequentially stacked to configure the organic light emitting device 290, and may be an area where the organic light emitting device 290 emits certain light.

That is, in an aspect of the present disclosure, the one electrode 251 and the other electrode 252 of the capacitor 250 may be formed to overlap each other with the interlayer dielectric 260 therebetween and may each be formed of a transparent conductive material. As a result, in an aspect of the present disclosure, the one electrode 251 and the other electrode 252 of the capacitor 250 may be disposed to overlap the emissive part EA. Therefore, an area of a driving part DA is reduced, thereby enlarging an area of a transmissive part TA. Accordingly, in an aspect of the present disclosure, a transmittance of the transparent display device increases.

A passivation layer 270 may be formed on the driving transistor 220, the switching transistor 230, and the capacitor 250. The passivation layer 270 may correspond to an insulation layer. The passivation layer 270 may be formed of an inorganic layer, for example, $SiO_x$, $SiN_x$, or a multilayer thereof.

A planarization layer 280 for planarizing a step height caused by the driving transistor 220, the switching transistor 230, and the capacitor 250 may be formed on the passivation layer 270. The planarization layer 280 may correspond to an insulation layer. The passivation layer 280 may be formed of an organic layer such as acryl resin, epoxy resin, phenolic resin, polyamide resin, polyimide resin, or the like.

The organic light emitting device 290 and a bank 300 may be formed on the planarization layer 280. The organic light emitting device 290 may include the anode electrode 291, the organic light emitting layer 292, and the cathode electrode 293. An area where the anode electrode 291, the organic light emitting layer 292, and the cathode electrode 293 are sequentially stacked may be defined as the emissive part EA.

The anode electrode 291 may be formed on the planarization layer 280. The anode electrode 291 may be connected to the second electrode 224 of the driving transistor 220 through a contact hole CT2 passing through the planarization layer 280. The anode electrode 291 may be formed of a transparent conductive material (TCO), such as ITO, IZO, or the like, or a semi-transmissive conductive material such as magnesium (Mg), silver (Ag), or an alloy of Mg and Ag.

The bank 300 may divide the emissive part EA. The bank 300 may be formed on the planarization layer 280 to cover an edge of the anode electrode 291.

The bank 300 may include a black bank 301 and a transparent bank 302. The black bank 301 may be disposed on the driving part DA to cover the driving part DA, for preventing image visibility from being reduced by reflection of external light. That is, as in FIG. 6, the black bank 301 may be disposed to cover the driving transistor 220 and the switching transistor 230 of the driving part DA. The black bank 301 may include a material for absorbing light. For example, the black bank 301 may be an organic layer (for example, a black organic layer) having a certain color.

The transparent bank 302 may be formed to cover the black bank 301. Also, the transparent bank 302 may be formed between adjacent emissive parts EA. The transparent bank 302 may be formed of an organic layer such as acryl resin, epoxy resin, phenolic resin, polyamide resin, polyimide resin, or the like.

The organic light emitting layer 292 may be formed on the anode electrode 291 and the bank 300. The organic light emitting layer 292 may include a hole transporting layer, a light emitting layer, and an electron transporting layer. In this case, when a voltage is applied to the anode electrode 291 and the cathode electrode 293, a hole and an electron may respectively move to the light emitting layer through the hole transporting layer and the electron transporting layer and may be combined with each other in the light emitting layer to emit light.

The organic light emitting layer 292 may be configured with a white light emitting layer which emits white light. In this case, as in FIG. 6, the organic light emitting layer 292 may be formed to cover the anode electrode 291 and the bank 300, and a color filter 320 may be formed on the second substrate 112.

Alternatively, the organic light emitting layer 292 may be a red light emitting layer emitting red light, a green light emitting layer emitting green light, or a blue light emitting layer emitting blue light. In this case, the organic light emitting layer 292 may be formed in an area corresponding to the emissive part EA, and the color filter 320 may not be formed on the second substrate 112.

The cathode electrode 293 may be formed on the organic light emitting layer 292. In a case where an organic light emitting display device is implemented in a top emission structure, the cathode electrode 293 may be formed of a transparent conductive material (TCO), such as ITO, IZO, and the like, or a semi-transmissive conductive material such as magnesium (Mg), silver (Ag), and an alloy of Mg and Ag. A capping layer may be formed on the cathode electrode 293.

An encapsulation layer 310 may be formed on the organic light emitting device 290. The encapsulation layer 310 prevents oxygen or water from penetrating into the organic light emitting layer 292 and the cathode electrode 293. To this end, the encapsulation layer 290 may include at least one inorganic layer and at least one organic layer.

For example, the encapsulation layer 290 may include a first inorganic layer, an organic layer, and a second inorganic layer. In this case, the first inorganic layer may be formed on the cathode electrode 293 to cover the cathode electrode 293. The organic layer may be formed on the first inorganic layer to cover the first inorganic layer. The organic layer may be formed to have a sufficient thickness, for preventing particles from penetrating into the organic light emitting layer 292 and the cathode electrode 293 via the first inorganic layer. The second inorganic layer may be formed on the organic layer to cover the organic layer. Each of the first and second inorganic layers may be formed of silicon nitride, aluminum nitride, zirconium nitride, titanium nitride, hafnium nitride, tantalum nitride, silicon oxide, aluminum oxide, titanium oxide, and/or the like. The organic layer may be transparently formed for transmitting light L emitted from the organic light emitting layer 292. The organic layer may be formed of an organic material capable of transmitting 99% or more of the light L emitted from the organic light emitting layer 292.

In a case where the organic light emitting device 290 emits white light, a plurality of color filters and a black matrix may be formed on the second substrate 112 facing the first substrate 111. In a case where the organic light emitting device 290 emits one of red light, green light, and blue light, the color filters and the black matrix may not be provided on the second substrate 112.

The first substrate 111 may be bonded to the second substrate 112 by an adhesive layer 320. The adhesive layer 320 may include a transparent adhesive resin or a transparent adhesive film.

As described above, in an aspect of the present disclosure, the one electrode 251 and the other electrode 252 of the capacitor 250 may be formed to overlap each other with the interlayer dielectric 260 therebetween and may each be formed of a transparent conductive material. As a result, in an aspect of the present disclosure, the one electrode 251 and the other electrode 252 of the capacitor 250 may be disposed to overlap the emissive part EA. Therefore, an area of a driving part DA is reduced, thereby enlarging an area of a transmissive part TA. Accordingly, in an aspect of the present disclosure, a transmittance of the transparent display device increases.

Moreover, in an aspect of the present disclosure, the anode electrode 291 and the cathode electrode 292 of the organic light emitting device 290 may each be formed of a metal material capable of transmitting light. As a result, in an aspect of the present disclosure, light emitted from the emissive part EA may be output to the first substrate 111 and the second substrate 112. That is, in an aspect of the present disclosure, the transparent display device may be implemented as a double-sided display device which enables a user to view an image at the front and the rear.

Moreover, in an aspect of the present disclosure, the anode electrode 291 and the cathode electrode 292 of the organic light emitting device 290 may each be formed of a metal material capable of transmitting light. As a result, in an aspect of the present disclosure, the emissive part EA may act as a transmissive part TA which transmits incident light as-is.

Furthermore, in an aspect of the present disclosure, due to the black bank 302, a visibility of an image is prevented from being reduced by reflection of external light.

Figure 7:
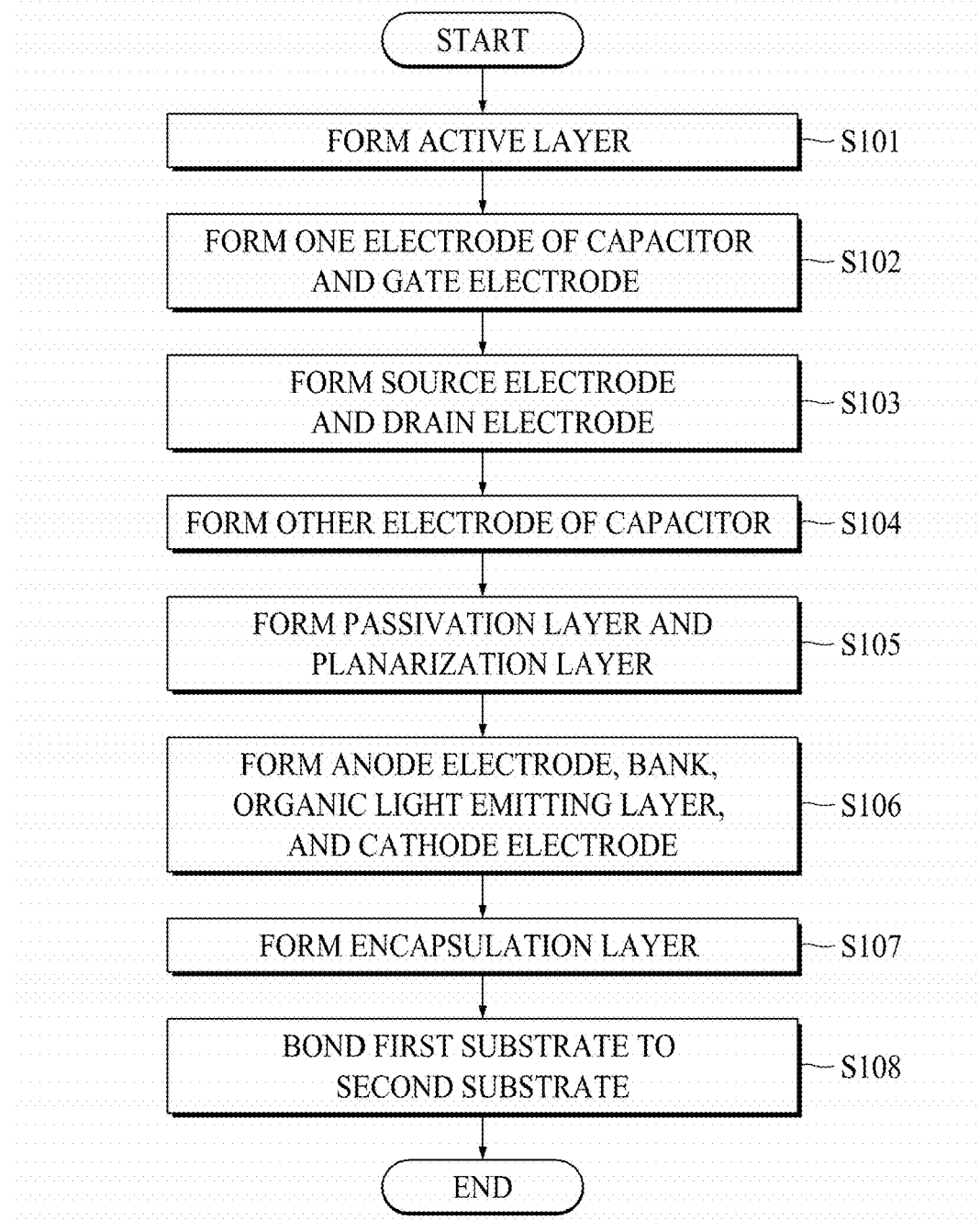
FIG. 7 is a flowchart illustrating a method of manufacturing a transparent display device according to an aspect of the present disclosure.

FIG. 7 is a flowchart illustrating a method of manufacturing a transparent display device according to an aspect of the present disclosure. FIGS. 8A to 8J are cross-sectional views illustrating a method of manufacturing a transparent display device according to an aspect of the present disclosure. The cross-sectional views illustrated in FIGS. 8A to 8J relate to a method of manufacturing a transparent display device illustrated in FIG. 6, and thus, like reference numerals refer to like elements.

Hereinafter, a method of manufacturing a transparent display device according to an aspect of the present disclosure will be described in more detail with reference to FIGS. 7 and 8A to 8J.

First, as in FIG. 8A, a buffer layer 210 may be formed on a first substrate 111, for protecting elements from water which penetrates through the first substrate 111. The buffer layer 210 may include a plurality of inorganic layers which are alternately stacked, for protecting a TFT 220 and an organic light emitting device 290 from water which penetrates through the first substrate 111 vulnerable to penetration of water. For example, the buffer layer 210 may be formed of a multilayer where one or more of silicon oxide ($SiO_x$), silicon nitride ($SiN_x$), and silicon oxynitride (SiON) are alternately stacked. The buffer layer 210 may be formed by a chemical vapor deposition (CVD) process.

An active layer 221 of a driving transistor and an active layer 231 of a switching transistor may be formed on the buffer layer 210. In detail, an active metal layer may be formed all over the buffer layer 210 by using a sputtering process or a metal organic chemical vapor deposition (MOCVD) process. Subsequently, the active layers 221 and 231 may be formed by patterning the active metal layer through a mask process using a photoresist pattern. The active layers 221 and 231 may each be formed of a silicon-based semiconductor material or an oxide-based semiconductor material.

Subsequently, a gate insulation layer 240 may be formed on the active layers 221 and 231. The gate insulation layer 240 may be formed of an inorganic layer, for example, $SiO_x$, $SiN_x$, or a multilayer thereof. (shown in S101 of FIG. 7)

Figure 8B:
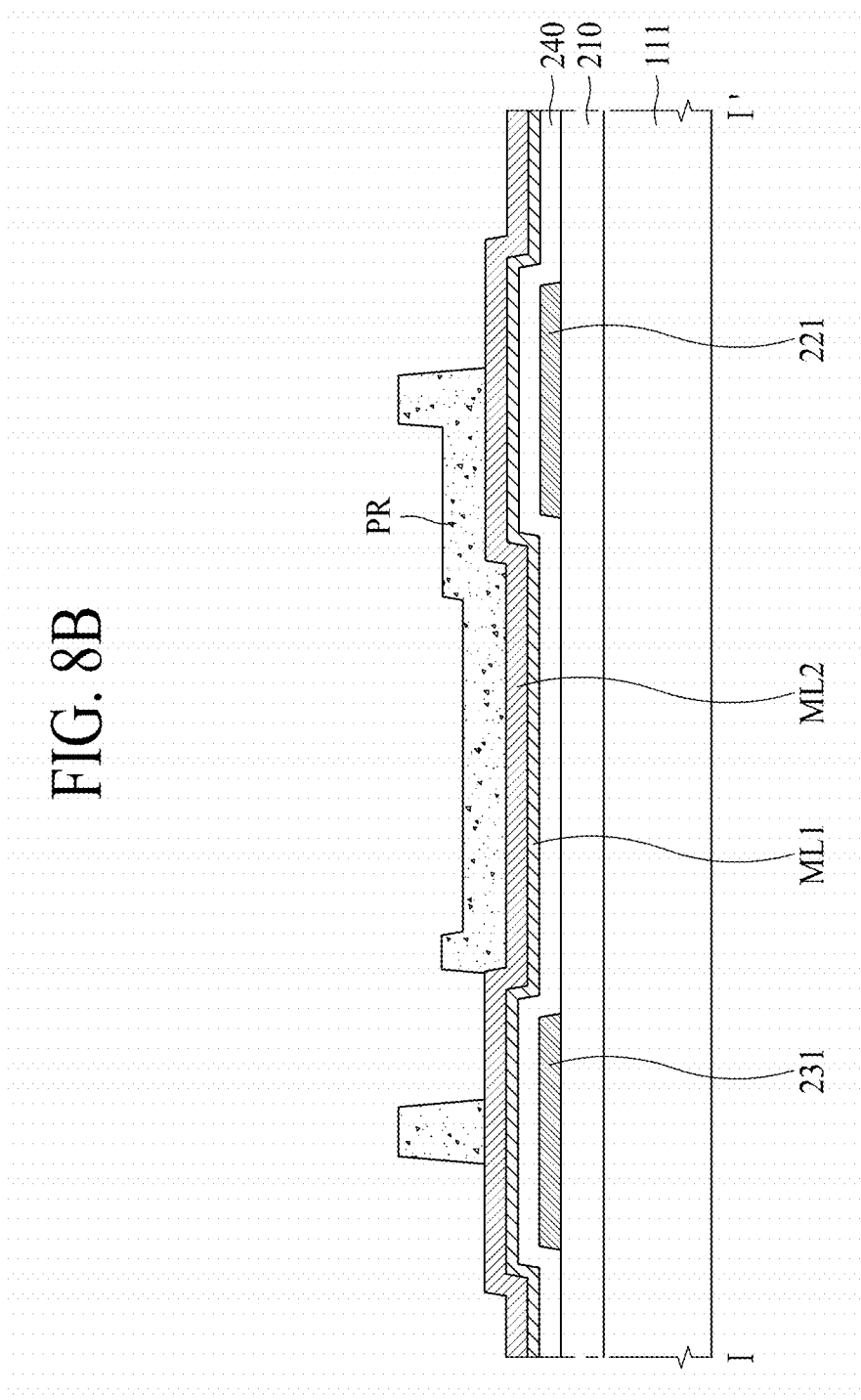
Figure 8C:
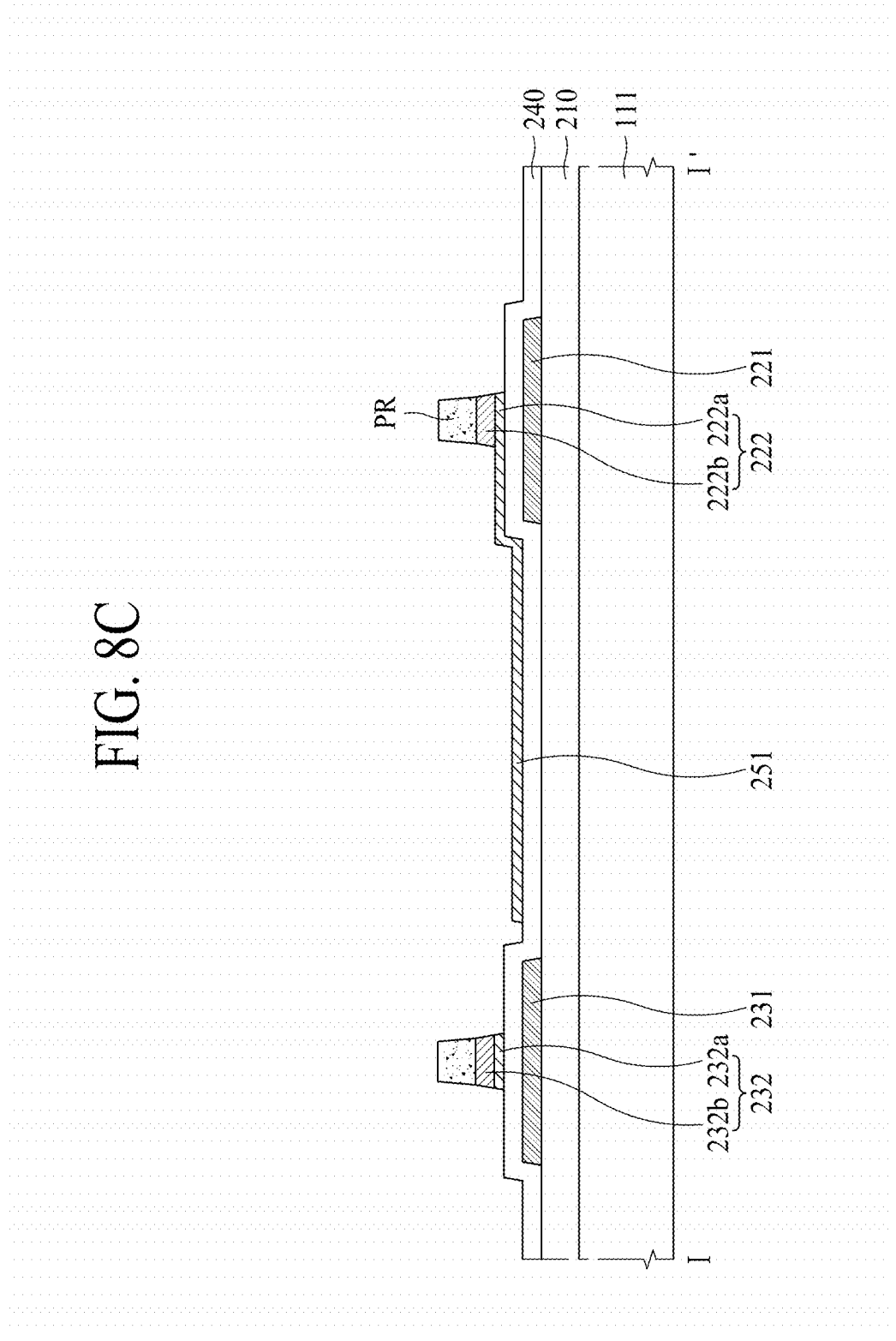

Second, the gate insulation layer 240 may be formed on the active layers 221 and 231, and as in FIGS. 8B to 8D, one electrode 251 of a capacitor 250, a plurality of bottom gate electrodes 222a and 232a, and a plurality of top gate electrodes 222b and 232b may be formed on the gate insulation layer 240 by using a halftone mask process.

The gate insulation layer 240 may be formed of an inorganic layer, for example, SiOx, SiNx, or a multilayer thereof. The gate insulation layer 240 may be formed through a CVD process.

Subsequently, as in FIG. 8B, a first metal layer ML1 may be formed all over the gate insulation layer 240 by using a sputtering process or an MOCVD process, and a second metal layer ML2 may be formed all over the first metal layer ML1. As in FIG. 8B, a photoresist pattern PR having a first thickness may be formed in an area where the one electrode 251 is to be formed on the second metal layer ML2, and a photoresist pattern PR having a second thickness thicker than the first thickness may be formed in an area where the top gate electrodes 222b and 232b are to be formed.

Subsequently, as in FIG. 8C, the first and second metal layers ML1 and ML2 may be patterned by performing an etching process. Subsequently, when an ashing process of removing the photoresist pattern PR having the first thickness is performed, as in FIG. 8C, the photoresist pattern PR may remain in only an area where the top gate electrodes 222b and 232b are to be formed.

Subsequently, as in FIG. 8D, the one electrode 251 of the capacitor 250 and the bottom gate electrodes 222a and 232a may be formed by removing the second metal layer ML2 through an etching process, and when an ashing process of removing the photoresist pattern PR is performed, as in FIG. 8D, the top gate electrodes 222b and 232b may be formed.

The one electrode 251 of the capacitor 250 and the bottom gate electrode 222a may be formed of a transparent conductive material (TCO) such as indium tin oxide (ITO), indium zin oxide (IZO), or the like. The top gate electrode 222b may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (S102 of FIG. 7)

Figure 8E:
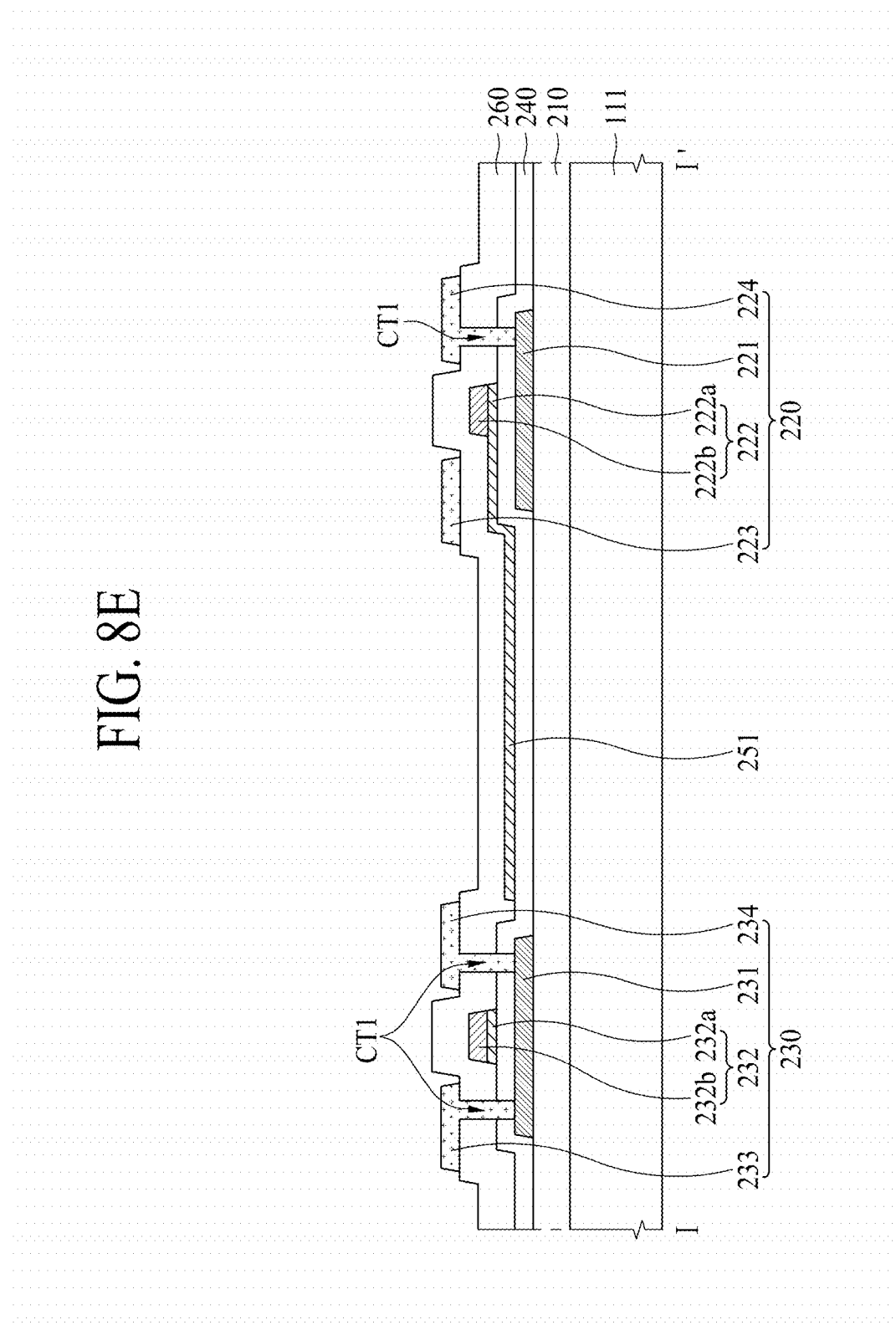

Third, as in FIG. 8E, an interlayer dielectric 260 may be formed on the one electrode 251 of the capacitor 250 and the gate electrode 222, and a plurality of first electrodes 223 and 233 and a plurality of second electrodes 224 and 234 may be formed on the interlayer dielectric 260.

In detail, the interlayer dielectric 260 may be formed of an inorganic layer, for example, $SiO_x$, $SiN_x$, or a multilayer thereof. The interlayer dielectric 260 may be formed through a CVD process.

Subsequently, a plurality of contact holes CT1 which pass through the gate insulation layer 240 and the interlayer dielectric 260 and expose the active layer 221 may be formed.

Subsequently, the first electrodes 223 and 233 and the second electrodes 224 and 234 may be formed on the interlayer dielectric 260. In detail, a third metal layer may be formed all over the interlayer dielectric 260 by using a sputtering process or an MOCVD process. Subsequently, the first electrodes 223 and 233 and the second electrodes 224 and 234 may be formed by patterning the third metal layer through a mask process using a photoresist pattern. Each of the first and second electrodes 223 and 224 may be connected to the active layer 221 through a corresponding contact hole CT1 which passes through the gate insulation layer 230 and the interlayer dielectric 260, and each of the first and second electrodes 233 and 234 may be connected to the active layer 231 through a corresponding contact hole CT1.

The first electrodes 223 and 233 and the second electrodes 224 and 234 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (shown in S103 of FIG. 7)

Fourth, as in FIG. 8F, the other electrode 252 of the capacitor 250 may be formed on a top of the first electrode 233 or the second electrode 234 of the switching transistor 230 and the interlayer dielectric 260. In detail, a fourth metal layer may be formed on the interlayer dielectric 260 and a top of each of the first electrodes 223 and 233 and the second electrodes 224 and 234 by using a sputtering process or an MOCVD process. Subsequently, the other electrode 252 of the capacitor 250 may be formed by patterning the fourth metal layer through a mask process using a photoresist pattern.

The other electrode 252 of the capacitor 250 may be formed of a transparent conductive material (TCO) such as ITO, IZO, or the like. (shown in S104 of FIG. 7)

Figure 8G:
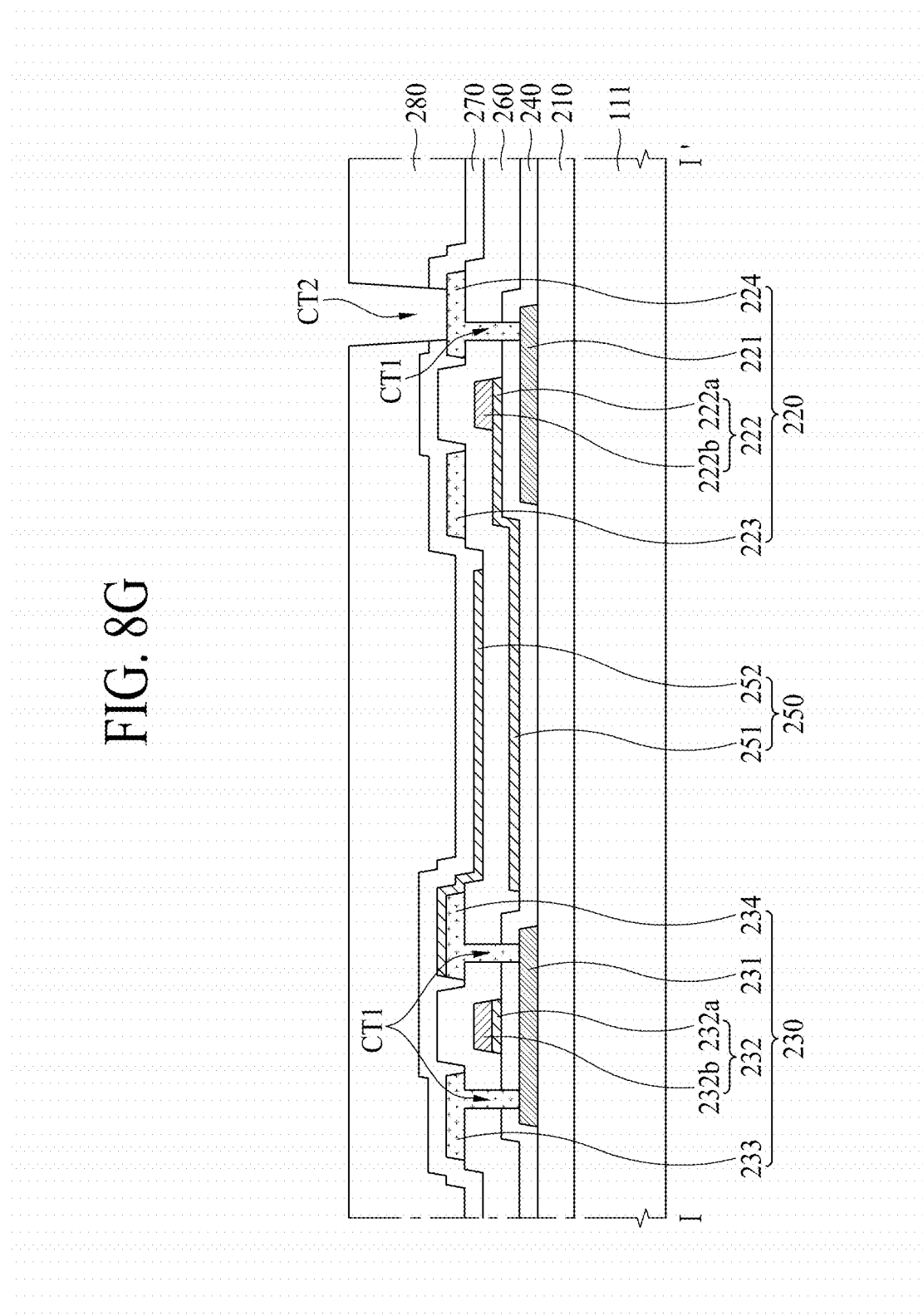

Fifth, as in FIG. 8G, a passivation layer 270 may be formed on the driving transistor 220, the switching transistor 230, and the capacitor 250. The passivation layer 270 may be formed of an inorganic layer, for example, $SiO_x$, $SiN_x$, or a multilayer thereof. The passivation layer 270 may be formed through a CVD process.

Subsequently, as in FIG. 8G, a planarization layer 280 for planarizing a step height caused by the driving transistor 220, the switching transistor 230, and the capacitor 250 may be formed on the passivation layer 270. The planarization layer 280 may be formed of an organic layer such as acryl resin, epoxy resin, phenolic resin, polyamide resin, polyimide resin, or the like. The planarization layer 280 may be formed through a CVD process. (shown in S105 of FIG. 7)

Figure 8H:
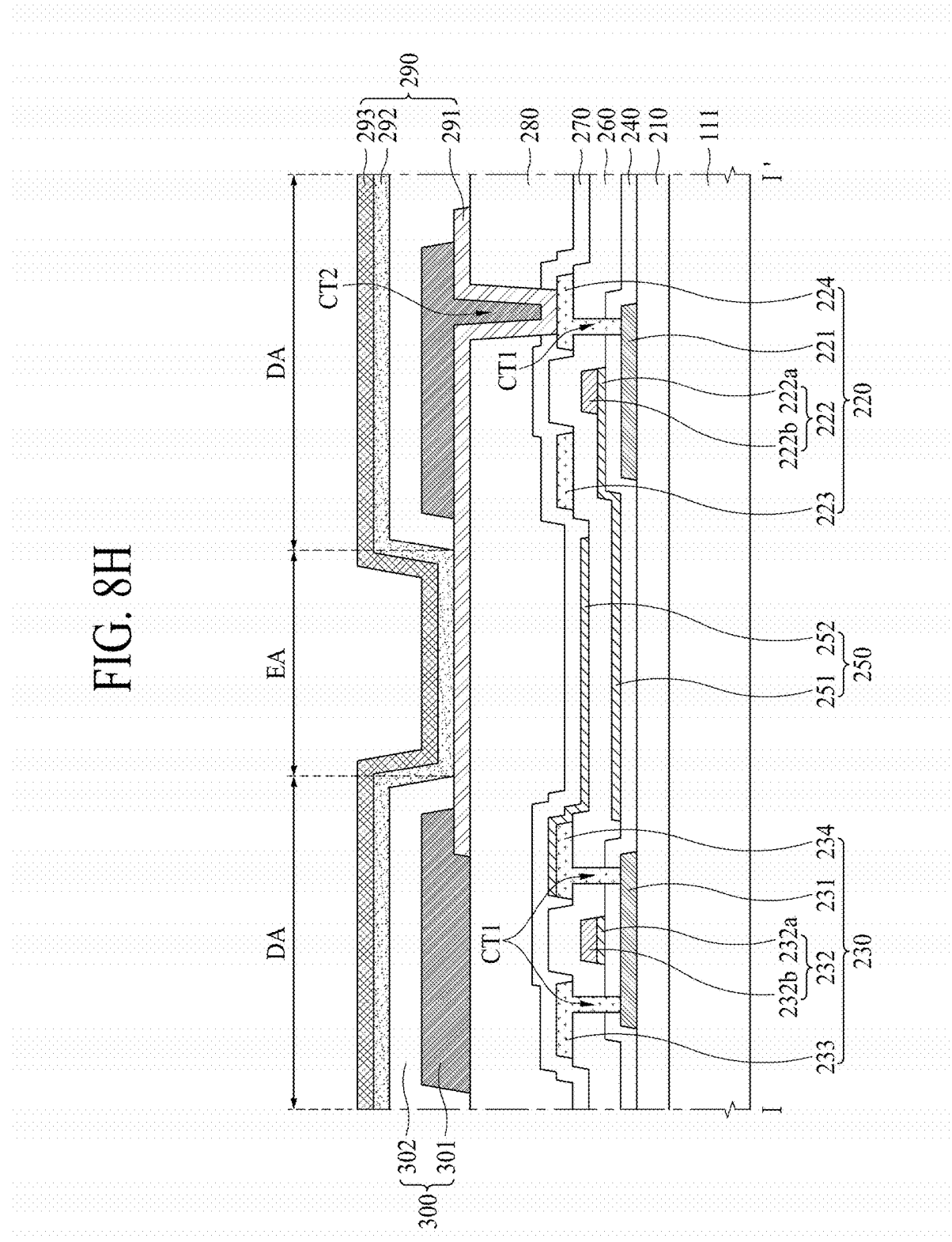

Sixth, as in FIG. 8H, an anode electrode 291, a bank 300, an organic light emitting layer 292, and a cathode electrode 293 may be sequentially formed.

In detail, the fourth metal layer may be formed all over the planarization layer 280 by using a sputtering process or an MOCVD process. Subsequently, the anode electrode 291 may be formed by patterning the fourth metal layer through a mask process using a photoresist pattern. The anode electrode 291 may be connected to a drain electrode 224 of the driving transistor 220 through a contact hole CT2 which passes through the passivation layer 270 and the planarization layer 280. The anode electrode 291 may be formed of a transparent conductive material (TCO) such as ITO or IZO capable of transmitting light, or a semi-transmissive conductive material such as magnesium (Mg), silver (Ag), or an alloy of Mg and Ag.

Subsequently, the bank 300 may be formed on the planarization layer 280 to cover an edge of the anode electrode 291, for dividing the emissive part EA. The bank 300 may include a black bank 301 and a transparent bank 302. The black bank 301 may include a material for absorbing light. For example, the black bank 301 may be an organic layer (for example, a black organic layer) having a certain color. The transparent bank 302 may be formed of an organic layer such as acryl resin, epoxy resin, phenolic resin, polyamide resin, polyimide resin, or the like.

Subsequently, the organic light emitting layer 292 may be formed on the anode electrode 291 and the bank 300. The organic light emitting layer 292 may be formed through a deposition process or a solution process. In a case where the organic light emitting layer 292 is formed through a deposition process, the organic light emitting layer 292 may be formed through an evaporation process.

Subsequently, the cathode electrode 293 may be formed on the organic light emitting layer 292. The cathode electrode 293 may be formed through a sputtering process or an MOCVD process. The cathode electrode 293 may be formed of a transparent conductive material (TCO) such as ITO or IZO capable of transmitting light, or a semi-transmissive conductive material such as magnesium (Mg), silver (Ag), or an alloy of Mg and Ag. A capping layer may be formed on the cathode electrode 283. (shown in S106 of FIG. 7)

Figure 8I:
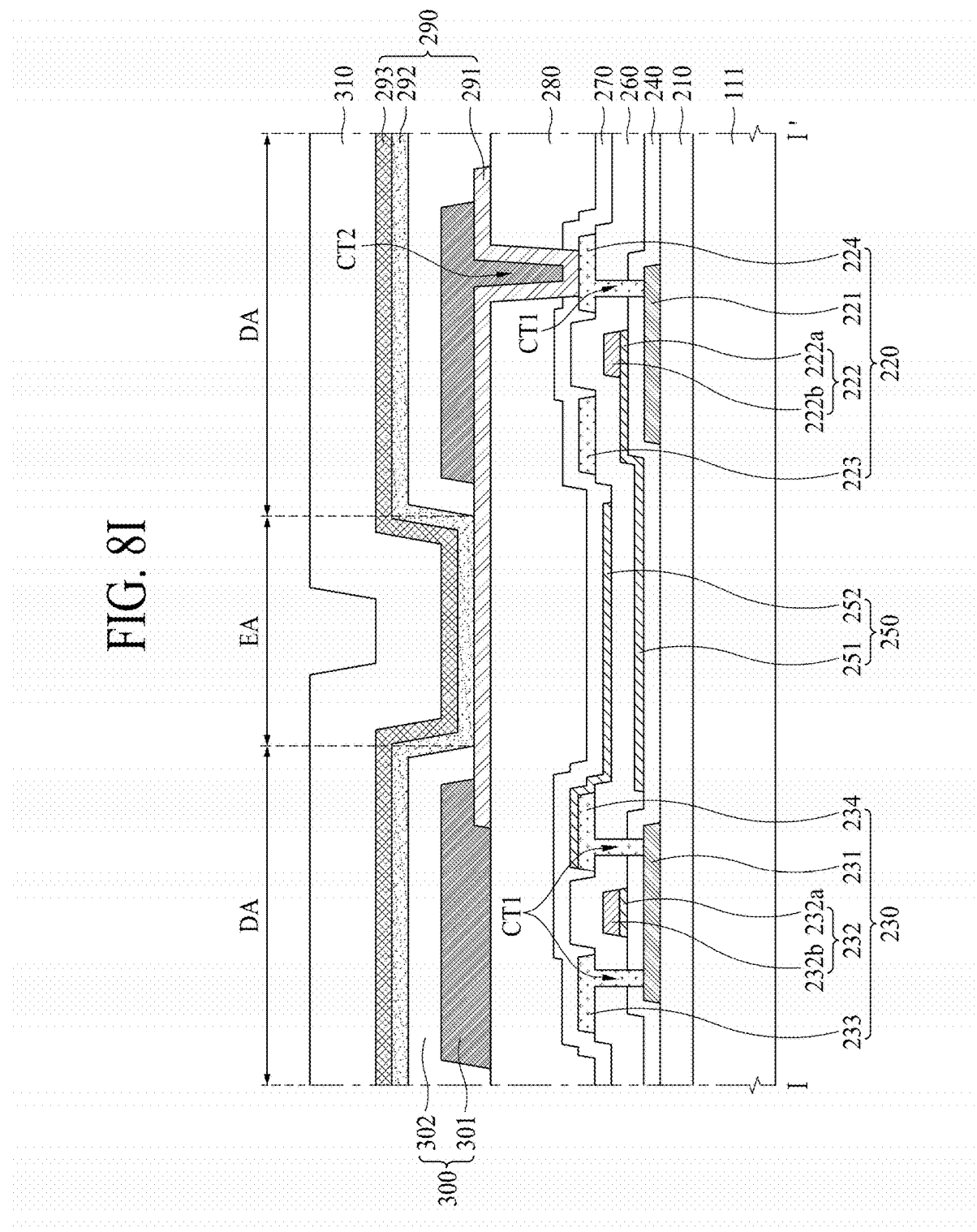

Seventh, as in FIG. 8I, an encapsulation layer 290 may be formed on the cathode electrode 293. The encapsulation layer 290 may include at least one inorganic layer and at least one organic layer. The at least one inorganic layer may be formed of silicon nitride, aluminum nitride, zirconium nitride, titanium nitride, hafnium nitride, tantalum nitride, silicon oxide, aluminum oxide, titanium oxide, and/or the like. The organic layer may be formed of a transparent organic material for transmitting light emitted from the organic light emitting layer 292. (shown in S107 of FIG. 7)

Figure 8J:
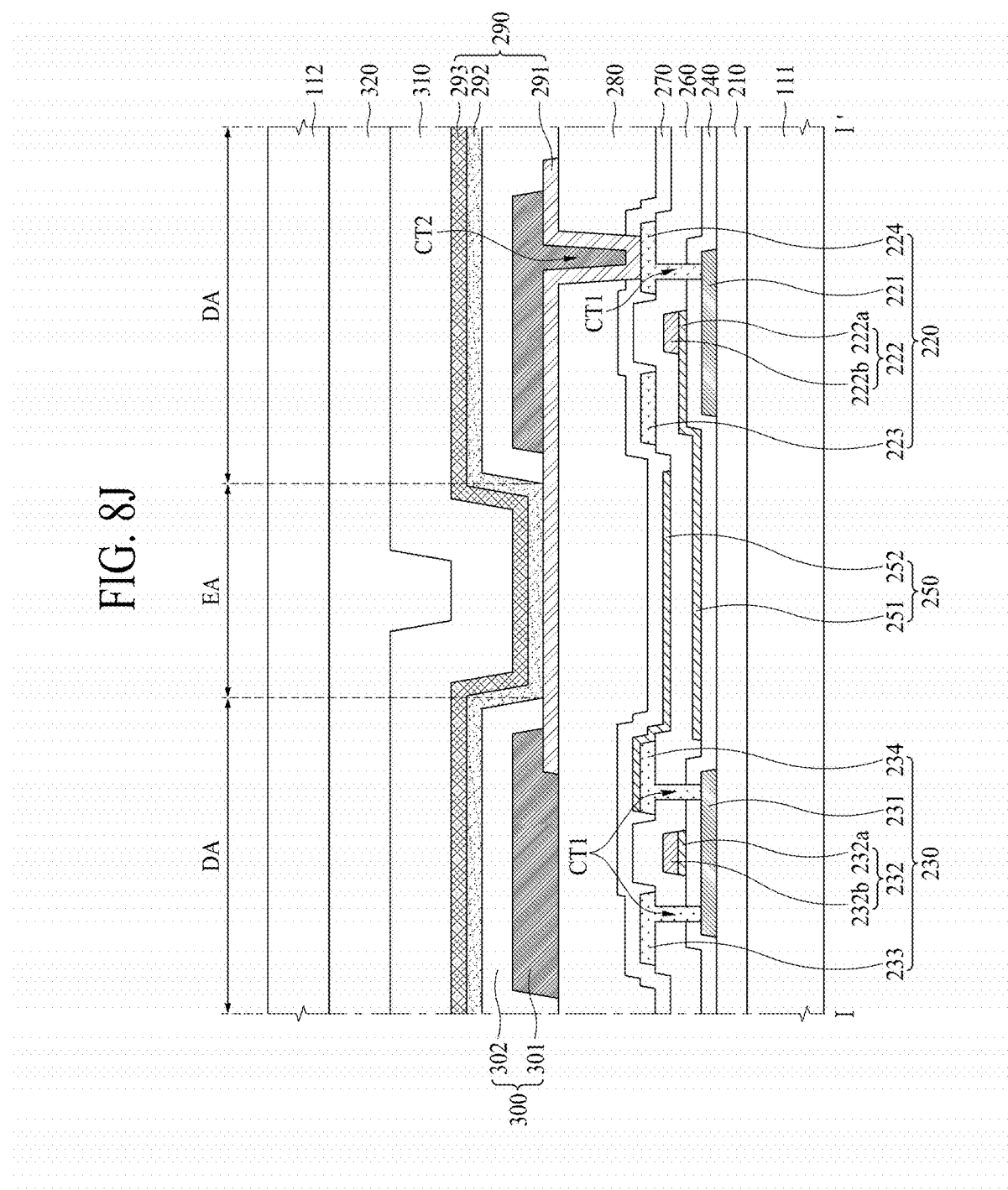

Eighth, as in FIG. 8J, the first substrate 111 may be bonded to the second substrate 112 by an adhesive layer 320. The adhesive layer 320 may include a transparent adhesive resin or a transparent adhesive film. (shown in S108 of FIG. 7)

As described above, in an aspect of the present disclosure, the one electrode 251 and the other electrode 252 of the capacitor 250 may be formed to overlap each other with the interlayer dielectric 260 therebetween and may each be formed of a transparent conductive material. As a result, in an aspect of the present disclosure, the one electrode 251 and the other electrode 252 of the capacitor 250 may be disposed to overlap the emissive part EA. Therefore, an area of the driving part DA is reduced, thereby enlarging an area of the transmissive part TA. Accordingly, in an aspect of the present disclosure, a transmittance of the transparent display device increases.

Moreover, in an aspect of the present disclosure, since the one electrode 251 of the capacitor 250, the bottom gate electrode 222a, and the top gate electrode 222b are formed by using a halftone mask process, the one electrode 251 of the capacitor 250 may be transparently formed without adding a mask process. Accordingly, in an aspect of the present disclosure, an increase in the manufacturing cost is minimized, and thus, the one electrode 251 and the other electrode 252 of the capacitor 250 may be transparently formed.

Figure 9:
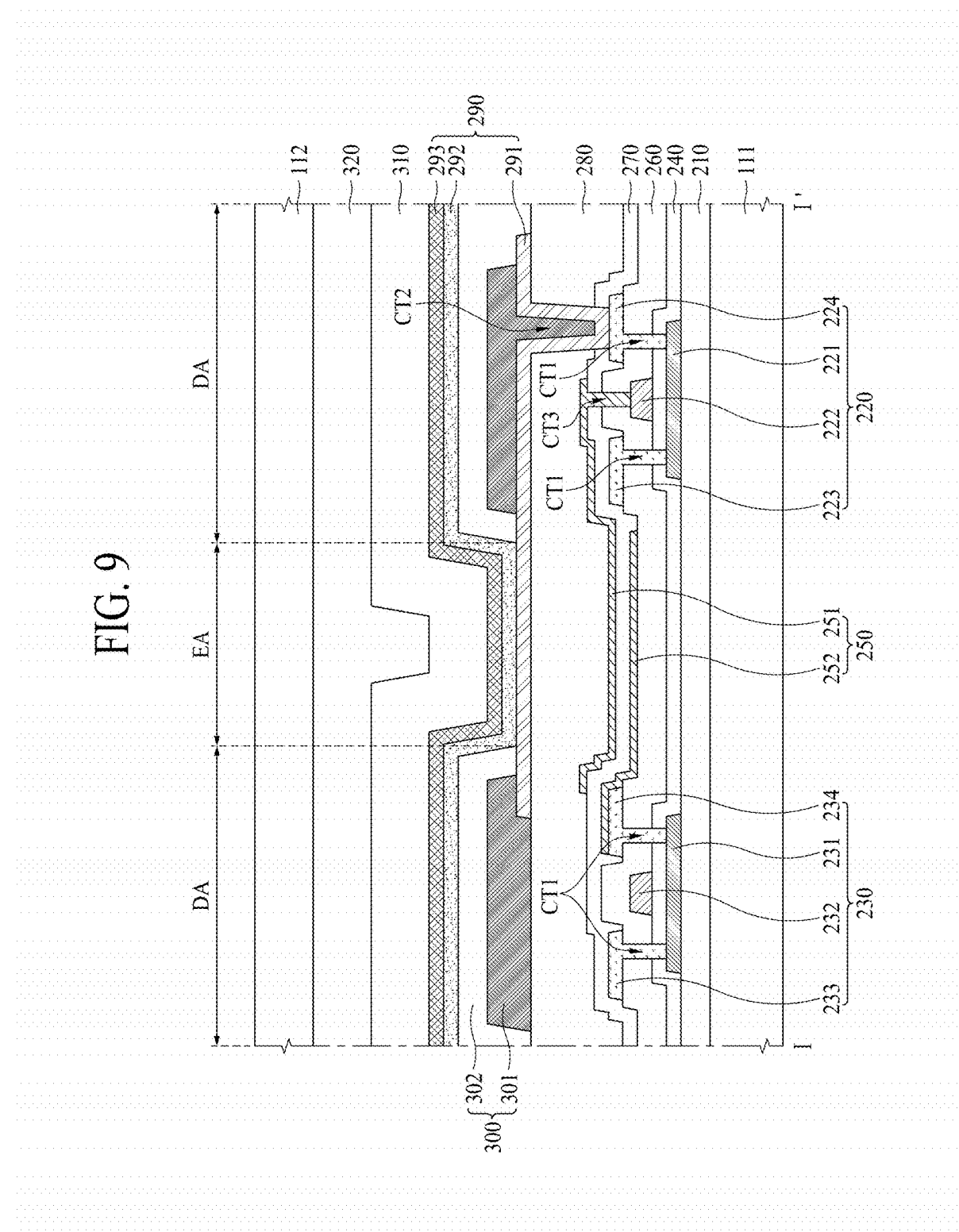
FIG. 9 is a cross-sectional view illustrating a driving transistor, a switching transistor, a capacitor, and an organic light emitting device according to another aspect of the present disclosure.

FIG. 9 is a cross-sectional view illustrating a driving transistor, a switching transistor, a capacitor, and an organic light emitting device according to another aspect of the present disclosure. FIG. 9 is a cross-sectional view illustrating another example taken along line I-I' of FIG. 3.

A first substrate 111, a second substrate 112, a buffer layer 210, a gate insulation layer 240, an interlayer dielectric 260, a passivation layer 270, a planarization layer 280, an organic light emitting device 290, a bank 300, an encapsulation layer 310, and an adhesive layer 320 illustrated in FIG. 9 are substantially the same as the elements described above with reference to FIG. 6. Also, except that each of gate electrodes 222 and 232 is formed of a single layer, a driving transistor 220 and a switching transistor 230 are substantially the same as the elements described above with reference to FIG. 6. Therefore, detailed descriptions of the first substrate 111, the second substrate 112, the buffer layer 210, the driving transistor 220, the switching transistor 230, the gate insulation layer 240, the interlayer dielectric 260, the passivation layer 270, the planarization layer 280, the organic light emitting device 290, the bank 300, the encapsulation layer 310, and the adhesive layer 320 are omitted.

Referring to FIG. 9, the gate electrode 222 of the driving transistor 220 and the gate electrode 232 of the switching transistor 230 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

The capacitor 250 may include one electrode 251 and the other electrode 252. The one electrode 251 and the other electrode 252 may overlap each other with at least one insulation layer therebetween. For example, as in FIG. 9, the one electrode 251 and the other electrode 252 may overlap each other with the passivation layer 270 therebetween.

The one electrode 251 may be formed on the passivation layer 270. The one electrode 251 may be connected to a top of the gate electrode 222 through a contact hole CT3 which passes through the interlayer dielectric 260 and the passivation layer 270 and exposes the gate electrode 222 of the driving transistor 220. The one electrode 251 may be formed of a transparent conductive material (TCO) such as ITO, IZO, or the like.

The other electrode 252 may be connected to a top of the second electrode 234 of the switching transistor 230, on the interlayer dielectric 260. In FIG. 9, for convenience of description, an example where the other electrode 252 is connected to the top of the second electrode 234 of the switching transistor 230 is illustrated, but the present aspect is not limited thereto. In other aspects, the other electrode 252 may be connected to a top of the first electrode 233 of the switching transistor 230. The other electrode 252 may be formed of a transparent conductive material (TCO) such as ITO, IZO, or the like.

Since the one electrode 251 and the other electrode 252 are each formed of a transparent conductive material, the one electrode 251 and the other electrode 252 may be disposed to overlap an emissive part EA. The emissive part EA, as in FIG. 9, may be an area where an anode electrode 291, an organic light emitting layer 292, and a cathode electrode 293 are sequentially stacked to configure the organic light emitting device 290, and may be an area where the organic light emitting device 290 emits certain light.

As described above, in an aspect of the present disclosure, the one electrode 251 and the other electrode 252 of the capacitor 250 may be formed to overlap each other with the passivation layer 270 therebetween and may each be formed of a transparent conductive material. As a result, in an aspect of the present disclosure, the one electrode 251 and the other electrode 252 of the capacitor 250 may be disposed to overlap the emissive part EA. Therefore, an area of a driving part DA is reduced, thereby enlarging an area of a transmissive part TA. Accordingly, in an aspect of the present disclosure, a transmittance of the transparent display device increases.

FIG. 10 is a flowchart illustrating a method of manufacturing a transparent display device according to another aspect of the present disclosure. FIGS. 11A to 11D are cross-sectional views illustrating a method of manufacturing a transparent display device according to another aspect of the present disclosure. The cross-sectional views illustrated in FIGS. 11A to 11D relate to a method of manufacturing a transparent display device illustrated in FIG. 9, and thus, like reference numerals refer to like elements.

Hereinafter, a method of manufacturing a transparent display device according to another aspect of the present disclosure will be described in more detail with reference to FIGS. 10 and 11A to 11D.

Figure 11A:
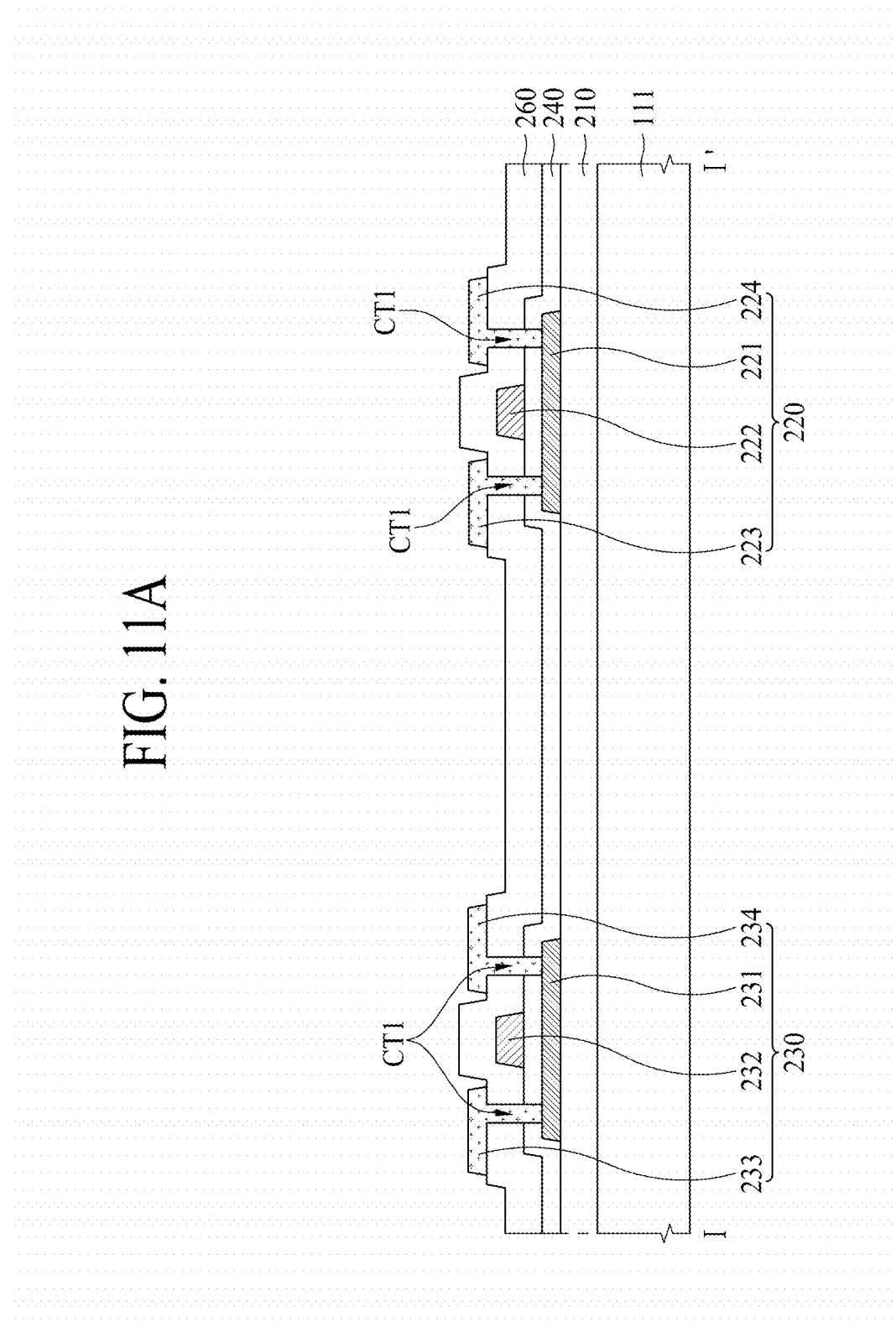
FIGS. 11A to 11D are cross-sectional views illustrating a method of manufacturing a transparent display device according to another aspect of the present disclosure.

First, as in FIG. 11A, a buffer layer 210 may be formed on a first substrate 111, for protecting elements from water which penetrates through the first substrate 111. The buffer layer 210 may include a plurality of inorganic layers which are alternately stacked, for protecting a TFT 220 and an organic light emitting device 290 from water which penetrates through the first substrate 111 vulnerable to penetration of water. For example, the buffer layer 210 may be formed of a multilayer where one or more of silicon oxide ($SiO_x$), silicon nitride ($SiN_x$), and silicon oxynitride (SiON) are alternately stacked. The buffer layer 210 may be formed by a CVD process.

An active layer 221 of a driving transistor and an active layer 231 of a switching transistor may be formed on the buffer layer 210. In detail, an active metal layer may be formed all over the buffer layer 210 by using a sputtering process or a metal organic chemical vapor deposition (MOCVD) process. Subsequently, the active layers 221 and 231 may be formed by patterning the active metal layer through a mask process using a photoresist pattern. The active layers 221 and 231 may each be formed of a silicon-based semiconductor material or an oxide-based semiconductor material.

Subsequently, a gate insulation layer 240 may be formed on the active layers 221 and 231. The gate insulation layer 240 may be formed of an inorganic layer, for example, $SiO_x$, $SiN_x$, or a multilayer thereof.

Subsequently, the gate insulation layer 240 may be formed on the active layers 221 and 231. The gate insulation layer 240 may be formed of an inorganic layer, for example, $SiO_x$, $SiN_x$, or a multilayer thereof. The gate insulation layer 240 may be formed through a CVD process.

Subsequently, a gate electrode 222 of the driving transistor and a gate electrode 232 of the switching transistor may be formed on the gate insulation layer 240. In detail, a first metal layer may be formed all over the gate insulation layer 240 by using a sputtering process or an MOCVD process. Subsequently, the gate electrodes 222 and 223 may be formed by patterning the first metal layer through a mask process using a photoresist pattern. The gate electrode 222 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

Subsequently, an interlayer dielectric 260 may be formed on the gate electrode 222. The interlayer dielectric 260 may be formed of an inorganic layer, for example, $SiO_x$, $SiN_x$, or a multilayer thereof. The interlayer dielectric 260 may be formed through a CVD process.

Subsequently, a plurality of contact holes CT1 which pass through the gate insulation layer 240 and the interlayer dielectric 260 and expose the active layer 221 may be formed.

Subsequently, the first electrodes 223 and 233 and the second electrodes 224 and 234 may be formed on the interlayer dielectric 260. In detail, a second metal layer may be formed all over the interlayer dielectric 260 by using a sputtering process or an MOCVD process. Subsequently, the first electrodes 223 and 233 and the second electrodes 224 and 234 may be formed by patterning the second metal layer through a mask process using a photoresist pattern. Each of the first and second electrodes 223 and 224 may be connected to the active layer 221 through a corresponding contact hole CT1 which passes through the gate insulation layer 230 and the interlayer dielectric 260, and each of the first and second electrodes 233 and 234 may be connected to the active layer 231 through a corresponding contact hole CT1. The first electrodes 223 and 233 and the second electrodes 224 and 234 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (S201 of FIG. 10)

Figure 11B:
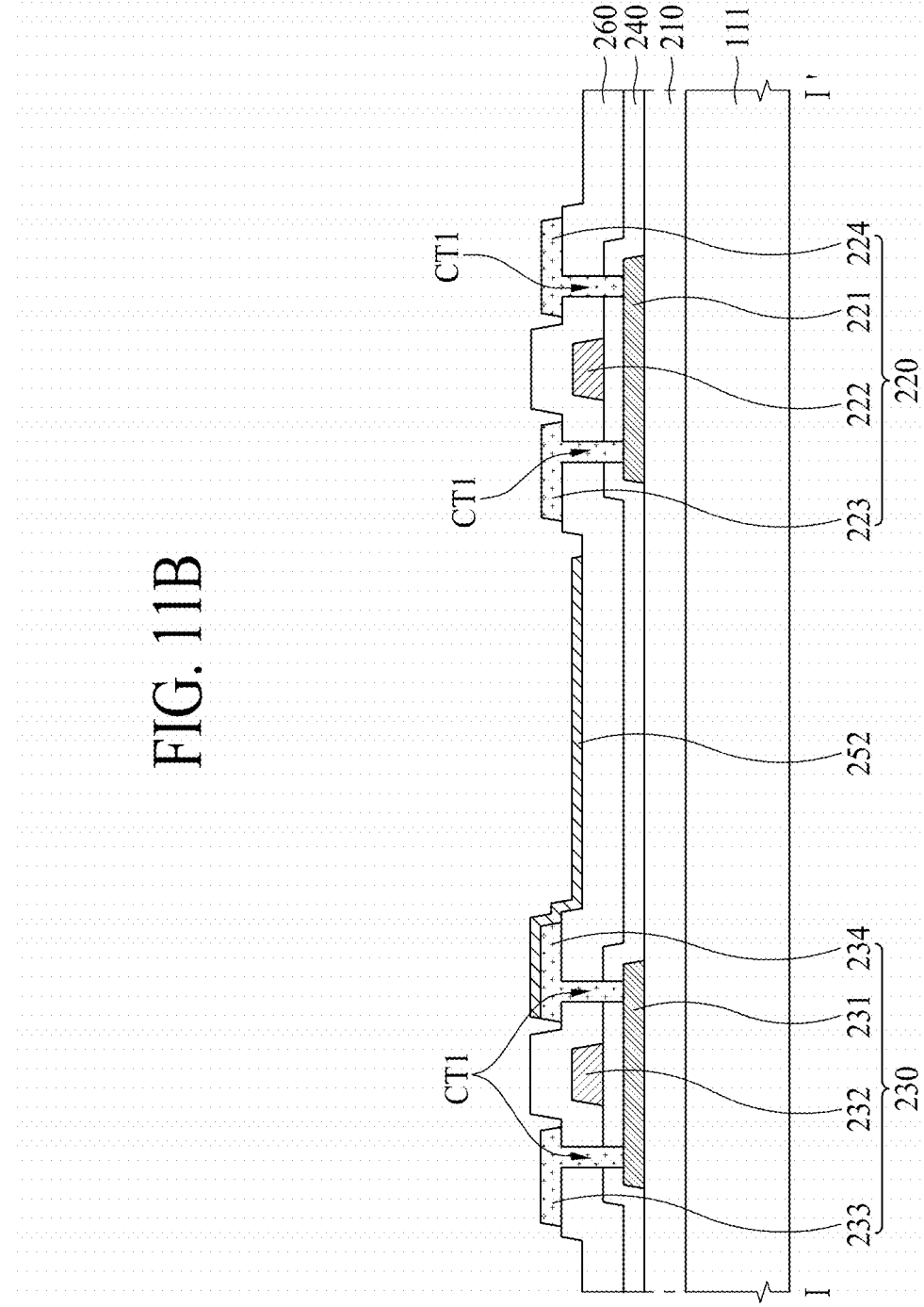

Second, as in FIG. 11B, the other electrode 252 of the capacitor 250 may be formed on a top of the first electrode 233 or the second electrode 234 of the switching transistor 230 and the interlayer dielectric 260. In detail, a third metal layer may be formed on the interlayer dielectric 260 and a top of each of the first electrodes 223 and 233 and the second electrodes 224 and 234 by using a sputtering process or an MOCVD process. Subsequently, the other electrode 252 of the capacitor 250 may be formed by patterning the third metal layer through a mask process using a photoresist pattern.

The other electrode 252 of the capacitor 250 may be formed of a transparent conductive material (TCO) such as ITO, IZO, or the like. (shown in S202 of FIG. 10)

Figure 11C:
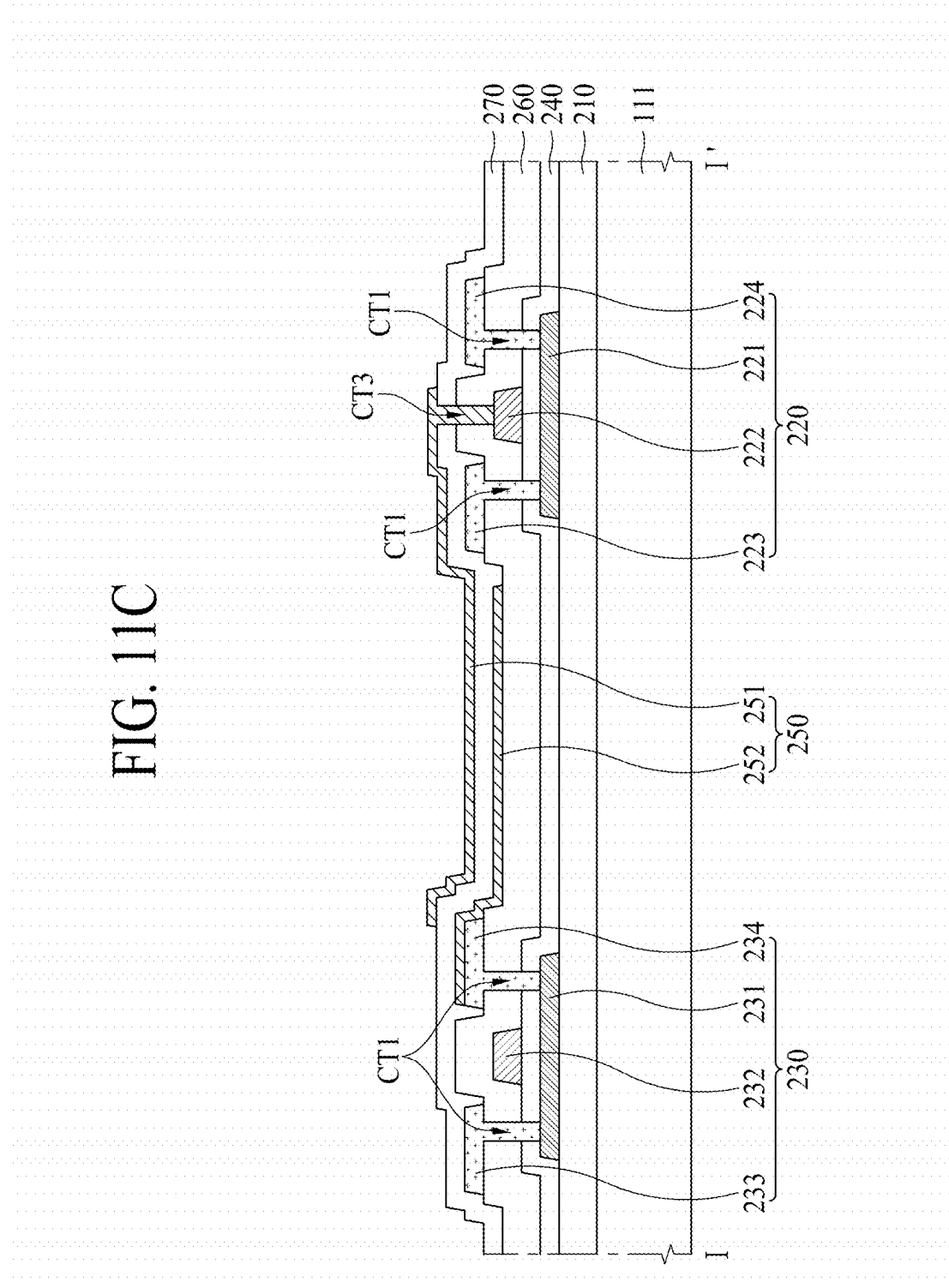

Third, as in FIG. 11C, a passivation layer 270 may be formed on the driving transistor 220, the switching transistor 230, and the capacitor 250. The passivation layer 270 may be formed of an inorganic layer, for example, $SiO_x$, $SiN_x$, or a multilayer thereof. The passivation layer 270 may be formed through a CVD process.

Subsequently, as in FIG. 11C, a contact hole CT3 which passes through the interlayer dielectric 260 and the passivation layer 270 and exposes the gate electrode 222 of the driving transistor 220 may be formed.

Subsequently, as in FIG. 11C, one electrode 251 of the capacitor 250 may be formed on the passivation layer 270. In detail, a fourth metal layer may be formed on the passivation layer 250 by using a sputtering process or an MOCVD process. Subsequently, the one electrode 251 of the capacitor 250 may be formed by patterning the fourth metal layer through a mask process using a photoresist pattern. The one electrode 251 of the capacitor 250 may be connected to the gate electrode 222 of the driving transistor 220 through the contact hole CT3 which passes through the interlayer dielectric 260 and the passivation layer 270.

The other electrode 252 of the capacitor 250 may be formed of a transparent conductive material (TCO) such as ITO, IZO, or the like. (shown in S203 of FIG. 10)

Figure 11D:
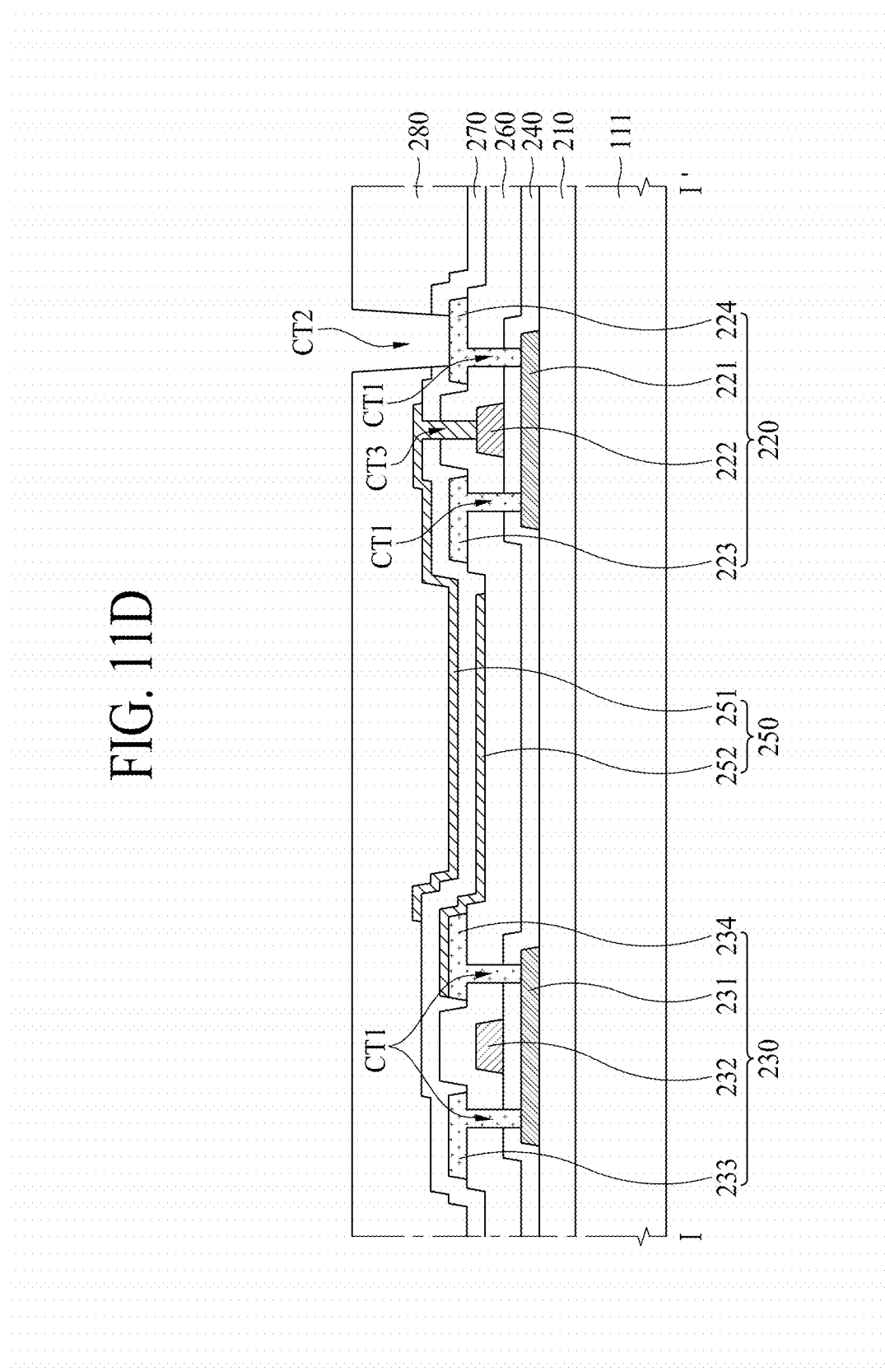

Fourth, as in FIG. 11D, a planarization layer 280 for planarizing a step height caused by the driving transistor 220, the switching transistor 230, and the capacitor 250 may be formed on the passivation layer 270. The planarization layer 280 may be formed of an organic layer such as acryl resin, epoxy resin, phenolic resin, polyamide resin, polyimide resin, or the like. The planarization layer 280 may be formed through a CVD process. (shown in S204 of FIG. 10)

Operations S205 to S207 of FIG. 10 are substantially the same as operations S106 to S108 of FIG. 7, and thus, their detailed descriptions are omitted.

As described above, in an aspect of the present disclosure, the one electrode 251 and the other electrode 252 of the capacitor 250 may be formed to overlap each other with the passivation layer 270 therebetween and may each be formed of a transparent conductive material. As a result, in an aspect of the present disclosure, the one electrode 251 and the other electrode 252 of the capacitor 250 may be disposed to overlap an emissive part EA. Therefore, an area of a driving part DA is reduced, thereby enlarging an area of a transmissive part TA. Accordingly, in an aspect of the present disclosure, a transmittance of the transparent display device increases.

Figure 12:
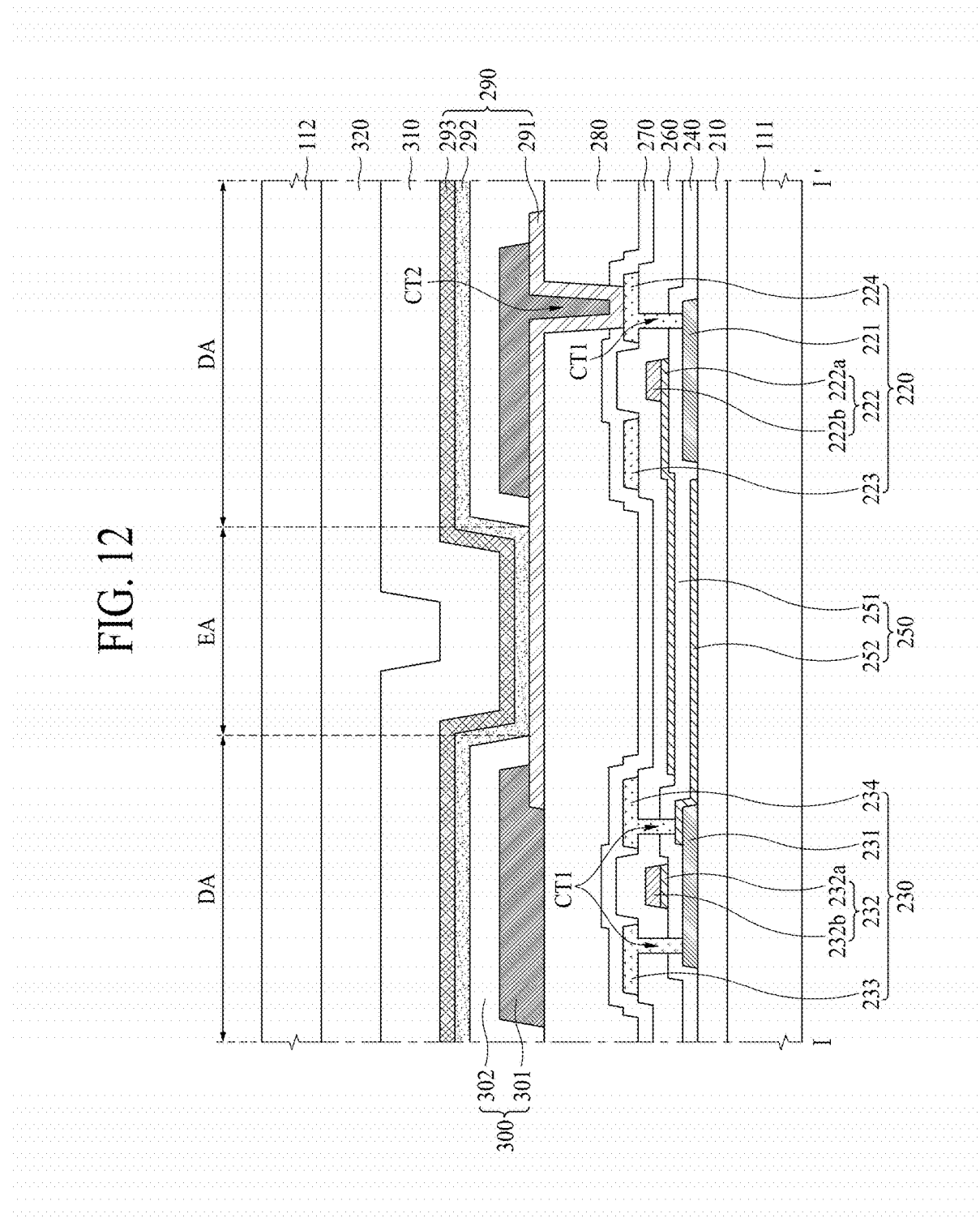
FIG. 12 is a cross-sectional view illustrating a driving transistor, a switching transistor, a capacitor, and an organic light emitting device according to another aspect of the present disclosure.

FIG. 12 is a cross-sectional view illustrating a driving transistor, a switching transistor, a capacitor, and an organic light emitting device according to another aspect of the present disclosure. FIG. 12 is a cross-sectional view illustrating another example taken along line I-I' of FIG. 3.

A first substrate 111, a second substrate 112, a buffer layer 210, a driving transistor 220, a switching transistor 230, a gate insulation layer 240, an interlayer dielectric 260, a passivation layer 270, a planarization layer 280, an organic light emitting device 290, a bank 300, an encapsulation layer 310, and an adhesive layer 320 illustrated in FIG. 12 are substantially the same as the elements described above with reference to FIG. 6, and thus, their detailed descriptions are omitted.

Referring to FIG. 12, a capacitor 250 may include one electrode 251 and the other electrode 252. The one electrode 251 and the other electrode 252 may overlap each other with at least one insulation layer therebetween. For example, as in FIG. 9, the one electrode 251 and the other electrode 252 may overlap each other with the gate insulation layer 240 therebetween.

The one electrode 251 is substantially the same as the one electrode described above with reference to FIG. 6, and thus, its detailed description is omitted.

The other electrode 252 may be connected to a top of an active layer 231 of the switching transistor 230, on the buffer layer 210. Therefore, as in FIG. 12, a second electrode 234 of the switching transistor 230 may be connected to the other electrode 252 through a first contact hole CT1. In FIG. 12, for convenience of description, an example where the other electrode 252 is connected to the second electrode 234 of the switching transistor 230 is illustrated, but the present aspect is not limited thereto. In other aspects, the other electrode 252 may be connected to a first electrode 233 of the switching transistor 230. The other electrode 252 may be formed of a transparent conductive material (TCO) such as ITO, IZO, or the like.

Since the one electrode 251 and the other electrode 252 are each formed of a transparent conductive material, the one electrode 251 and the other electrode 252 may be disposed to overlap an emissive part EA. The emissive part EA, as in FIG. 12, may be an area where an anode electrode 291, an organic light emitting layer 292, and a cathode electrode 293 are sequentially stacked to configure the organic light emitting device 290, and may be an area where the organic light emitting device 290 emits certain light.

As described above, in an aspect of the present disclosure, the one electrode 251 and the other electrode 252 of the capacitor 250 may be formed to overlap each other with the gate insulation layer 240 therebetween and may each be formed of a transparent conductive material. As a result, in an aspect of the present disclosure, the one electrode 251 and the other electrode 252 of the capacitor 250 may be disposed to overlap the emissive part EA. Therefore, an area of a driving part DA is reduced, thereby enlarging an area of a transmissive part TA. Accordingly, in an aspect of the present disclosure, a transmittance of the transparent display device increases.

In FIGS. 6, 9, and 12, an example where the one electrode 251 and the other electrode 252 of the capacitor 250 overlap each other with only one insulation layer (i.e., the gate insulation layer 240, the interlayer dielectric 260, or the passivation layer 270) therebetween is illustrated, but the present aspect is not limited thereto. In other aspects, the one electrode 251 and the other electrode 252 of the capacitor 250 may overlap each other with a plurality of insulation layers therebetween. For example, in a case where the one electrode 251 of the capacitor 250 is disposed on the buffer layer 210, the other electrode 252 may be disposed on the interlayer dielectric 260 or the passivation layer 270. Also, in a case where the one electrode 251 of the capacitor 250 is disposed on the gate insulation layer 240, the other electrode 252 may be disposed on the passivation layer 270. Also, in a case where the one electrode 251 of the capacitor 250 is disposed on the interlayer dielectric 240, the other electrode 252 may be disposed on the buffer layer 210. Also, in a case where the one electrode 251 of the capacitor 250 is disposed on the passivation layer 250, the other electrode 252 may be disposed on the buffer layer 210 or the gate insulation layer 240.

Figure 13:
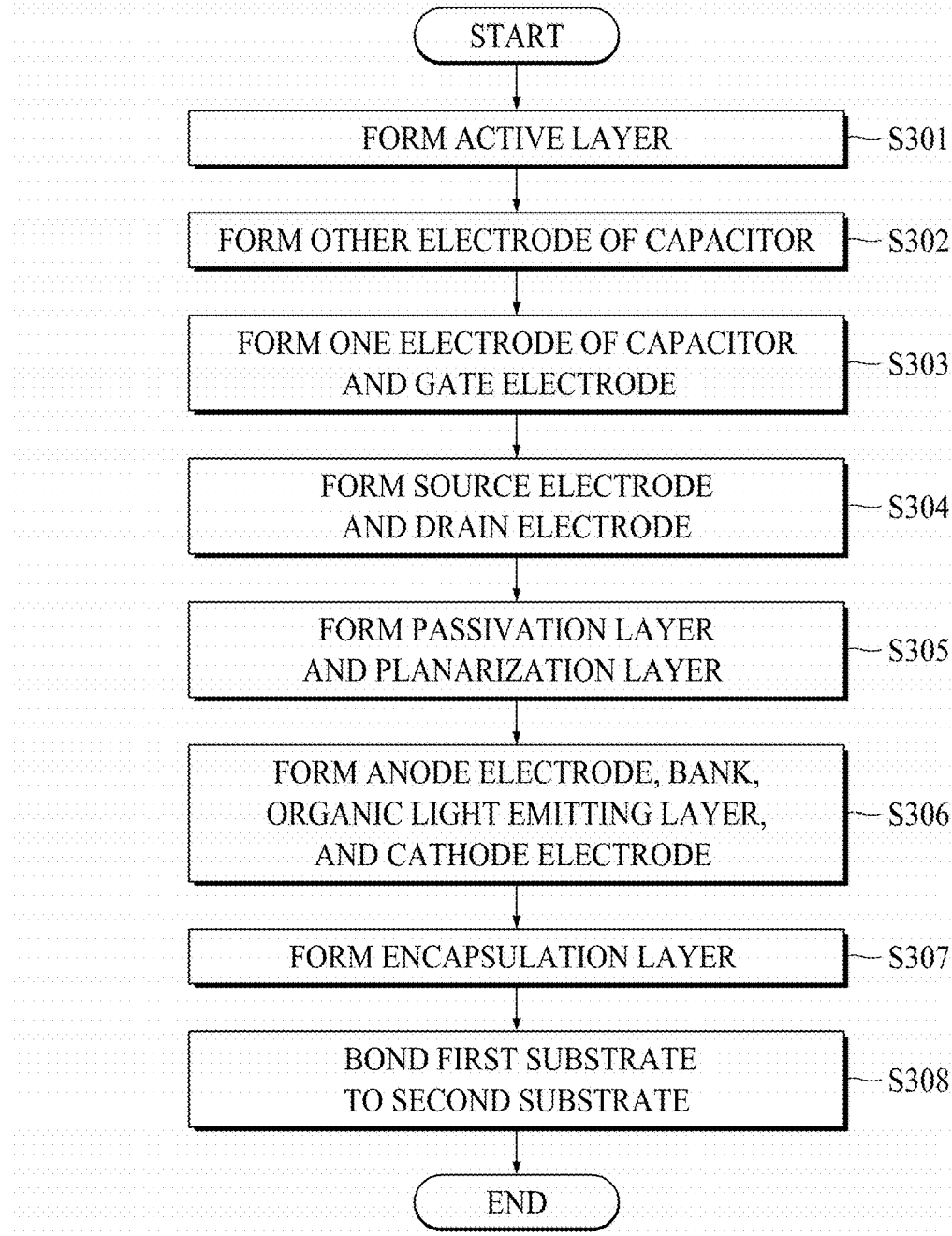
FIG. 13 is a flowchart illustrating a method of manufacturing a transparent display device according to another aspect of the present disclosure.

FIG. 13 is a flowchart illustrating a method of manufacturing a transparent display device according to another aspect of the present disclosure. FIGS. 14A to 14F are cross-sectional views illustrating a method of manufacturing a transparent display device according to another aspect of the present disclosure. The cross-sectional views illustrated in FIGS. 14A to 14F relate to a method of manufacturing a transparent display device illustrated in FIG. 12, and thus, like reference numerals refer to like elements.

Hereinafter, a method of manufacturing a transparent display device according to another aspect of the present disclosure will be described in more detail with reference to FIGS. 13 and 14A to 14F.

First, a buffer layer 210 may be formed on a first substrate 111, and an active layer 221 of a driving transistor and an active layer 231 of a switching transistor may be formed on the buffer layer 210. Operation S301 of FIG. 13 is substantially the same as operation S101 of FIG. 7, and thus, its detailed description is omitted. (shown in S301 of FIG. 13)

Second, as in FIG. 14A, the other electrode 252 of the capacitor 250 may be formed on the buffer layer 210 and the active layer 231 of the switching transistor 230. In detail, a first metal layer may be formed all over the buffer layer 210 and the active layer 231 of the switching transistor 230 by using a sputtering process or an MOCVD process. Subsequently, the other electrode 252 of the capacitor 250 may be formed by patterning the first metal layer through a mask process using a photoresist pattern.

The other electrode 252 of the capacitor 250 may be formed of a transparent conductive material (TCO) such as ITO, IZO, or the like. (shown in S302 of FIG. 13)

Figure 14B:
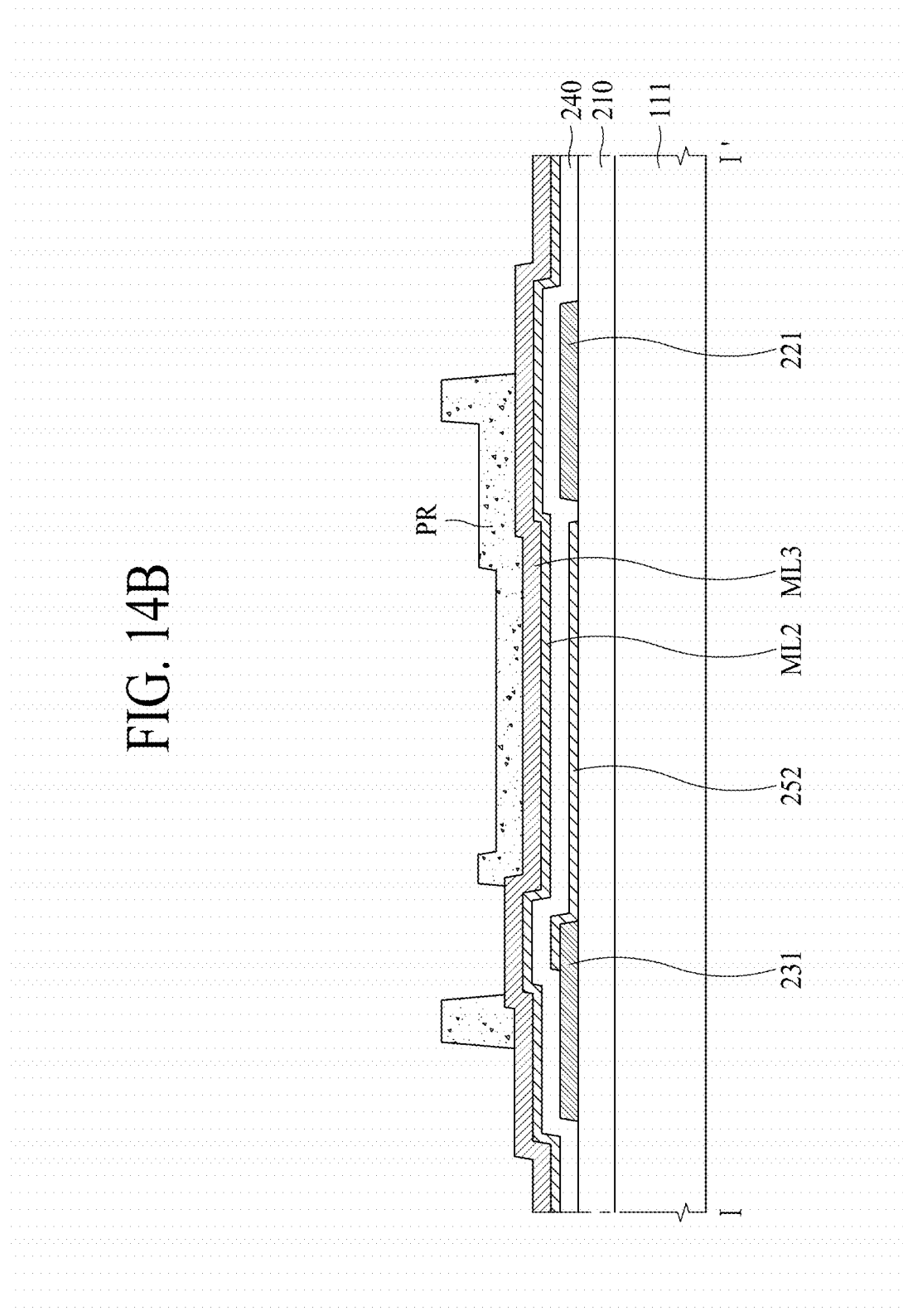
Figure 14C:
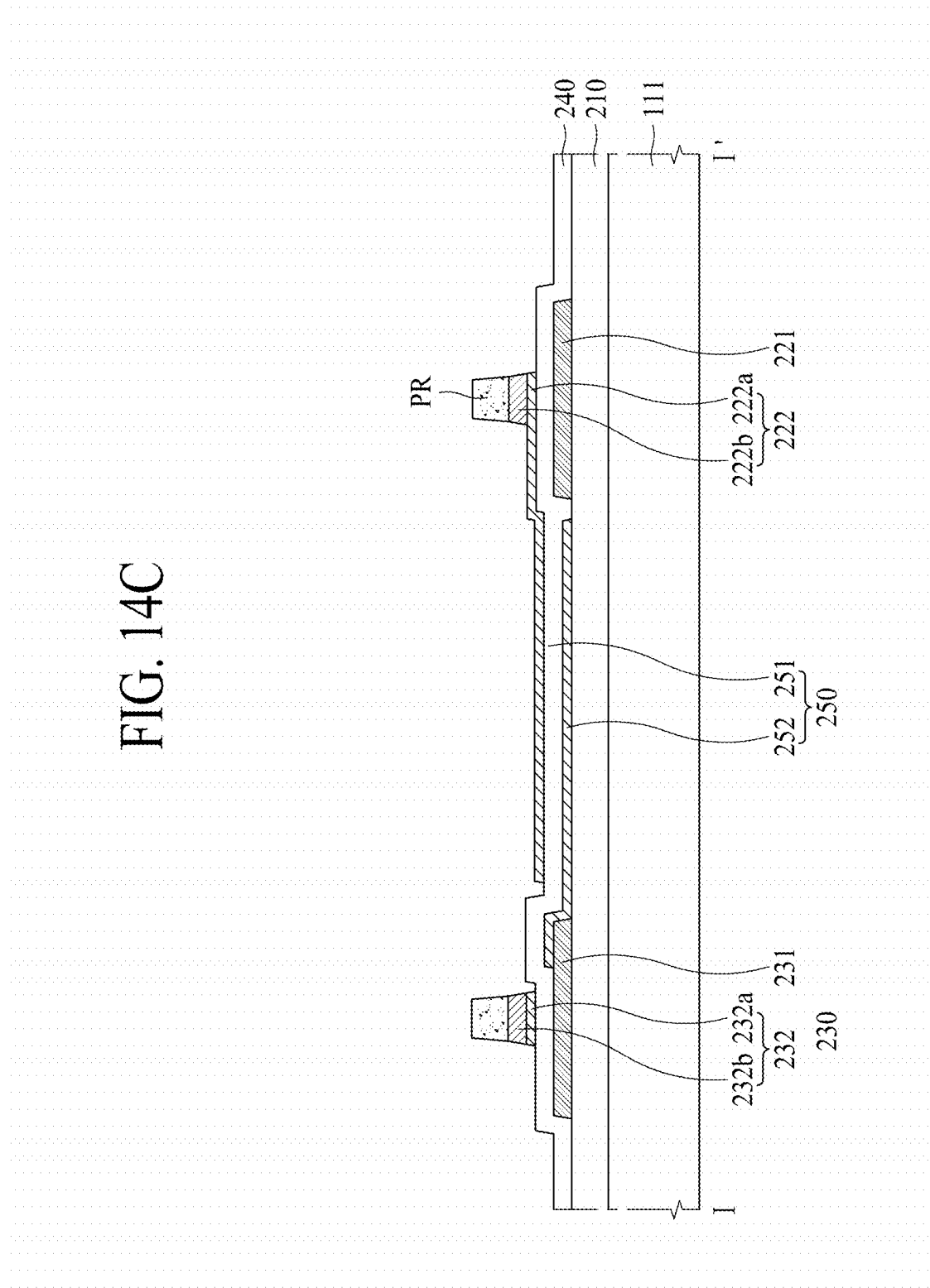

Third, the gate insulation layer 240 may be formed on the active layers 221 and 231 and the other electrode 252 of the capacitor 250, and as in FIGS. 14B to 14D, one electrode 251 of the capacitor 250, a plurality of bottom gate electrodes 222a and 232a, and a plurality of top gate electrodes 222b and 232b may be formed on the gate insulation layer 240 by using a halftone mask process.

The gate insulation layer 240 may be formed of an inorganic layer, for example, $SiO_x$, $SiN_x$, or a multilayer thereof. The gate insulation layer 240 may be formed through a CVD process.

Subsequently, as in FIG. 14B, a second metal layer ML2 may be formed all over the gate insulation layer 240 by using a sputtering process or an MOCVD process, and a third metal layer ML3 may be formed all over the second metal layer ML2. As in FIG. 14B, a photoresist pattern PR having a first thickness may be formed in an area where the one electrode 251 is to be formed on the third metal layer ML3, and a photoresist pattern PR having a second thickness thicker than the first thickness may be formed in an area where the top gate electrodes 222b and 232b are to be formed.

Subsequently, as in FIG. 14C, the second and third metal layers ML2 and ML3 may be patterned by performing an etching process. Subsequently, when an ashing process of removing the photoresist pattern PR having the first thickness is performed, as in FIG. 14C, the photoresist pattern PR may remain in only an area where the top gate electrodes 222b and 232b are to be formed.

Subsequently, as in FIG. 14D, the one electrode 251 of the capacitor 250 and the bottom gate electrodes 222a and 232a may be formed by removing the third metal layer ML3 through an etching process, and when an ashing process of removing the photoresist pattern PR is performed, as in FIG. 14D, the top gate electrodes 222b and 232b may be formed.

The one electrode 251 of the capacitor 250 and the bottom gate electrode 222a may each be formed of a transparent conductive material (TCO) such as ITO, IZO, or the like. The top gate electrode 222b may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (shown in S303 of FIG. 13)

Figure 14E:
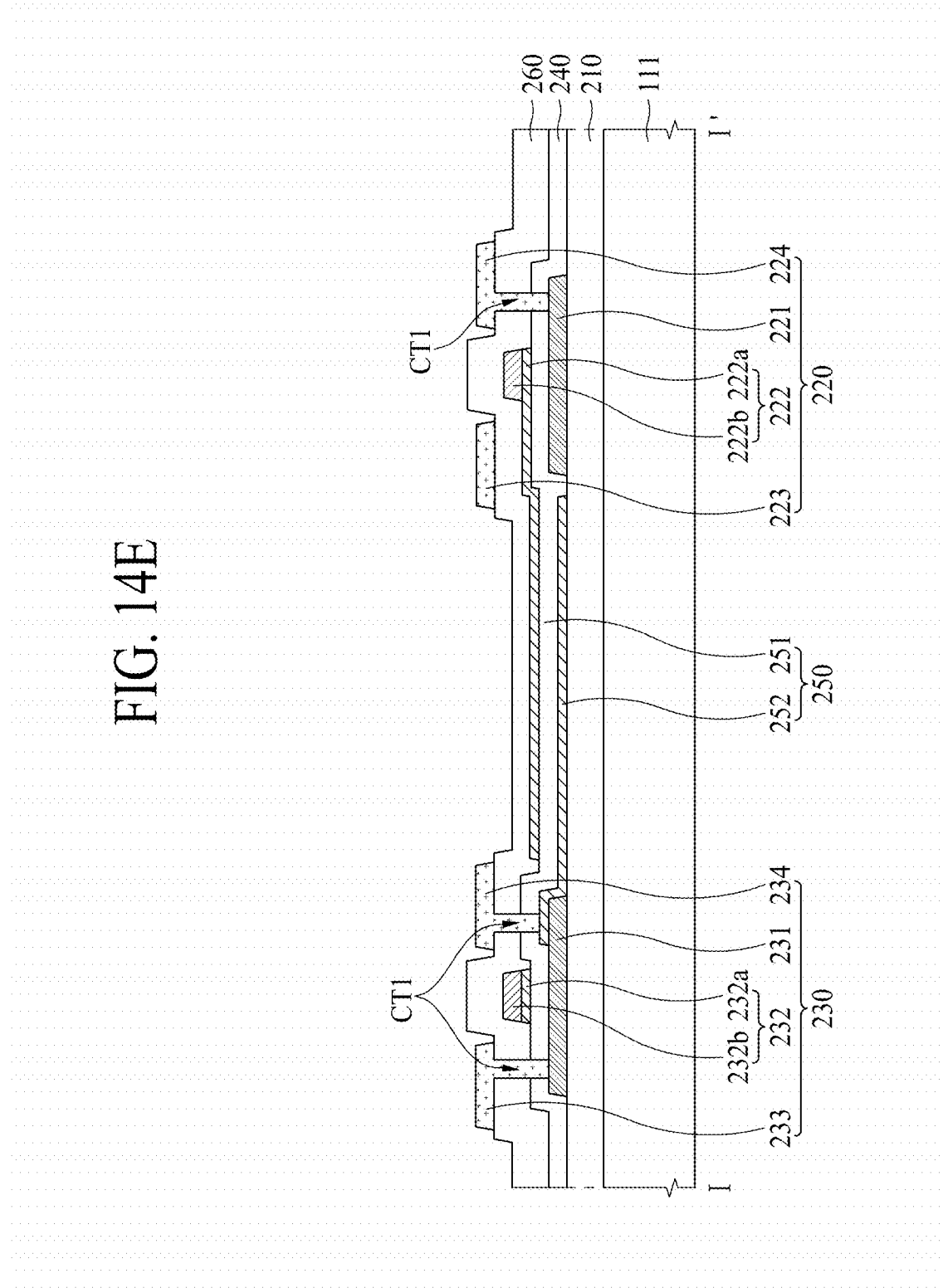

Fourth, as in FIG. 14E, an interlayer dielectric 260 may be formed on the one electrode 251 of the capacitor 250 and the gate electrode 222, and a plurality of first electrodes 223 and 233 and a plurality of second electrodes 224 and 234 may be formed on the interlayer dielectric 260.

In detail, the interlayer dielectric 260 may be formed of an inorganic layer, for example, $SiO_x$, $SiN_x$, or a multilayer thereof. The interlayer dielectric 260 may be formed through a CVD process.

Subsequently, a plurality of contact holes CT1 which pass through the gate insulation layer 240 and the interlayer dielectric 260 and expose the active layer 221 may be formed.

Subsequently, the first electrodes 223 and 233 and the second electrodes 224 and 234 may be formed on the interlayer dielectric 260. In detail, a fourth metal layer may be formed all over the interlayer dielectric 260 by using a sputtering process or an MOCVD process. Subsequently, the first electrodes 223 and 233 and the second electrodes 224 and 234 may be formed by patterning the fourth metal layer through a mask process using a photoresist pattern. Each of the first and second electrodes 223 and 224 may be connected to the active layer 221 through a corresponding contact hole CT1 which passes through the gate insulation layer 230 and the interlayer dielectric 260, and each of the first and second electrodes 233 and 234 may be connected to the active layer 231 through a corresponding contact hole CT1.

The first electrodes 223 and 233 and the second electrodes 224 and 234 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (shown in S304 of FIG. 13)

Figure 14F:
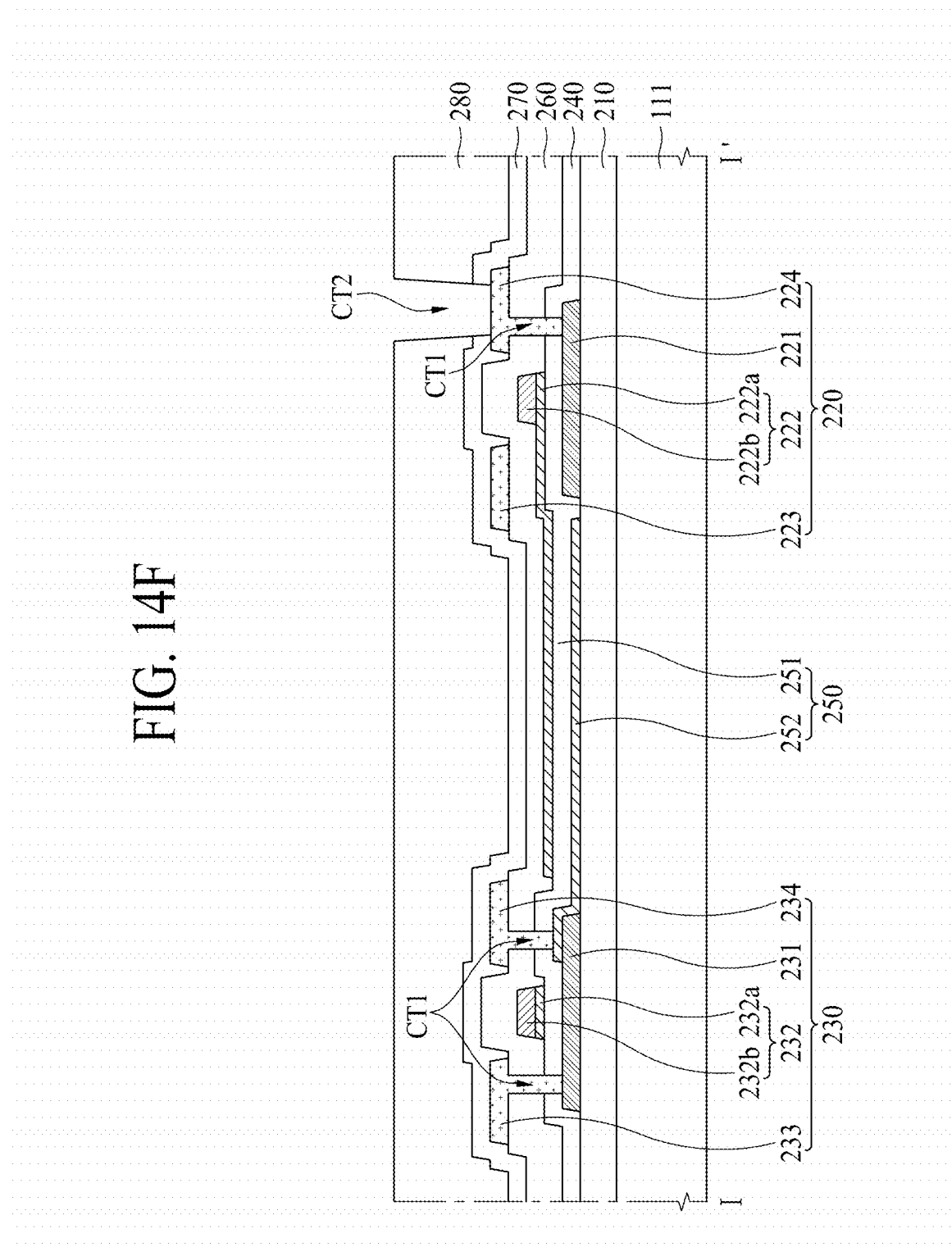

Fifth, as in FIG. 14F, a passivation layer 270 may be formed on the driving transistor 220 and the switching transistor 230. The passivation layer 270 may be formed of an inorganic layer, for example, $SiO_x$, $SiN_x$, or a multilayer thereof. The passivation layer 270 may be formed through a CVD process.

Subsequently, as in FIG. 14F, a planarization layer 280 for planarizing a step height caused by the driving transistor 220, the switching transistor 230, and the capacitor 250 may be formed on the passivation layer 270. The planarization layer 280 may be formed of an organic layer such as acryl resin, epoxy resin, phenolic resin, polyamide resin, polyimide resin, or the like. The planarization layer 280 may be formed through a CVD process. (S305 of FIG. 13)

Operations S306 to S308 of FIG. 13 are substantially the same as operations S106 to S108 of FIG. 7, and thus, their detailed descriptions are omitted.

As described above, in an aspect of the present disclosure, the one electrode 251 and the other electrode 252 of the capacitor 250 may be formed to overlap each other with the gate insulation layer 240 therebetween and may each be formed of a transparent conductive material. As a result, in an aspect of the present disclosure, the one electrode 251 and the other electrode 252 of the capacitor 250 may be disposed to overlap an emissive part EA. Therefore, an area of a driving part DA is reduced, thereby enlarging an area of a transmissive part TA. Accordingly, in an aspect of the present disclosure, a transmittance of the transparent display device increases.

Moreover, in an aspect of the present disclosure, since the one electrode 251 of the capacitor 250, the bottom gate electrode 222a, and the top gate electrode 222b are formed by using a halftone mask process, the one electrode 251 of the capacitor 250 may be transparently formed without adding a mask process. Accordingly, in an aspect of the present disclosure, an increase in the manufacturing cost is minimized, and thus, the one electrode 251 and the other electrode 252 of the capacitor 250 may be transparently formed.

Figure 15:
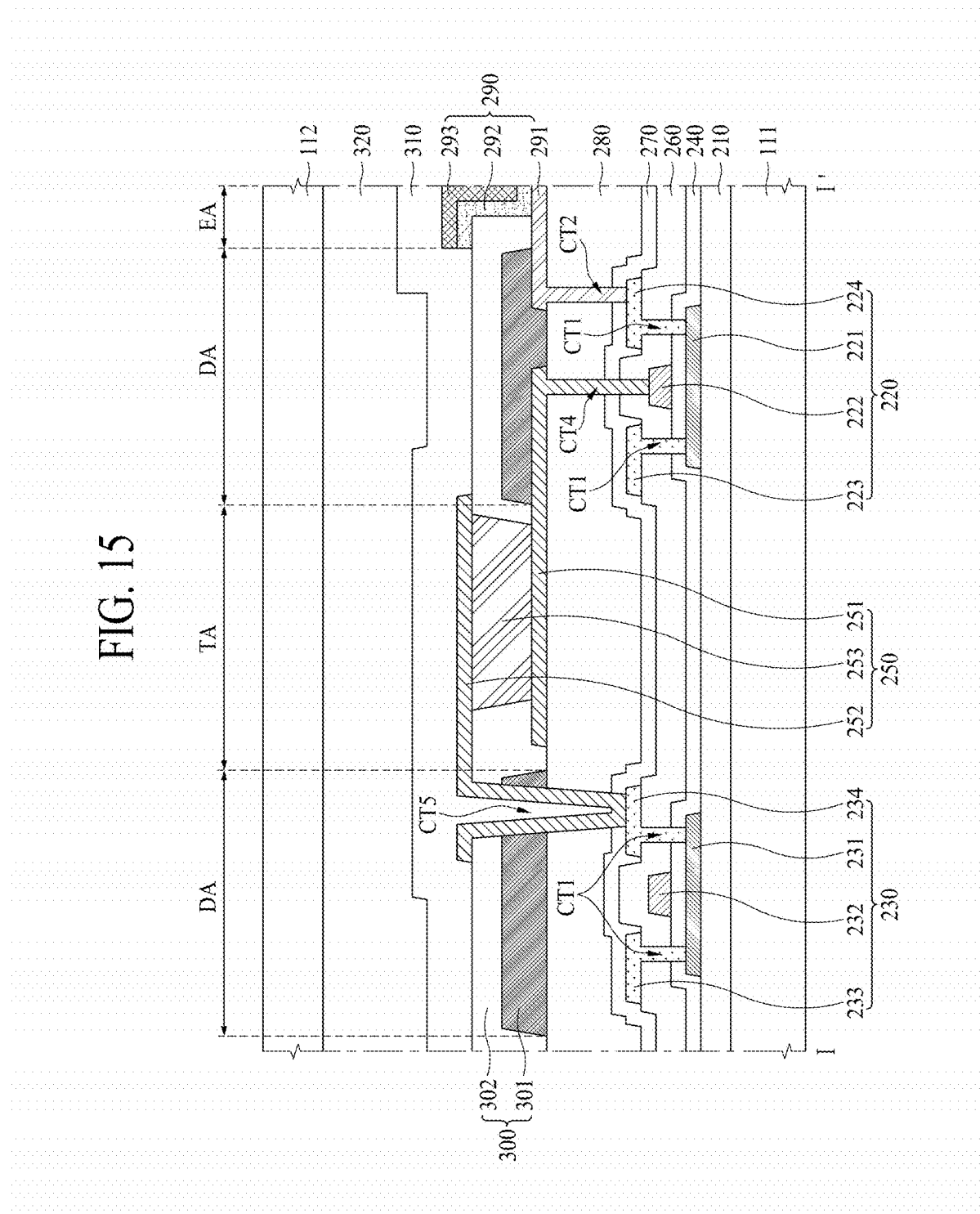
FIG. 15 is a cross-sectional view illustrating a driving transistor, a switching transistor, and a capacitor according to another aspect of the present disclosure.

FIG. 15 is a cross-sectional view illustrating a driving transistor, a switching transistor, and a capacitor according to another aspect of the present disclosure.

A first substrate 111, a second substrate 112, a buffer layer 210, a gate insulation layer 240, an interlayer dielectric 260, a passivation layer 270, a planarization layer 280, an organic light emitting device 290, a bank 300, an encapsulation layer 310, and an adhesive layer 320 illustrated in FIG. 15 are substantially the same as the elements described above with reference to FIG. 6. Also, except that each of gate electrodes 222 and 232 is formed of a single layer, a driving transistor 220 and a switching transistor 230 are substantially the same as the elements described above with reference to FIG. 6. Therefore, detailed descriptions of the first substrate 111, the second substrate 112, the buffer layer 210, the driving transistor 220, the switching transistor 230, the gate insulation layer 240, the interlayer dielectric 260, the passivation layer 270, the planarization layer 280, the organic light emitting device 290, the bank 300, the encapsulation layer 310, and the adhesive layer 320 are omitted.

Referring to FIG. 15, the gate electrode 222 of the driving transistor 220 and the gate electrode 232 of the switching transistor 230 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

The capacitor 250 may include one electrode 251 and the other electrode 252. The one electrode 251 and the other electrode 252 may overlap each other with at least one insulation layer therebetween. For example, as in FIG. 15, the one electrode 251 and the other electrode 252 may overlap each other with a dielectric layer 253 therebetween. The dielectric layer 253 may correspond to an insulation layer.

The one electrode 251 may be formed on the planarization layer 280. The one electrode 251 may be formed of the same material on the same layer as an anode electrode 291. The one electrode 251 may be connected to a top of the gate electrode 222 through a contact hole CT4 which passes through the interlayer dielectric 260, the passivation layer 270, and the planarization layer 280 and exposes the gate electrode 222 of the driving transistor 220. The one electrode 251 may be formed of a transparent conductive material (TCO) such as ITO, IZO, or the like.

The other electrode 252 may be formed on a bank 300 and the dielectric layer 253. The other electrode 252 may be formed of the same material on the same layer as a cathode electrode 293. The other electrode 252 may be connected to a top of a second electrode 234 of the switching transistor 230 through a contact hole CT5 which passes through the passivation layer 270, the planarization layer 280, and the bank 300 and exposes the second electrode 234 of the switching transistor 230. In FIG. 15, for convenience of description, an example where the other electrode 252 is connected to the top of the second electrode 234 of the switching transistor 230 is illustrated, but the present aspect is not limited thereto. In other aspects, the other electrode 252 may be connected to a top of a first electrode 233 of the switching transistor 230. The other electrode 252 may be formed of a transparent conductive material (TCO) such as ITO, IZO, or the like.

The dielectric layer 253 may be disposed between the one electrode 251 and the other electrode 252. A capacity of the capacitor 250 may be defined as expressed in the following Equation (1):

$$C = \varepsilon \frac{A}{t} \quad (1)$$

where ε denotes a dielectric constant of the dielectric layer 253, A denotes an overlapping area between the one electrode 251 and the other electrode 252, and t denotes a thickness of the dielectric layer 253. In order to increase the capacity of the capacitor 250, a material having a high dielectric constant may be used as the dielectric layer 253, the dielectric layer 253 may be thinly formed, or the overlapping area between the one electrode 251 and the other electrode 252 may be enlarged.

However, in an aspect of the present disclosure, since the one electrode 251 of the capacitor 250 is formed on the same layer as the anode electrode 291 as in FIG. 15, the capacitor 250 and the organic light emitting device 290 may be divided by the bank 300. Therefore, when an overlapping area between the one electrode 251 and the other electrode 252 of the capacitor 250 is enlarged, an area of an emissive part EA is narrowed. Accordingly, in an aspect of the present disclosure, the dielectric layer 253 may be thinly formed, or may be formed of a material having a high dielectric constant.

The dielectric layer 253 may be formed of $SiO_x$, $SiN_x$, or a multilayer thereof, but is not limited thereto. In order to increase a dielectric constant of the dielectric layer 253, the dielectric layer 253 may be formed of $SiO_x$, $SiN_x$, or a multilayer thereof, or may be formed of at least one of $SiO_2$, $Al_2O_3$, $GeO_2$, $SrO$, $HfSiOx$, $Y_2O_3$, $ZrO_2$, $Ta_2O_5$, $CeO_2$, $La_2O_3$, $LaAlO_3$, NMD, $TiO_2$, and STO, or a multilayer thereof.

As described above, in an aspect of the present disclosure, the one electrode 251 and the other electrode 252 of the capacitor 250 may be formed to overlap each other with the dielectric layer 253 therebetween and may each be formed of a transparent conductive material. As a result, in an aspect of the present disclosure, since the capacitor 250 can be removed from a driving part DA, an area of the driving part DA is reduced, thereby enlarging an area of a transmissive part TA. Accordingly, in an aspect of the present disclosure, a transmittance of the transparent display device increases.

Figure 16:
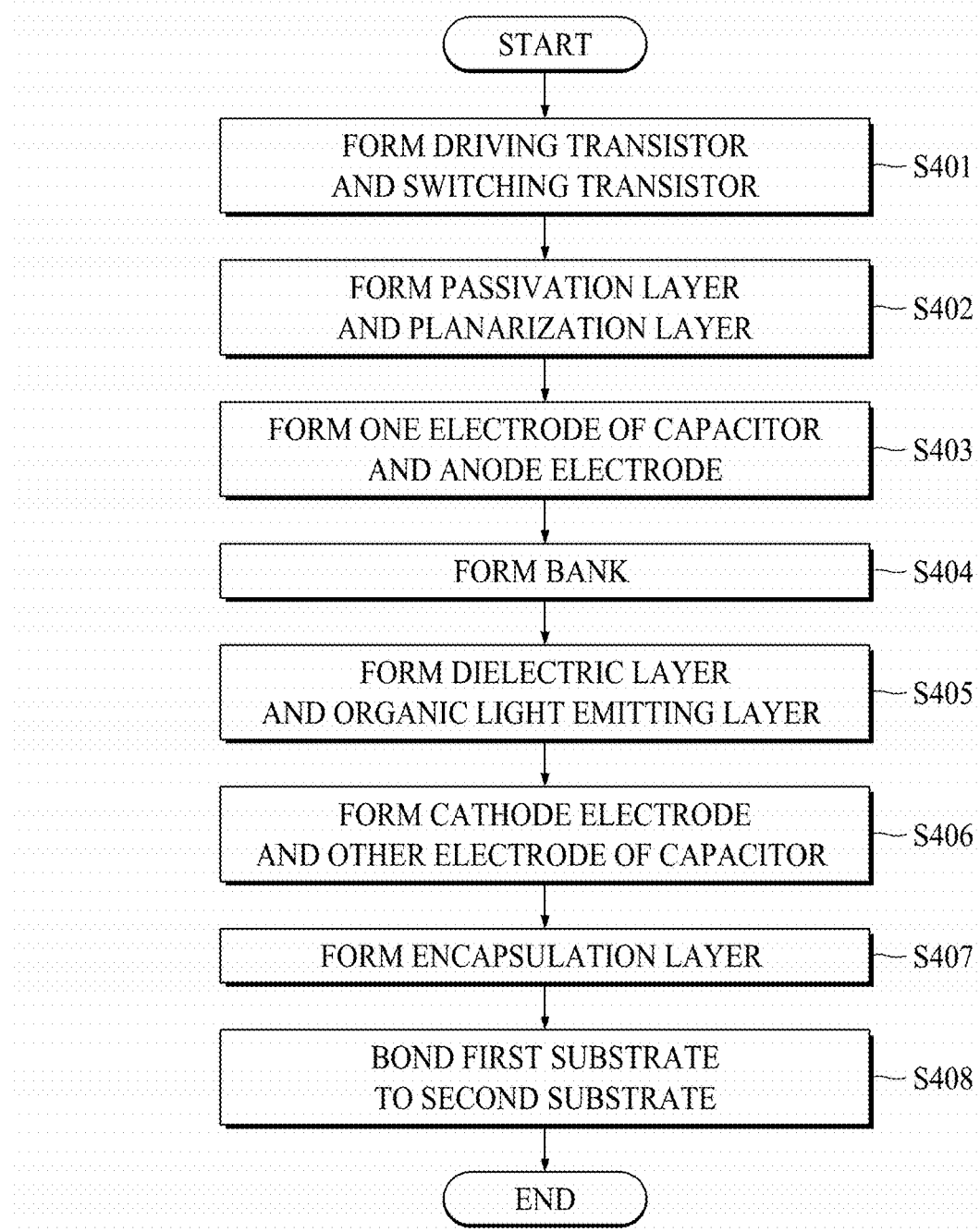
FIG. 16 is a flowchart illustrating a method of manufacturing a transparent display device according to another aspect of the present disclosure.

FIG. 16 is a flowchart illustrating a method of manufacturing a transparent display device according to another aspect of the present disclosure. FIGS. 17A to 17F are cross-sectional views illustrating a method of manufacturing a transparent display device according to another aspect of the present disclosure. The cross-sectional views illustrated in FIGS. 17A to 17F relate to a method of manufacturing a transparent display device illustrated in FIG. 15, and thus, like reference numerals refer to like elements.

Hereinafter, a method of manufacturing a transparent display device according to another aspect of the present disclosure will be described in more detail with reference to FIGS. 16 and 17A to 17F.

Figure 17A:
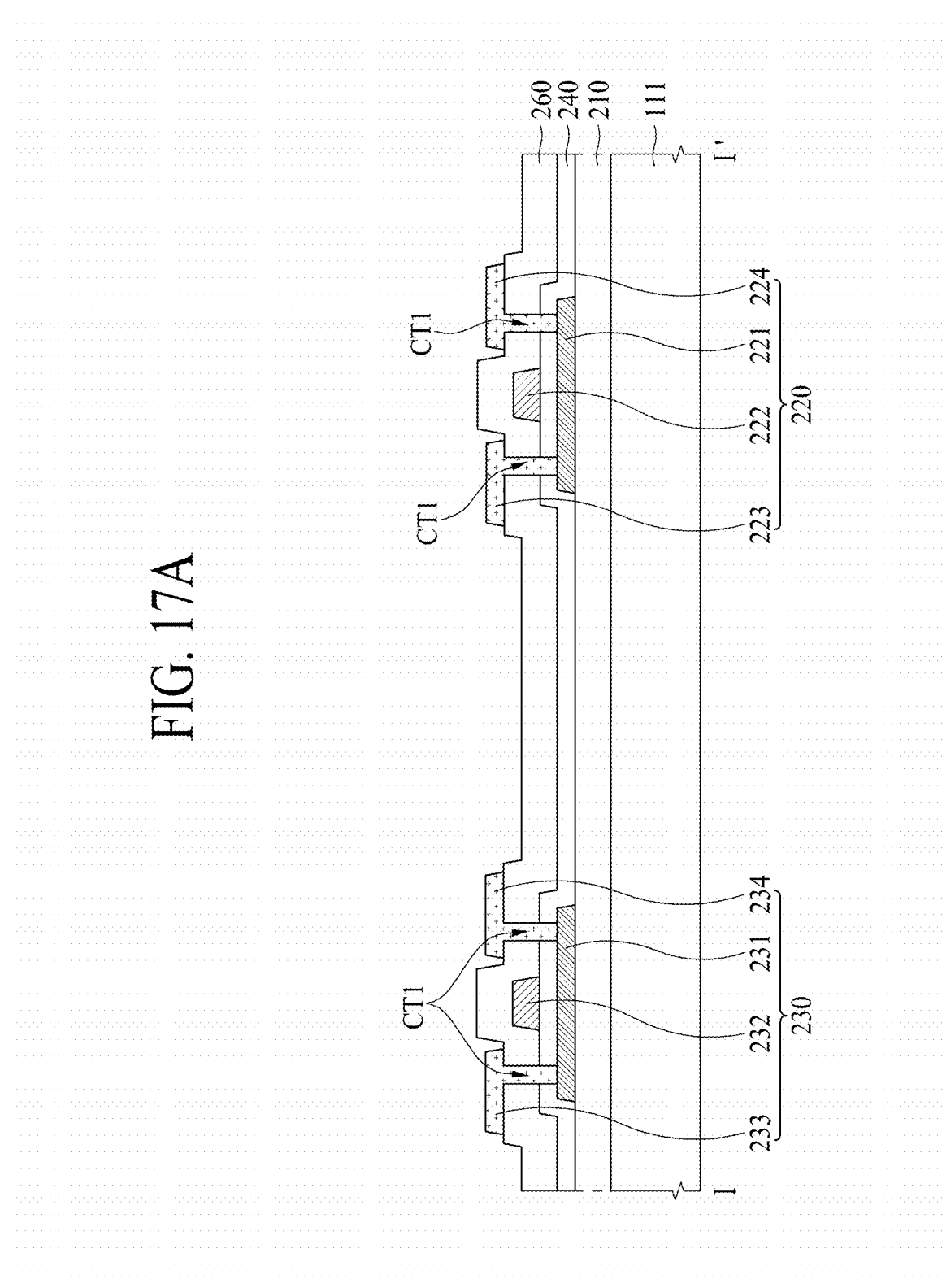

First, as in FIG. 17A, a driving transistor 220 and a switching transistor 230 may be formed on a substrate 100.

A buffer layer 210 may be formed on a first substrate 111, for protecting elements from water which penetrates through the first substrate 111. The buffer layer 210 may include a plurality of inorganic layers which are alternately stacked, for protecting a TFT 220 and an organic light emitting device 290 from water which penetrates through the first substrate 111 vulnerable to penetration of water. For example, the buffer layer 210 may be formed of a multilayer where one or more of silicon oxide ($SiO_x$), silicon nitride ($SiN_x$), and silicon oxynitride (SiON) are alternately stacked. The buffer layer 210 may be formed by a CVD process.

An active layer 221 of the driving transistor 220 and an active layer 231 of the switching transistor 230 may be formed on the buffer layer 210. In detail, an active metal layer may be formed all over the buffer layer 210 by using a sputtering process or an MOCVD process. Subsequently, the active layers 221 and 231 may be formed by patterning the active metal layer through a mask process using a photoresist pattern. The active layers 221 and 231 may each be formed of a silicon-based semiconductor material or an oxide-based semiconductor material.

Subsequently, a gate insulation layer 240 may be formed on the active layers 221 and 231. The gate insulation layer 240 may be formed of an inorganic layer, for example, $SiO_x$, $SiN_x$, or a multilayer thereof.

Subsequently, a gate electrode 222 of the driving transistor 220 and a gate electrode 232 of the switching transistor 230 may be formed on the gate insulation layer 240. In detail, a first metal layer may be formed all over the gate insulation layer 240 by using a sputtering process or an MOCVD process. Subsequently, the gate electrodes 222 and 223 may be formed by patterning the first metal layer through a mask process using a photoresist pattern. The gate electrode 222 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

Subsequently, an interlayer dielectric 260 may be formed on the gate electrode 222. The interlayer dielectric 260 may be formed of an inorganic layer, for example, $SiO_x$, $SiN_x$, or a multilayer thereof. The interlayer dielectric 260 may be formed through a CVD process.

Subsequently, a plurality of contact holes CT1 which pass through the gate insulation layer 240 and the interlayer dielectric 260 and expose the active layer 221 may be formed.

Subsequently, the first electrodes 223 and 233 and the second electrodes 224 and 234 may be formed on the interlayer dielectric 260. In detail, a second metal layer may be formed all over the interlayer dielectric 260 by using a sputtering process or an MOCVD process. Subsequently, the first electrodes 223 and 233 and the second electrodes 224 and 234 may be formed by patterning the second metal layer through a mask process using a photoresist pattern. Each of the first and second electrodes 223 and 224 may be connected to the active layer 221 through a corresponding contact hole CT1 which passes through the gate insulation layer 230 and the interlayer dielectric 260, and each of the first and second electrodes 233 and 234 may be connected to the active layer 231 through a corresponding contact hole CT1. The first electrodes 223 and 233 and the second electrodes 224 and 234 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (shown in S401 of FIG. 16)

Figure 17B:
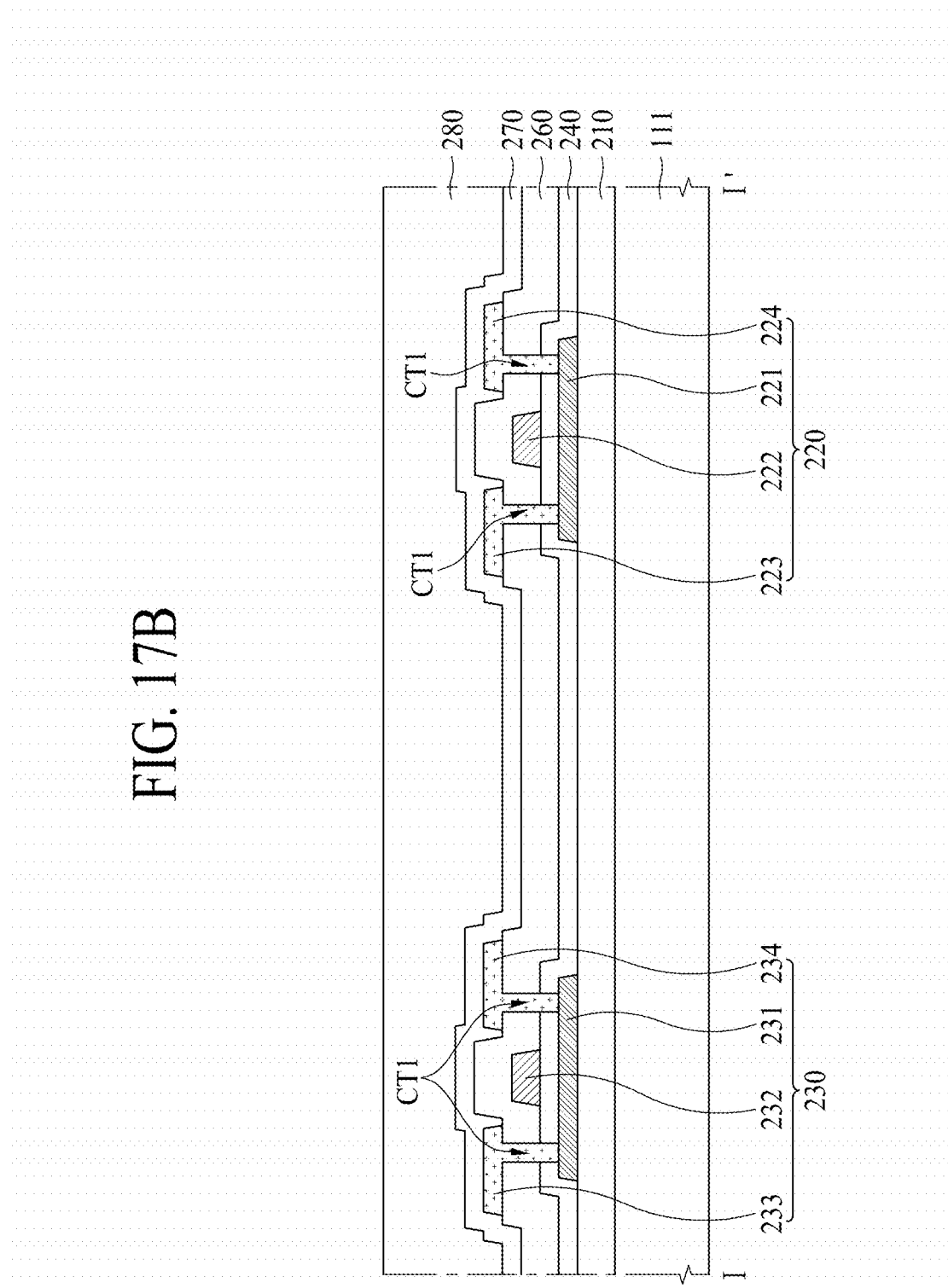

Second, as in FIG. 17B, a passivation layer 270 and a planarization layer 280 may be sequentially formed on the driving transistor 220 and the switching transistor 230.

In detail, a passivation layer 270 may be formed on the driving transistor 220 and the switching transistor 230. The passivation layer 270 may be formed of an inorganic layer, for example, $SiO_x$, $SiN_x$, or a multilayer thereof. The passivation layer 270 may be formed through a CVD process.

Subsequently, a planarization layer 280 for planarizing a step height caused by the driving transistor 220, the switching transistor 230, and the capacitor 250 may be formed on the passivation layer 270. The planarization layer 280 may be formed of an organic layer such as acryl resin, epoxy resin, phenolic resin, polyamide resin, polyimide resin, or the like. The planarization layer 280 may be formed through a CVD process. (shown in S402 of FIG. 16)

Third, as in FIG. 17C, one electrode 251 of the capacitor 250 and an anode electrode 291 may be formed on the planarization layer 280.

In detail, a contact hole CT2 which passes through the passivation layer 270 and the planarization layer 280 and exposes a drain electrode 224 of the driving transistor 220 may be formed. Also, a contact hole CT4 which passes through the interlayer dielectric 260, the passivation layer 270, and the planarization layer 280 and exposes the gate electrode 222 may be formed.

Subsequently, a third metal layer may be formed all over the planarization layer 280 by using a sputtering process or an MOCVD process. Subsequently, the one electrode 251 of the capacitor 250 and the anode electrode 291 may be formed by patterning the third metal layer through a mask process using a photoresist pattern. The anode electrode 291 may be connected to the anode electrode 224 of the driving transistor 220 through the contact hole CT2 which passes through the passivation layer 270 and the planarization layer 280. The one electrode 251 of the capacitor 250 may be connected to the gate electrode 222 of the driving transistor 220 through the contact hole CT4 which passes through the interlayer dielectric 260, the passivation layer 270, and the planarization layer 280.

The one electrode 251 of the capacitor 250 and the anode electrode 291 may each be formed of a transparent conductive material (TCO) such as ITO or IZO capable of transmitting light, and a semi-transmissive conductive material such as magnesium (Mg), silver (Ag), and an alloy of Mg and Ag. (shown in S403 of FIG. 16)

Figure 17D:
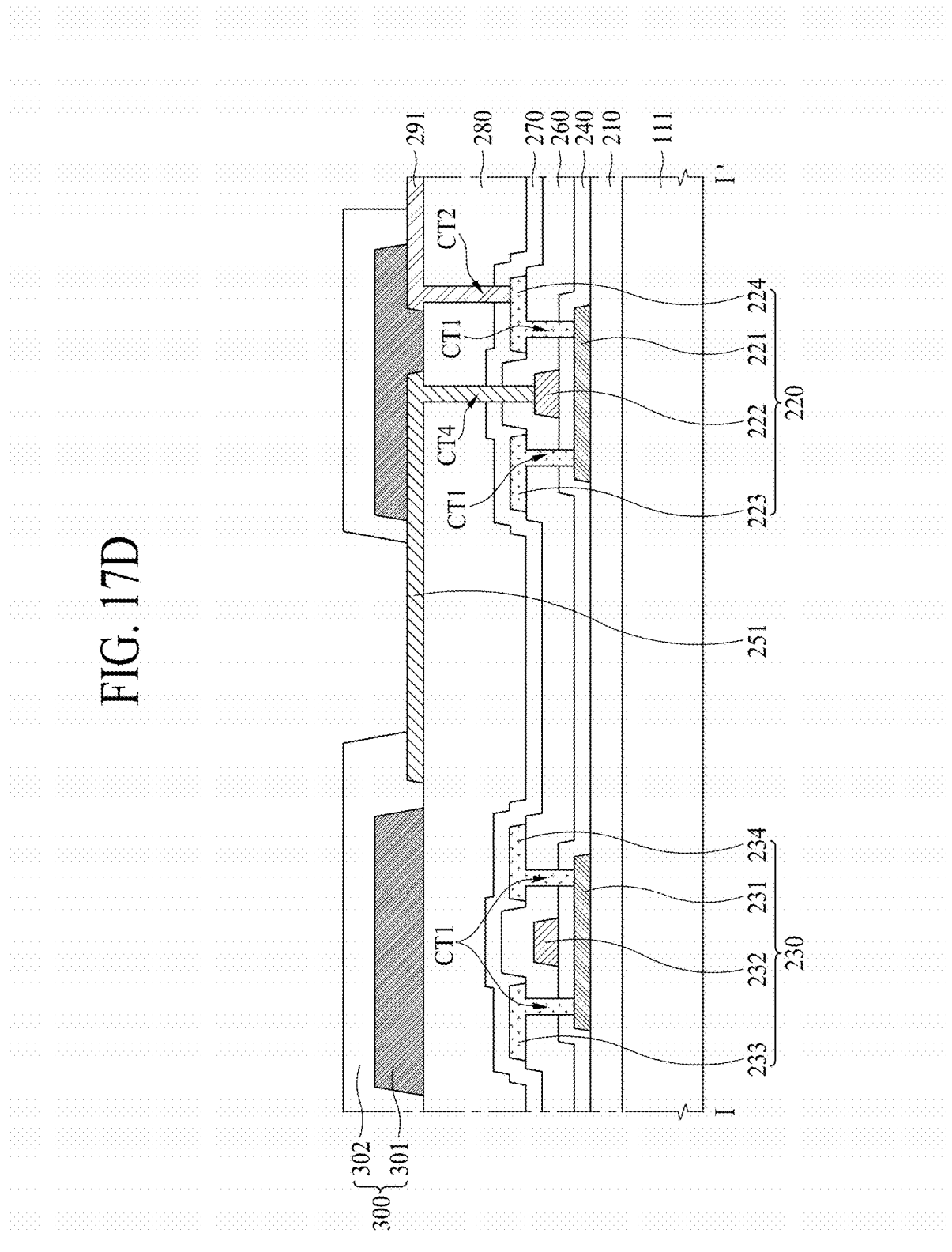

Fourth, as in FIG. 17D, the bank 300 may be formed on the planarization layer 280 to cover an edge of the anode electrode 291 and an edge of the one electrode 251 of the capacitor 250, for dividing an emissive part EA and the capacitor 250.

The bank 300 may include a black bank 301 and a transparent bank 302. The black bank 301 may include a material for absorbing light. For example, the black bank 301 may be an organic layer (for example, a black organic layer) having a certain color. The transparent bank 302 may be formed of an organic layer such as acryl resin, epoxy resin, phenolic resin, polyamide resin, polyimide resin, or the like. (S404 of FIG. 16)

Figure 17E:
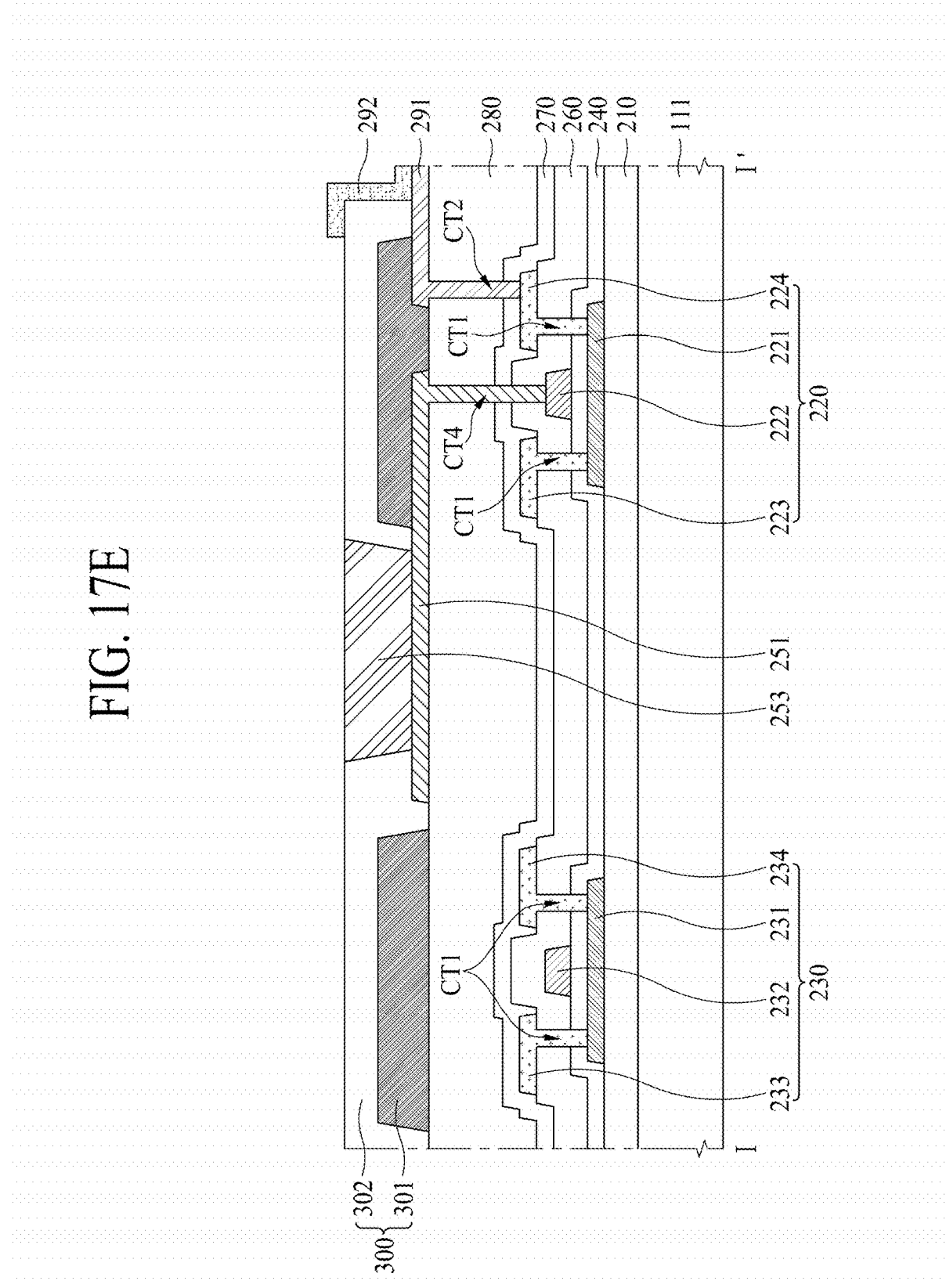

Fifth, as in FIG. 17E, a dielectric layer 253 may be formed on the one electrode 251 of the capacitor 250 and the bank 300, and the organic light emitting layer 292 may be formed on the anode electrode 291 and the bank 300. The dielectric layer 253 may be spaced apart from the organic light emitting layer 292.

The organic light emitting layer 292 may be formed through a deposition process or a solution process. In a case where the organic light emitting layer 292 is formed through a deposition process, the organic light emitting layer 292 may be formed through an evaporation process.

The dielectric layer 253 may be formed through a deposition process or a solution process. The dielectric layer 253 may be formed of $SiO_x$, $SiN_x$, or a multilayer thereof, but is not limited thereto. In order to increase a dielectric constant of the dielectric layer 253, the dielectric layer 253 may be formed of $SiO_x$, $SiN_x$, or a multilayer thereof, or may be formed of at least one of $SiO_2$, $Al_2O_3$, $GeO_2$, SrO, HfSiOx, $Y_2O_3$, $ZrO_2$, $Ta_2O_5$, $CeO_2$, $La_2O_3$, $LaAlO_3$, NMD, $TiO_2$, and STO, or a multilayer thereof.

Figure 17F:
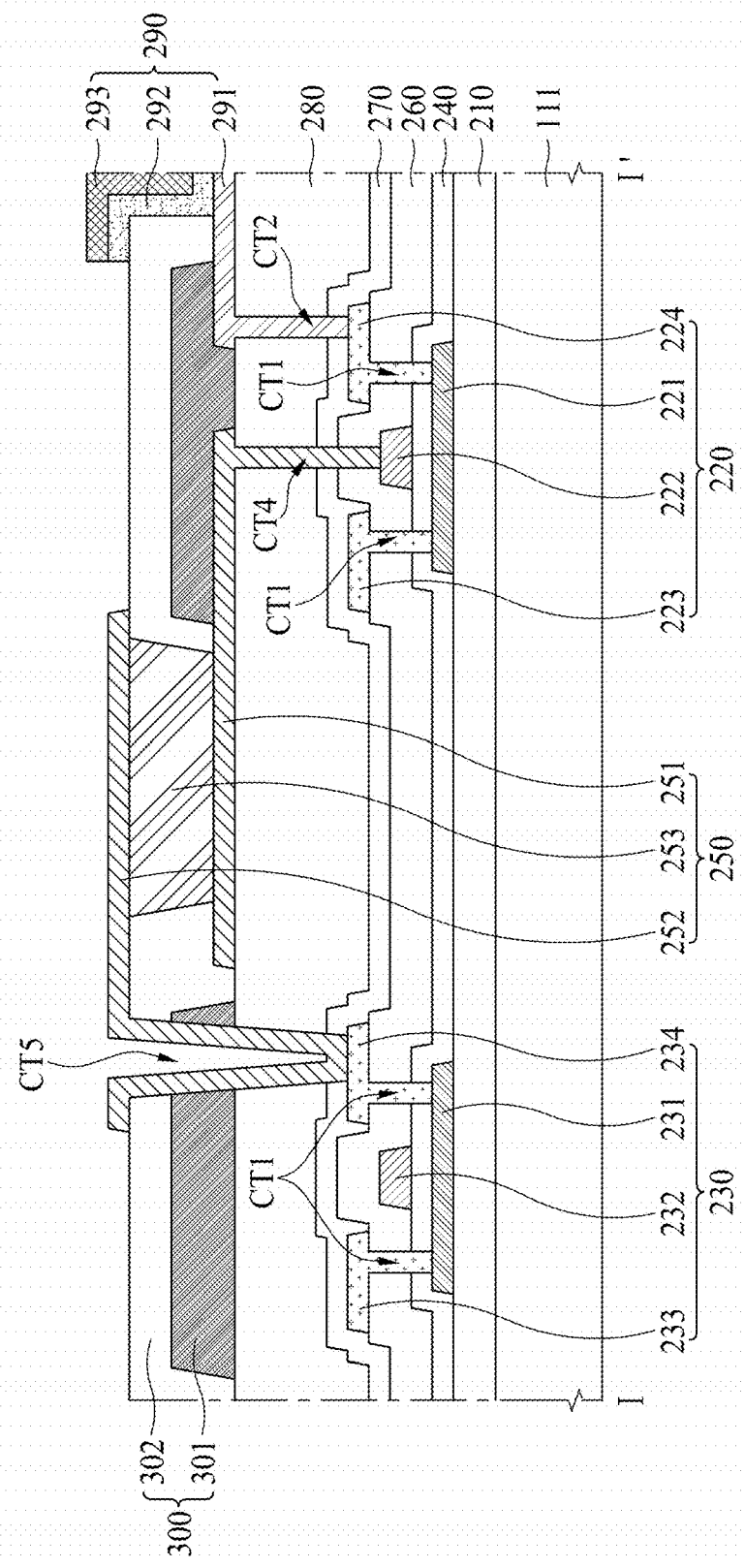

Subsequently, as in FIG. 17F, the cathode electrode 293 may be formed on the organic light emitting layer 292. The cathode electrode 293 may be formed through a sputtering process or an MOCVD process.

The cathode electrode 293 may be formed of a transparent conductive material (TCO) such as ITO and IZO capable of transmitting light, or a semi-transmissive conductive material such as magnesium (Mg), silver (Ag), and an alloy of Mg and Ag. A capping layer may be formed on the cathode electrode 283. (shown in S406 of FIG. 16)

Operations S407 and S408 of FIG. 16 are substantially the same as operations S107 and S108 of FIG. 7, and thus, their detailed descriptions are omitted.

As described above, in an aspect of the present disclosure, the one electrode 251 and the other electrode 252 of the capacitor 250 may be formed to overlap each other with the dielectric layer 253 therebetween and may each be formed of a transparent conductive material. As a result, in an aspect of the present disclosure, since the capacitor 250 can be removed from a driving part DA, an area of the driving part DA is reduced, thereby enlarging an area of a transmissive part TA. Accordingly, in an aspect of the present disclosure, a transmittance of the transparent display device increases.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device, comprising:
   a light emitting structure including an anode electrode, a light emitting layer, and a cathode electrode;
   a driving transistor configured to supply a driving current to the light emitting structure and having first and second driving transistor electrodes and a gate electrode;
   a switching transistor having first and second switching transistor electrodes and configured to be turned on in response to a gate signal of a gate line of the display device;
   a capacitor having first and second capacitor electrodes, each electrode formed of a transparent conductive material, wherein the first and second capacitor electrodes overlap each other with at least one insulation layer therebetween; and
   a bank defining an emissive part of the light emitting structure, wherein the bank includes a black bank disposed on the driving transistor and the switching transistor and a transparent bank covers the black bank.

2. The display device of claim 1, wherein the first and second capacitor electrodes vertically overlap an emissive part of the light emitting device.

3. The display device of claim 1, wherein the first capacitor electrode is connected to a gate electrode of the driving transistor, and the second capacitor electrode is connected to the first switching transistor electrode or the second switching transistor electrode.

4. The display device of claim 3, wherein the driving transistor and the switching transistor, each comprises:
   an active layer; and
   a gate electrode on a gate insulation layer covering the active layer, the gate electrode vertically overlapping the active layer,
   wherein the first and second driving transistor electrodes and the first and second switching transistor electrodes disposed on an interlayer dielectric covering the gate electrode, at least one of the first driving transistor electrode and the first switching transistor electrode connected to the active layer through at least one of first contact holes passing through the gate insulation layer and the interlayer dielectric, and at least one of the second driving transistor electrode and the second switching transistor electrode connected to the active layer through at least one of second contact holes passing through the gate insulation layer and the interlayer dielectric.

5. The display device of claim 4, wherein the first and second capacitor electrodes vertically overlap each other with the interlayer dielectric therebetween.

6. The display device of claim 5, wherein
   the gate electrode of the driving transistor comprises a bottom gate electrode formed of a transparent conductive material and a top gate electrode formed of an opaque conductive material,
   the first capacitor electrode is disposed on the gate insulation layer and extends from the bottom gate electrode, and
   the second capacitor electrode is disposed on the interlayer dielectric and one of the first and second switching transistor electrodes.

7. The display device of claim 4, wherein the first and second capacitor electrodes overlap each other with a passivation layer therebetween, the passivation layer covering the first and second switching transistor electrodes and the first and second driving transistor electrodes.

8. The display device of claim 7, wherein
   the first capacitor electrode is disposed on the passivation layer and is connected to the gate electrode of the driving transistor through one of the first contact holes passing through the interlayer dielectric and the passivation layer, and
   the second capacitor electrode is disposed on the interlayer dielectric and is connected to an upper surface of one of the first and second switching transistor electrodes.

9. The display device of claim 4, wherein the first and second capacitor electrodes vertically overlap each other with the gate insulation layer therebetween.

10. The display device of claim 9, wherein
    the gate electrode of the driving transistor comprises a bottom gate electrode formed of a transparent conductive material and a top gate electrode formed of an opaque conductive material,
    the first capacitor electrode is disposed on the gate insulation layer and extends from the bottom gate electrode, and
    the second capacitor electrode is disposed on the active layer of the switching transistor.

11. The display device of claim 4, wherein
    the first capacitor electrode is formed of the same material as a material of the anode electrode and is on the same layer as the anode electrode, and the second capacitor electrode is formed of the same material as a material of the cathode electrode and is on the same layer as the cathode electrode, and
    a dielectric layer is disposed between the first and second capacitor electrodes.

12. The display device of claim 1, further comprising a bank dividing the light emitting structure and the capacitor.

13. The display device of claim 1, wherein the anode electrode and the cathode electrode are formed of a transparent conductive material.

14. The display device of claim 1, wherein the first and second capacitor electrodes vertically overlap a transmissive part of the light emitting device.

15. The display device of claim 14, further comprising a transparent dielectric layer between the first and second capacitor electrodes.

16. The display device of claim 14, wherein the first capacitor electrode is directly connected to a gate electrode of the driving transistor.

17. The display device of claim 16, wherein the second capacitor electrode is directly connected to the second electrode of the switching transistor.

18. A method of manufacturing a display device, the method comprising:
    forming an active layer of each of a driving transistor on a first substrate;
    forming a gate insulation layer on the active layer, forming a first capacitor electrode and a bottom gate electrode of the driving transistor on the gate insulation layer by using a transparent conductive material, and forming a top gate electrode of the driving transistor on the bottom gate electrode to overlap the active layer;
    forming an interlayer dielectric on the first capacitor electrode and the top gate electrode of the driving transistor and forming a source electrode and a drain electrode of the driving transistor on the interlayer dielectric;

forming a second capacitor electrode on the interlayer dielectric by using the transparent conductive material;

forming a passivation layer on the driving transistor and the capacitor and forming a planarization layer on the passivation layer; and sequentially forming an anode electrode, a bank, an light emitting layer, and a cathode electrode on the planarization layer, wherein a bank defines an emissive part of the light emitting structure, wherein the bank includes a black bank disposed on the driving transistor and the switching transistor and a transparent bank covering the black bank.

19. A method of manufacturing a display device, the method comprising:

forming an active layer of each of a driving transistor on a first substrate, forming a gate insulation layer on the active layer, forming a gate electrode on the gate insulation layer to overlap the active layer, forming an interlayer dielectric on the gate electrode, and forming a source electrode and a drain electrode of the driving transistor on the interlayer dielectric;

forming a first capacitor electrode on the interlayer dielectric by using a transparent conductive material;

forming a passivation layer on the source electrode and the drain electrode of the driving transistor and the first capacitor electrode, forming a contact hole which passes through the interlayer dielectric and exposes the gate electrode of the driving transistor, and forming a second capacitor electrode, connected to the gate electrode of the driving transistor through the contact hole, on the passivation layer by using the transparent conductive material;

forming a planarization layer on the passivation layer and the second capacitor electrode; and sequentially forming an anode electrode, a bank, an light emitting layer, and a cathode electrode on the planarization layer, wherein a bank defines an emissive part of the light emitting structure, wherein the bank includes a black bank disposed on the driving transistor and the switching transistor and a transparent bank covering the black bank.

* * * * *